(12) United States Patent
Flynn et al.

(10) Patent No.: US 9,250,817 B2
(45) Date of Patent: *Feb. 2, 2016

(54) SYSTEMS AND METHODS FOR CONTEXTUAL STORAGE

(71) Applicant: SANDISK TECHNOLOGIES, INC., Plano, TX (US)

(72) Inventors: David Flynn, Sandy, UT (US); Robert Wipfel, Draper, UT (US); David Nellans, Salt Lake City, UT (US); John Strasser, Syracuse, UT (US)

(73) Assignee: SANDISK TECHNOLOGIES, INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/030,717

(22) Filed: Sep. 18, 2013

(65) Prior Publication Data

US 2014/0025872 A1    Jan. 23, 2014

Related U.S. Application Data

(63) Continuation of application No. 13/424,333, filed on Mar. 19, 2012, now Pat. No. 8,966,191.

(60) Provisional application No. 61/454,235, filed on Mar. 18, 2011.

(51) Int. Cl.
*G06F 3/06*  (2006.01)
*G06F 12/02* (2006.01)
(Continued)

(52) U.S. Cl.
CPC .............. *G06F 3/0619* (2013.01); *G06F 3/061* (2013.01); *G06F 3/065* (2013.01); *G06F 3/0631* (2013.01);
(Continued)

(58) Field of Classification Search
CPC ... G06F 3/0634; G06F 3/0629; G06F 3/0646; G06F 3/0655; G06F 12/0223; G06F 12/0238; G06F 12/0246; G06F 3/0631; G06F 3/067; G06F 3/0688
See application file for complete search history.

(56) References Cited

U.S. PATENT DOCUMENTS 4,571,674 A    2/1986  Hartung
5,193,184 A    3/1993  Belsan et al.
(Continued)

FOREIGN PATENT DOCUMENTS

CN    1771495    5/2006
EP    1418502    5/2004
(Continued)

OTHER PUBLICATIONS

USPTO, Office Action for U.S. Appl. No. 13/424,333 mailed Mar. 17, 2014.
(Continued)

*Primary Examiner* — Mardochee Chery

(57) ABSTRACT

A storage layer presents logical address space of a non-volatile storage device. The storage layer maintains logical interfaces to the non-volatile storage device, which may include arbitrary, any-to-any mappings between logical identifiers and storage resources. Data may be stored on the non-volatile storage device in a contextual format, which includes persistent metadata that defines the logical interface of the data. The storage layer may modify the logical interface of data that is stored in the contextual format. The modified logical interface may be inconsistent with the existing contextual format of the data on the non-volatile storage media. The storage layer may provide access to the data in the inconsistent contextual format through the modified logical interface. The contextual format of the data may be updated to be consistent with the modified logical interface in a write out-of-place storage operation.

20 Claims, 45 Drawing Sheets

(51) Int. Cl.
*G06F 12/00* (2006.01)
*G06F 13/16* (2006.01)
*G11C 16/06* (2006.01)

(52) U.S. Cl.
CPC ............ *G06F 3/0643* (2013.01); *G06F 3/0679* (2013.01); *G06F 3/0688* (2013.01); *G06F 12/00* (2013.01); *G06F 12/0246* (2013.01); *G06F 13/16* (2013.01); *G11C 16/06* (2013.01); *G06F 3/0629* (2013.01); *G06F 3/0634* (2013.01)

(56) References Cited

U.S. PATENT DOCUMENTS

| | | |
|---|---|---|
| 5,261,068 A | 11/1993 | Gaskins et al. |
| 5,307,497 A | 4/1994 | Feigenbaum et al. |
| 5,325,509 A | 6/1994 | Lautzenheiser |
| 5,392,427 A | 2/1995 | Barrett et al. |
| 5,404,485 A | 4/1995 | Ban |
| 5,438,671 A | 8/1995 | Miles |
| 5,469,555 A | 11/1995 | Ghosh et al. |
| 5,499,354 A | 3/1996 | Aschoff et al. |
| 5,504,882 A | 4/1996 | Chai |
| 5,535,399 A | 7/1996 | Blitz et al. |
| 5,553,261 A | 9/1996 | Hasbun et al. |
| 5,586,291 A | 12/1996 | Lasker et al. |
| 5,594,883 A | 1/1997 | Pricer |
| 5,596,736 A | 1/1997 | Kerns |
| 5,598,370 A | 1/1997 | Niijima et al. |
| 5,651,133 A | 7/1997 | Burkes |
| 5,680,579 A | 10/1997 | Young et al. |
| 5,682,497 A | 10/1997 | Robinson |
| 5,682,499 A | 10/1997 | Bakke et al. |
| 5,701,434 A | 12/1997 | Nakagawa |
| 5,745,792 A | 4/1998 | Jost |
| 5,754,563 A | 5/1998 | White |
| 5,757,567 A | 5/1998 | Hetzler et al. |
| 5,787,486 A | 7/1998 | Chin et al. |
| 5,802,602 A | 9/1998 | Rahman et al. |
| 5,809,527 A | 9/1998 | Cooper et al. |
| 5,809,543 A | 9/1998 | Byers et al. |
| 5,845,329 A | 12/1998 | Onishi et al. |
| 5,930,815 A | 7/1999 | Estakhri et al. |
| 5,957,158 A | 9/1999 | Volz et al. |
| 5,960,462 A | 9/1999 | Solomon et al. |
| 6,000,019 A | 12/1999 | Dykstal et al. |
| 6,014,724 A | 1/2000 | Jennett |
| 6,073,232 A | 6/2000 | Kroeker et al. |
| 6,101,601 A | 8/2000 | Matthews et al. |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,209,088 B1 | 3/2001 | Reneris |
| 6,236,593 B1 | 5/2001 | Hong et al. |
| 6,256,642 B1 | 7/2001 | Krueger et al. |
| 6,279,069 B1 | 8/2001 | Robinson et al. |
| 6,289,413 B1 | 9/2001 | Rogers et al. |
| 6,330,688 B1 | 12/2001 | Brown |
| 6,336,174 B1 | 1/2002 | Li et al. |
| 6,356,986 B1 | 3/2002 | Solomon et al. |
| 6,370,631 B1 | 4/2002 | Dye |
| 6,385,710 B1 | 5/2002 | Goldman et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,477,612 B1 | 11/2002 | Wang |
| 6,507,911 B1 | 1/2003 | Langford |
| 6,523,102 B1 | 2/2003 | Dye et al. |
| 6,564,285 B1 | 5/2003 | Mills et al. |
| 6,587,915 B1 | 7/2003 | Kim |
| 6,601,211 B1 | 7/2003 | Norman |
| 6,625,685 B1 | 9/2003 | Cho et al. |
| 6,629,112 B1 | 9/2003 | Shank |
| 6,658,438 B1 | 12/2003 | Moore et al. |
| 6,671,757 B1 | 12/2003 | Cash et al. |
| 6,715,027 B2 | 3/2004 | Kim et al. |
| 6,751,155 B2 | 6/2004 | Gorobets |
| 6,754,774 B2 | 6/2004 | Gruner et al. |
| 6,775,185 B2 | 8/2004 | Fujisawa et al. |
| 6,779,088 B1 | 8/2004 | Benveniste et al. |
| 6,785,776 B2 | 8/2004 | Arimilli et al. |
| 6,785,785 B2 | 8/2004 | Piccirillo et al. |
| 6,877,076 B1 | 4/2005 | Cho et al. |
| 6,880,049 B2 | 4/2005 | Gruner et al. |
| 6,883,069 B2 | 4/2005 | Yoshida |
| 6,883,079 B1 | 4/2005 | Priborsky |
| 6,938,133 B2 | 8/2005 | Johnson et al. |
| 6,957,158 B1 | 10/2005 | Hancock et al. |
| 6,959,369 B1 | 10/2005 | Ashton et al. |
| 6,981,070 B1 | 12/2005 | Luk et al. |
| 6,996,676 B2 | 2/2006 | Megiddo |
| 7,010,652 B2 | 3/2006 | Piccirillo et al. |
| 7,010,662 B2 | 3/2006 | Aasheim et al. |
| 7,013,376 B2 | 3/2006 | Hooper, III |
| 7,013,379 B1 | 3/2006 | Testardi |
| 7,035,974 B2 | 4/2006 | Shang |
| 7,043,599 B1 | 5/2006 | Ware et al. |
| 7,047,366 B1 | 5/2006 | Ezra |
| 7,050,337 B2 | 5/2006 | Iwase et al. |
| 7,058,769 B1 | 6/2006 | Danilak |
| 7,076,599 B2 | 7/2006 | Aasheim et al. |
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,130,956 B2 | 10/2006 | Rao |
| 7,130,957 B2 | 10/2006 | Rao |
| 7,167,953 B2 | 1/2007 | Megiddo et al. |
| 7,171,536 B2 | 1/2007 | Chang et al. |
| 7,173,852 B2 | 2/2007 | Gorobets et al. |
| 7,181,572 B2 | 2/2007 | Walmsley |
| 7,194,577 B2 | 3/2007 | Johnson et al. |
| 7,194,740 B1 | 3/2007 | Frank et al. |
| 7,203,815 B2 | 4/2007 | Haswell |
| 7,215,580 B2 | 5/2007 | Gorobets |
| 7,219,238 B2 | 5/2007 | Saito et al. |
| 7,243,203 B2 | 7/2007 | Scheuerlein |
| 7,246,179 B2 | 7/2007 | Camara et al. |
| 7,254,686 B2 | 8/2007 | Islam |
| 7,275,135 B2 | 9/2007 | Coulson |
| 7,280,536 B2 | 10/2007 | Testardi |
| 7,293,183 B2 | 11/2007 | Lee et al. |
| 7,305,520 B2 | 12/2007 | Voigt et al. |
| 7,328,307 B2 | 2/2008 | Hoogterp |
| 7,340,558 B2 | 3/2008 | Lee et al. |
| 7,340,566 B2 | 3/2008 | Voth et al. |
| 7,356,651 B2 | 4/2008 | Liu et al. |
| 7,360,015 B2 | 4/2008 | Matthews et al. |
| 7,366,808 B2 | 4/2008 | Kano et al. |
| 7,395,384 B2 | 7/2008 | Sinclair et al. |
| 7,398,348 B2 | 7/2008 | Moore et al. |
| 7,437,510 B2 | 10/2008 | Rosenbluth et al. |
| 7,447,847 B2 | 11/2008 | Louie et al. |
| 7,450,420 B2 | 11/2008 | Sinclair et al. |
| 7,464,221 B2 | 12/2008 | Nakamura et al. |
| 7,487,235 B2 | 2/2009 | Andrews et al. |
| 7,487,320 B2 | 2/2009 | Bansal et al. |
| 7,516,267 B2 | 4/2009 | Coulson et al. |
| 7,526,614 B2 | 4/2009 | van Riel |
| 7,529,905 B2 | 5/2009 | Sinclair |
| 7,536,491 B2 | 5/2009 | Kano et al. |
| 7,552,271 B2 | 6/2009 | Sinclair et al. |
| 7,580,287 B2 | 8/2009 | Aritome |
| 7,603,532 B2 | 10/2009 | Rajan et al. |
| 7,610,348 B2 | 10/2009 | Kisley et al. |
| 7,620,773 B2 | 11/2009 | Nicholson et al. |
| 7,640,390 B2 | 12/2009 | Iwamura et al. |
| 7,644,239 B2 | 1/2010 | Ergan et al. |
| 7,660,911 B2 | 2/2010 | McDaniel |
| 7,660,941 B2 | 2/2010 | Lee et al. |

(56) References Cited

U.S. PATENT DOCUMENTS

| | | |
|---|---|---|
| 7,664,239 B2 | 2/2010 | Groff et al. |
| 7,669,019 B2 | 2/2010 | Fujibayashi et al. |
| 7,676,628 B1 | 3/2010 | Compton et al. |
| 7,702,873 B2 | 4/2010 | Griess et al. |
| 7,721,059 B2 | 5/2010 | Mylly et al. |
| 7,725,628 B1 | 5/2010 | Phan et al. |
| 7,769,978 B2 * | 8/2010 | Gorobets et al. ............ 711/203 |
| 7,831,783 B2 | 11/2010 | Pandit et al. |
| 7,853,772 B2 | 12/2010 | Chang et al. |
| 7,873,782 B2 | 1/2011 | Terry |
| 7,873,803 B2 | 1/2011 | Cheng |
| 7,882,305 B2 | 2/2011 | Moritoki |
| 7,904,647 B2 | 3/2011 | El-Batal et al. |
| 7,913,051 B1 | 3/2011 | Todd et al. |
| 7,917,803 B2 | 3/2011 | Stefanus et al. |
| 7,941,591 B2 | 5/2011 | Aviles |
| 7,984,230 B2 | 7/2011 | Nasu et al. |
| 8,046,526 B2 | 10/2011 | Yeh |
| 8,055,820 B2 | 11/2011 | Sebire |
| 8,127,103 B2 | 2/2012 | Kano et al. |
| 8,135,900 B2 | 3/2012 | Kunimatsu et al. |
| 8,151,082 B2 | 4/2012 | Flynn et al. |
| 8,171,204 B2 | 5/2012 | Chow et al. |
| 2002/0069318 A1 | 6/2002 | Chow et al. |
| 2002/0103819 A1 | 8/2002 | Duvillier |
| 2002/0161855 A1 | 10/2002 | Manczak et al. |
| 2002/0181134 A1 | 12/2002 | Bunker et al. |
| 2003/0061296 A1 | 3/2003 | Craddock et al. |
| 2003/0140051 A1 | 7/2003 | Fujiwara et al. |
| 2003/0145230 A1 | 7/2003 | Chiu et al. |
| 2003/0149753 A1 | 8/2003 | Lamb |
| 2003/0198084 A1 | 10/2003 | Fujisawa et al. |
| 2004/0003002 A1 | 1/2004 | Adelmann |
| 2004/0093463 A1 | 5/2004 | Shang |
| 2004/0117586 A1 | 6/2004 | Estakhri et al. |
| 2004/0148360 A1 | 7/2004 | Mehra et al. |
| 2004/0186946 A1 | 9/2004 | Lee |
| 2004/0236772 A1 * | 11/2004 | Arakawa et al. ............ 707/100 |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0120177 A1 | 6/2005 | Black |
| 2005/0141313 A1 | 6/2005 | Gorobets et al. |
| 2005/0177672 A1 | 8/2005 | Rao |
| 2005/0177687 A1 | 8/2005 | Rao |
| 2005/0193166 A1 | 9/2005 | Johnson et al. |
| 2005/0216653 A1 | 9/2005 | Aasheim et al. |
| 2005/0240713 A1 | 10/2005 | Wu et al. |
| 2005/0246510 A1 | 11/2005 | Retnamma et al. |
| 2005/0257017 A1 | 11/2005 | Yagi |
| 2005/0268359 A1 | 12/2005 | Mach et al. |
| 2005/0273476 A1 | 12/2005 | Wertheimer et al. |
| 2006/0004955 A1 | 1/2006 | Ware et al. |
| 2006/0020744 A1 | 1/2006 | Sinclair et al. |
| 2006/0026339 A1 | 2/2006 | Rostampour |
| 2006/0059326 A1 | 3/2006 | Aasheim et al. |
| 2006/0075057 A1 | 4/2006 | Gildea et al. |
| 2006/0085626 A1 | 4/2006 | Roberson et al. |
| 2006/0129778 A1 | 6/2006 | Clark et al. |
| 2006/0136657 A1 | 6/2006 | Rudelic et al. |
| 2006/0143396 A1 | 6/2006 | Cabot |
| 2006/0149893 A1 | 7/2006 | Barfuss et al. |
| 2006/0179263 A1 | 8/2006 | Song et al. |
| 2006/0184722 A1 | 8/2006 | Sinclair |
| 2006/0190552 A1 | 8/2006 | Henze et al. |
| 2006/0224849 A1 | 10/2006 | Islam et al. |
| 2006/0236061 A1 | 10/2006 | Koclanes |
| 2006/0248387 A1 | 11/2006 | Nicholson et al. |
| 2006/0265636 A1 | 11/2006 | Hummler |
| 2007/0016699 A1 | 1/2007 | Minami |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033362 A1 | 2/2007 | Sinclair |
| 2007/0043900 A1 | 2/2007 | Yun |
| 2007/0050571 A1 | 3/2007 | Nakamura et al. |
| 2007/0061508 A1 | 3/2007 | Zweighaft |
| 2007/0088666 A1 | 4/2007 | Saito |
| 2007/0118676 A1 | 5/2007 | Kano et al. |
| 2007/0118713 A1 | 5/2007 | Guterman et al. |
| 2007/0124540 A1 | 5/2007 | van Riel |
| 2007/0136555 A1 | 6/2007 | Sinclair |
| 2007/0143532 A1 | 6/2007 | Gorobets et al. |
| 2007/0143560 A1 | 6/2007 | Gorobets |
| 2007/0143566 A1 | 6/2007 | Gorobets |
| 2007/0143567 A1 | 6/2007 | Gorobets et al. |
| 2007/0150689 A1 | 6/2007 | Pandit et al. |
| 2007/0156998 A1 | 7/2007 | Gorobets |
| 2007/0168698 A1 | 7/2007 | Coulson et al. |
| 2007/0198770 A1 | 8/2007 | Horii et al. |
| 2007/0204128 A1 | 8/2007 | Lee et al. |
| 2007/0208790 A1 | 9/2007 | Reuter et al. |
| 2007/0233937 A1 | 10/2007 | Coulson et al. |
| 2007/0260608 A1 | 11/2007 | Hertzberg et al. |
| 2007/0261030 A1 | 11/2007 | Wadhwa |
| 2007/0263514 A1 | 11/2007 | Iwata et al. |
| 2007/0266037 A1 | 11/2007 | Terry et al. |
| 2007/0274150 A1 | 11/2007 | Gorobets |
| 2007/0300008 A1 | 12/2007 | Rogers et al. |
| 2008/0010395 A1 | 1/2008 | Mylly et al. |
| 2008/0052377 A1 | 2/2008 | Light |
| 2008/0091876 A1 | 4/2008 | Fujibayashi et al. |
| 2008/0120469 A1 | 5/2008 | Kornegay |
| 2008/0126507 A1 | 5/2008 | Wilkinson |
| 2008/0126700 A1 | 5/2008 | El-Batal et al. |
| 2008/0140737 A1 | 6/2008 | Garst et al. |
| 2008/0209090 A1 | 8/2008 | Kano et al. |
| 2008/0229045 A1 | 9/2008 | Qi |
| 2008/0235443 A1 | 9/2008 | Chow et al. |
| 2008/0243966 A1 | 10/2008 | Croisettier et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0276040 A1 | 11/2008 | Moritoki |
| 2008/0294847 A1 | 11/2008 | Maruyama et al. |
| 2009/0070526 A1 | 3/2009 | Tetrick |
| 2009/0083478 A1 | 3/2009 | Kunimatsu et al. |
| 2009/0083485 A1 | 3/2009 | Cheng |
| 2009/0089485 A1 | 4/2009 | Yeh |
| 2009/0125650 A1 | 5/2009 | Sebire |
| 2009/0125700 A1 | 5/2009 | Kisel |
| 2009/0150599 A1 | 6/2009 | Bennett |
| 2009/0150605 A1 | 6/2009 | Flynn et al. |
| 2009/0150641 A1 | 6/2009 | Flynn et al. |
| 2009/0228637 A1 | 9/2009 | Moon |
| 2009/0248763 A1 | 10/2009 | Rajan et al. |
| 2009/0276588 A1 | 11/2009 | Murase |
| 2009/0276654 A1 | 11/2009 | Butterworth |
| 2009/0287887 A1 | 11/2009 | Matsuki et al. |
| 2009/0292861 A1 | 11/2009 | Kanevsky et al. |
| 2009/0300277 A1 | 12/2009 | Jeddeloh |
| 2009/0307424 A1 | 12/2009 | Galloway et al. |
| 2009/0313453 A1 | 12/2009 | Stefanus et al. |
| 2009/0327602 A1 | 12/2009 | Moore et al. |
| 2009/0327804 A1 | 12/2009 | Moshayedi |
| 2010/0005228 A1 | 1/2010 | Fukutomi et al. |
| 2010/0017556 A1 | 1/2010 | Chin |
| 2010/0023674 A1 | 1/2010 | Aviles |
| 2010/0023676 A1 | 1/2010 | Moon |
| 2010/0030946 A1 | 2/2010 | Kano et al. |
| 2010/0076936 A1 | 3/2010 | Rajan |
| 2010/0095059 A1 | 4/2010 | Kisley et al. |
| 2010/0169542 A1 | 7/2010 | Sinclair |
| 2010/0205231 A1 | 8/2010 | Cousins |
| 2010/0205335 A1 | 8/2010 | Phan et al. |
| 2010/0211737 A1 | 8/2010 | Flynn et al. |
| 2010/0235597 A1 | 9/2010 | Arakawa |
| 2010/0262738 A1 | 10/2010 | Swing et al. |
| 2010/0262740 A1 | 10/2010 | Borchers et al. |
| 2010/0262757 A1 | 10/2010 | Sprinkle et al. |
| 2010/0262758 A1 | 10/2010 | Swing et al. |
| 2010/0262759 A1 | 10/2010 | Borchers et al. |
| 2010/0262760 A1 | 10/2010 | Swing et al. |
| 2010/0262761 A1 | 10/2010 | Borchers et al. |

(56) References Cited

U.S. PATENT DOCUMENTS

| | | | |
|---|---|---|---|
| 2010/0262762 | A1 | 10/2010 | Borchers et al. |
| 2010/0262766 | A1 | 10/2010 | Sprinkle et al. |
| 2010/0262767 | A1 | 10/2010 | Borchers et al. |
| 2010/0262773 | A1 | 10/2010 | Borchers et al. |
| 2010/0262894 | A1 | 10/2010 | Swing et al. |
| 2010/0262979 | A1 | 10/2010 | Borchers et al. |
| 2011/0022819 | A1 | 1/2011 | Post et al. |
| 2011/0238629 | A1* | 9/2011 | Post et al. ............... 707/674 |
| 2012/0159040 | A1* | 6/2012 | Parikh et al. ............ 711/103 |

FOREIGN PATENT DOCUMENTS

| | | |
|---|---|---|
| EP | 1814039 | 3/2009 |
| GB | 0123416 | 9/2001 |
| JP | 4242848 | 8/1992 |
| JP | 8153014 | 6/1996 |
| JP | 200259525 | 9/2000 |
| JP | 2009122850 | 6/2009 |
| WO | WO94/19746 | 9/1994 |
| WO | WO95/18407 | 7/1995 |
| WO | WO96/12225 | 4/1996 |
| WO | WO02/01365 | 1/2002 |
| WO | WO2004/099989 | 11/2004 |
| WO | WO2005/103878 | 11/2005 |
| WO | WO2006/062511 | 6/2006 |
| WO | WO2006/065626 | 6/2006 |
| WO | WO2008/130799 | 3/2008 |
| WO | WO2008/070173 | 6/2008 |
| WO | WO2008/073421 | 6/2008 |
| WO | WO2011/106394 | 9/2011 |

OTHER PUBLICATIONS

Probert, "Windows Kernel Internals Cache Manager," Microsoft Corporation, http://www.i.u.-tokyo.co.jp/edu/training/ss/lecture/new-documents/Lectures/15- CacheManager/CacheManager.pdf, printed May 15, 2010.
Ranaweera, 05-270RO, SAT: Write Same (10) command (41h), T10/ 05, Jul. 7, 2005, www.t10.org/ftp/t10/document.05/05-270r0.pdf, last visited Apr. 11, 2013.
Rosenblum, "The Design and Implementation of a Log-Structured File System," ACM Transactions on Computer Systems, vol. 10 Issue 1, Feb. 1992.
Samsung Electronics, "Introduction to Samsung's LinuX Flash File System—RFS Application Note", Version 1.0, Nov. 2006.
Sears, "Stasis: FleXible Transactional Storage," OSDI '06: 7th USENIX Symposium on Operating Systems Design and Implementation, published Nov. 6, 2006.
Seltzer, "File System Performance and Transaction Support", University of California at Berkeley, published Jan. 1, 1992.
Seltzer, "Transaction Support in a Log-Structured File System", Harvard University Division of Applied Sciences, published Jan. 1, 1993 (Chapter 5, pp. 52-69).
Seltzer, "Transaction Support in Read Optimized and Write Optimized File Systems," Proceedings of the 16th VLDB Conference, Brisbane, Australia, published Jan. 1, 1990.
Shimpi, Anand, The SSD Anthology: Understanding SSDs and New Drives from OCZ, Mar. 18, 2009, 69 pgs.
Shu, "Data Set Management Commands Proposals for ATA8-ACS2," Dec. 12, 2007, http://www.t13.org.Documents/UploadedDocuments/docs2008/e07154r6-Data_Set_Management_Proposal_for_ATA-ACS2.pdf, printed Apr. 5, 2010.
Singer, "Implementing MLC NAND Flash for Cost-Effective, High Capacity Memory," M-Systems, White Paper, 91-SR014-02-8L, Rev. 1.1, Sep. 2003.
Spansion, "Data Management Software (DMS) for AMD Simultaneous Read/Write Flash Memory Devices", published Jul. 7, 2003.
Spillane "Enabling Transactional File Access via Lightweight Kernel EXtensions", Stony Brook University, IBM T. J. Watson Research Center, published Feb. 25, 2009.
State Intellectual Property Office, Office Action, CN Application No. 200780050970.0, issued Oct. 28, 2010.
State Intellectual Property Office, Office Action, CN Application No. 200780051020.X, issued Nov. 11, 2010.
State Intellectual Property Office, Office Action, CN Application No. 200780050983.8, issued May 18, 2011.
State Intellectual Property Office, Office Action, CN Application No. 200780051020.X, issued Jul. 6, 2011.
State Intellectual Property Office, Office Action, CN Application No. 200780051020.X, issued Nov. 7, 2011.
State Intellectual Property Office, Office Action, CN Application No. 200780050970.0, issued Jan. 5, 2012.
Tal, "NAND vs. NOR Flash Technology," M-Systems, www2.electronicproducts.com/PrintArticle.aspX?ArticleURL=FEBMSY1.feb2002.html, visited Nov. 22, 2010.
Terry et al., U.S. Appl. No. 60/797,127, "Filesystem-aware Block Storage System, Apparatus, and Method," filed May 3, 2006.
USPTO, Notice of Allowance for U.S. Appl. No. 12/986,117, Mailed Apr. 4, 2013.
USPTO, Notice of Allowance for U.S. Appl. No. 12/986,117 Mailed Jun. 5, 2013.
USPTO, Office Action for U.S. Appl. No. 12/879,004 mailed Feb. 25, 2013.
USPTO, Office Action for U.S. Appl. No. 13/607,486 mailed Jan. 10, 2013.
USPTO, Office Action for U.S. Appl. No. 11/952,113, mailed Dec. 15, 2010.
USPTO, Office Action for U.S. Appl. No. 12/711,113, mailed Jun. 6, 2012.
USPTO, Office Action for U.S. Appl. No. 12/711,113, mailed Nov. 23, 2012.
USPTO, Office Action for U.S. Appl. No. 13,607,486 mailed May 2, 2013.
USPTO, Office Action for U.S. Appl. No. 13/118,237 mailed Apr. 22, 2013.
USPTO, Notice of Allowance, U.S. Appl. No. 11/952,109, issued May 1, 2013.
USPTO, Office Action, U.S. Appl. No. 11/952,109, mailed Nov. 29, 2011.
Van Hensbergen, "Dynamic Policy Disk Caching for Storage Networking," IBM Research Division, RC24123, Nov. 2006.
Volos, "Mnemosyne: Lightweight Persistent Memory", ACM 978-1-4503-0266—Jan. 11, 2003, published Mar. 5, 2011.
Wacha, "Improving Raid-Based Storage Systems with Flash Memory," First Annual ISSDM/SRL Research Symposium, Oct. 20-21, 2009.
Walp, "System Integrated Flash Storage," Microsoft Corporation, 2008, http://download.microsoft.com/download/5/E/6/5E66827B-988B-4F50-AF3A-C2FF1E62180F/COR-T559-WHO8.pptx, Printed Apr. 6, 2010, 8 pgs.
WIPO, International Preliminary Report of Patentability for PCT/US2007/086691, mailed Feb. 16, 2009.
WIPO, International Preliminary Report on Patentability for PCT/US2007/086688, mailed Mar. 16, 2009.
WIPO, International Preliminary Report on Patentability for PCT/US2007/086701, mailed Mar. 16, 2009.
Wipo, International Preliminary Report on Patentability for PCT/US2007/086687, mailed Mar. 18, 2009.
WIPO, International Preliminary Report on Patentability for PCT/US2007/025048, mailed Jun. 10, 2009.
WIPO, International Preliminary Report on Patentability for PCT/US2010/048325, mailed Mar. 13, 2012.
WIPO, International Search Report and Written Opinion for PCT/US2007/025048, mailed May 27, 2008.
WIPO, International Search Report and Written Opinion for PCT/US2007/086701, mailed Jun. 5, 2008.
WIPO, International Search Report and Written Opinion for PCT/US2007/086687, mailed Sep. 5, 2008.
WIPO, International Search Report and Written Opinion for PCT/US2010/048325, mailed Jun. 1, 2011.
WIPO, International Search Report and Written Opinion for PCT/US2011/025885, mailed Sep. 28, 2011.

(56) References Cited

OTHER PUBLICATIONS

Wright, "EXtending ACID Semantics to the File System", ACM Transactions on Storage, vol. 3, No. 2, published May 1, 2011, pp. 1-40.

Wu, "eNVy: A Non-Volatile, Main Memory Storage System," ACM 0-89791-660-3/94/0010, ASPLOS-VI Proceedings of the siXth international conference on Architectural support for programming languages and operating systems, pp. 86-97, 1994.

Zhang et al., "De-indirection for Flash-Based SSDs with Nameless Writes," UseniX InFast 2012 (Feb. 14, 2012).

Actel, "Actel Fusion FPGAs Supporting Intelligent Peripheral Management Interface (IPMI) Applications," http://www.actel.com/documents/Fusion_IPMI_AN.pdf, Oct. 1, 2006, visited Mar. 11, 2010.

Anonymous, "Method for Fault Tolerance in Nonvolatile Storage", http://ip.com, IP.com No. IPCOM000042269D, 2005.

Ari, "Performance Boosting and Workload Isolation in Storage Area Networks with SanCache," Hewlett Packard Laboratories, Proceedings of the 23rd IEEE / 14th NASA Goddard Conference on Mass Storage Systems and Technologies (MSST 2006), May 2006, pp. 263-27.

Asine, "ASPMC-660 Rugged IDE Flash Drive PMC Module," http://www.asinegroup.com/ products/aspmc660.html, copyright 2002, visited Nov. 8, 2009.

Barrall et al., U.S. Appl. No. 60/625,495, "Dynamically EXpandable and Contractible Fault-Tolerant Storage System Permitting Variously Sized Storage Devices and Method," filed Nov. 5, 2004.

Barrall et al., U.S. Appl. No. 60/718,768, "Dynamically Adaptable Fault-Tolerant Storage System," filed Sep. 20, 2005.

BiTMICRO, "BiTMICRO Introduces E-Disk PMC Flash Disk Module at Military & Aerospace Electronics East 2004," http://www.bitmicro.com/press.sub, published May 18, 2004, visited Mar. 8, 2011.

Brandon, Jr., "Sparse Matrices in CS Education," Journal of Computing Sciences in Colleges, vol. 24 Issue 5, May 2009, pp. 93-98.

Coburn, "NV-Heaps: Making Persistent Objects Fast and Safe with NeXt-Generation, Non-Volatile Memories", ACM 978-1-4503-0266-1/11/0, published Mar. 5, 2011.

EEEL-6892, Lecture 18, "Virtual Computers," Mar. 2010.

ELNEC, "NAND Flash Memories and Programming NAND Flash Memories Using ELNEC Device Programmers, Application Note," published Mar. 1, 2007.

European Patent Office, Office Action, EP Application No. 07865345.8, issued Nov. 17, 2010.

Gal, "A Transactional Flash File System for Microcontrollers," 2005 USENIX Annual Technical Conference, published Apr. 10, 2009.

Garfinkel, "One Big File Is Not Enough: A Critical Evaluation of the Dominant Free-Space Sanitization Technique," 6th Workshop on Privacy Enhancing Technologies. Cambridge, United Kingdom, published Jun. 1, 2006.

Gutmann, "Secure Deletion of Data from Magnetic and Solid-State Memory", UseniX, 14 pages, San Jose, CA, published Jul. 1, 1996.

Huffman, "Non-Volatile Memory Host Controller Interface," Apr. 14, 2008, 65 pgs.

Hynix Semiconductor, Intel Corporation, Micron Technology, Inc. Phison Electronics Corp., Sony Corporation, Spansion, STMicroelectronics, "Open NAND Flash Interface Specification," Revision 2.0, Feb. 27, 2008.

Information Technology, "SCSI Object-Based Storage Device Commands," 2 (OSD-2), Project T10/1729-D, Revision 4, published Jul. 30, 2004, printed Jul. 24, 2008.

Intel, "Non-Volatile Memory Host Controller Interface (NVMJCI) 1.0," Apr. 14, 2008.

Johnson, "An Introduction to Block Device Drivers," Jan. 1, 1995.

Kawaguchi, "A Flash-Memory Based File System," TCON'95 Proceedings of the USENIX 1995 Technical Conference Proceedings, p. 13.

Mesnier, "Object-Based Storage," IEEE Communications Magazine, Aug. 2003, pp. 84-90.

Micron, "TN-29-17: NAND Flash Design and Use Considerations," Mar. 10, 2010.

Morgenstern, David, "Is There a Flash Memory RAID in your Future?", http://www.eweek.com—eWeek, Ziff Davis Enterprise Holdings Inc., Nov. 8, 2006, visited Mar. 18, 2010.

Novell, "File System Primer", http://wiki.novell.com/indeX.php/File_System_Primer, 2006, visited Oct. 18, 2006.

Plank, "A Tutorial on Reed-Solomon Coding for Fault Tolerance in RAID-like System," Department of Computer Science, University of Tennessee, pp. 995-1012, Sep. 1997.

Porter, "Operating System Transactions," ACM 978-1-60558-752—Mar. 9, 2010, published Oct. 1, 2009.

Non-Final Office Action for U.S. Appl. No. 14/627,869, filed Feb. 20, 2015, and mailed from the USPTO May 22, 2015, 10 pgs.

Non-Final Office Action for U.S. Appl. No. 13/865,153, filed Apr. 17, 2013, and mailed from the USPTO Oct. 22, 2015, 8 pgs.

\* cited by examiner

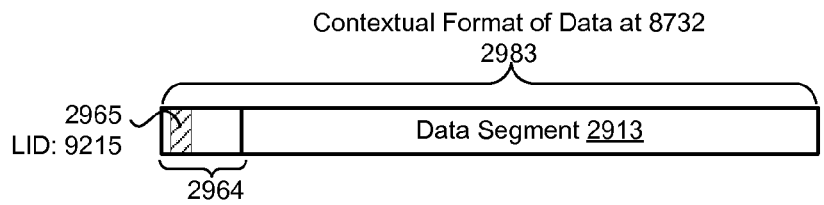
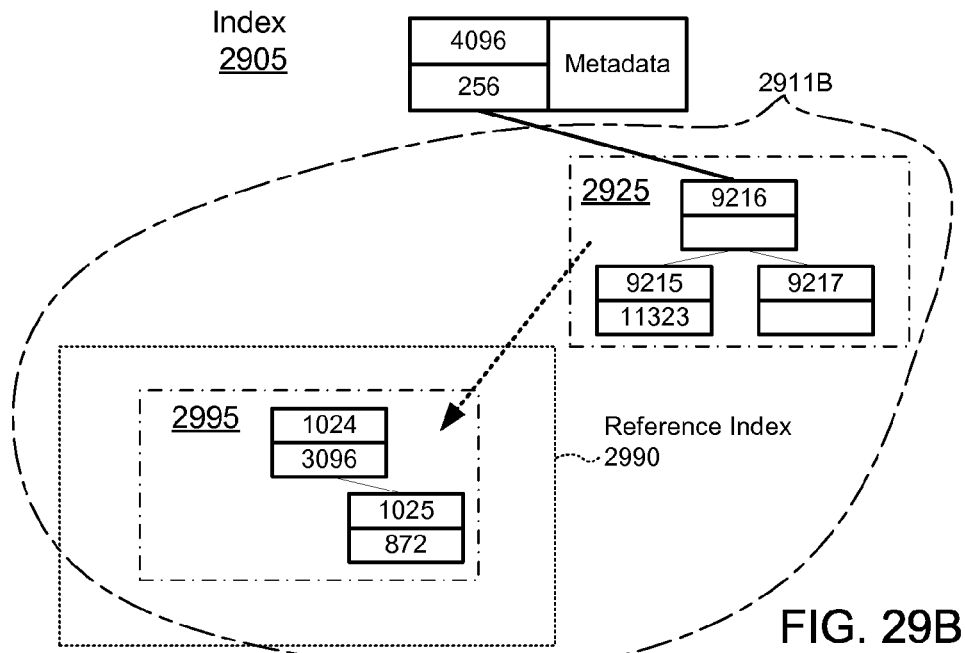
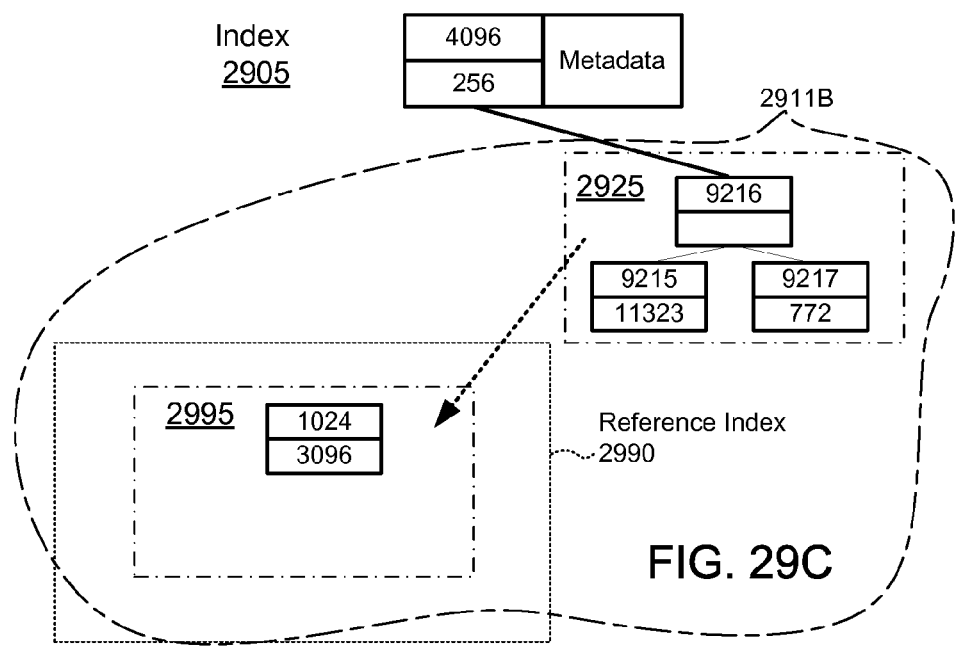

SYSTEMS AND METHODS FOR CONTEXTUAL STORAGE

CROSS-REFERENCE TO RELATED APPLICATIONS

This application is a continuation of, and claims priority to, U.S. patent application No. 13/424,333 entitled "Logical Interfaces for Contextual Storage," filed Mar. 19, 2012 for David Flynn et al, which issued as U.S. Pat. No. 8,966,191 on Feb. 24, 2015, and which claims priority to U.S.Provisional Patent Application No. 61/454,235 filed Mar. 18, 2011, each of which is hereby incorporated by reference in its entirety.

TECHNICAL FIELD

This disclosure relates to management of a logical interface to data stored in a contextual format on non-volatile storage media.

BRIEF DESCRIPTION OF THE DRAWINGS

This disclosure includes and references the accompanying drawings. In the drawings, similar symbols typically identify similar components, unless context dictates otherwise. The illustrative embodiments described in the detailed description, drawings, and claims are not meant to be limiting. Other embodiments may be utilized, and other changes may be made to these exemplary embodiments, without departing from the scope of the disclosure.

FIGS. 29A-D depict exemplary move operations;

DETAILED DESCRIPTION

Figure 1A:
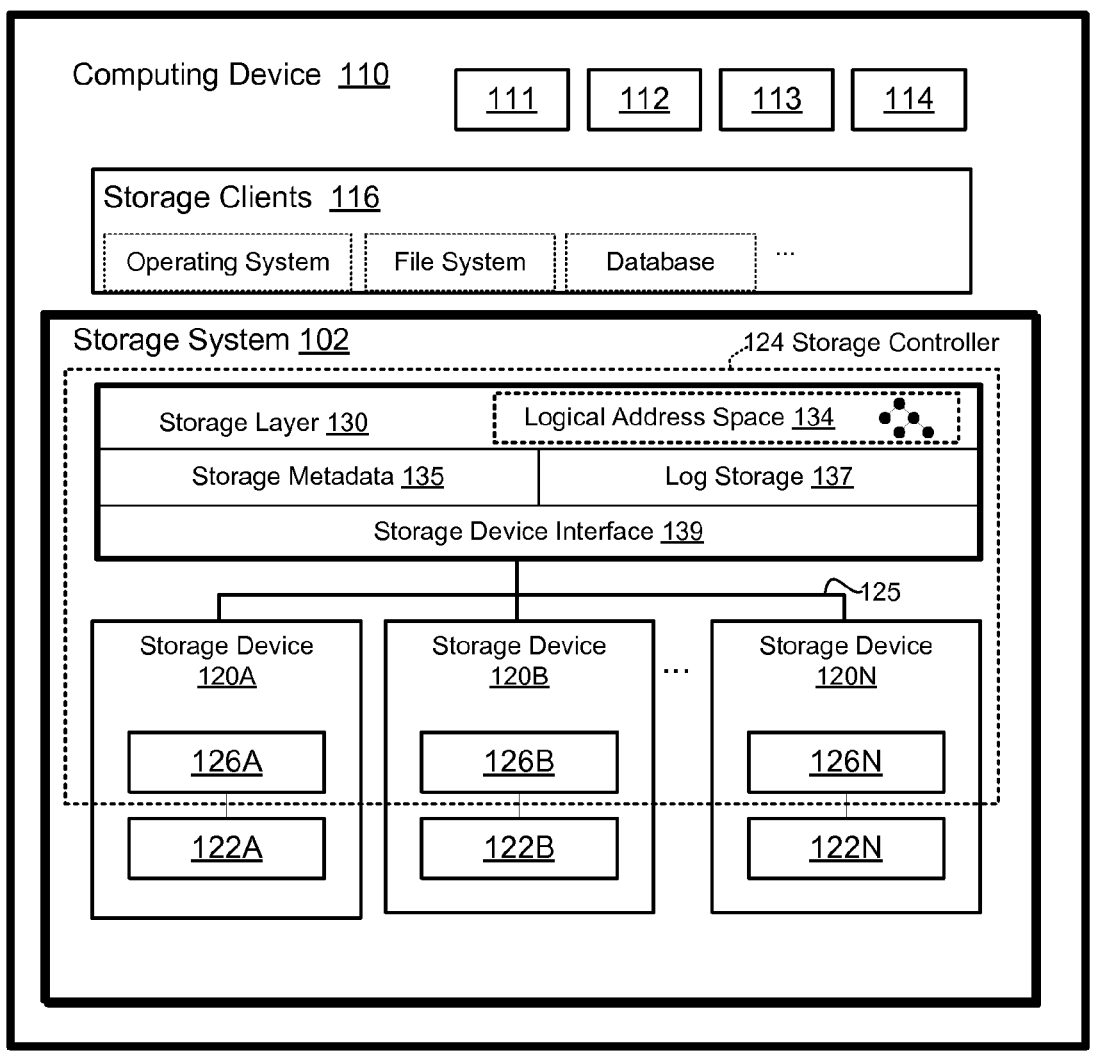
FIG. 1A is a block diagram of one embodiment of a storage system comprising a storage layer.

According to various embodiments, a storage controller manages one or more storage devices. The storage device(s)

may comprise non-volatile storage devices, such as solid-state storage device(s), that are arranged and/or partitioned into a plurality of addressable, media storage locations. As used herein, a media storage location refers to any physical unit of storage (e.g., any physical storage media quantity on a storage device). Media storage units may include, but are not limited to: pages, storage divisions, erase blocks, sectors, blocks, collections or sets of physical storage locations (e.g., logical pages, logical erase blocks, etc., described below), or the like.

The storage controller may comprise a storage layer, which may present a logical address space to one or more storage clients. As used herein, a logical address space refers to a logical representation of storage resources. The logical address space may comprise a plurality (e.g., range) of logical identifiers. As used herein, a logical identifier refers to any identifier for referencing a storage resource (e.g., data), including, but not limited to: a logical block address ("LBA"), cylinder/head/sector ("CHS") address, a file name, an object identifier, an inode, a Universally Unique Identifier ("UUID"), a Globally Unique Identifier ("GUID"), a hash code, a signature, an index entry, a range, an extent, or the like. The logical address space, logical identifiers, and relationships between logical identifiers and storage resources define a "logical interface" through which storage clients access storage resources. As used herein, a logical interface refers to handle, identifier, path, process, or other mechanism for referencing and/or interfacing with a storage resource. A logical interface may include, but is not limited to: a logical identifier, a range or extent of logical identifiers, a reference to a logical identifier (e.g., a link between logical identifiers, a pointer to a logical identifier, etc.), a reference to a virtual storage unit, or the like. A logical interface may be used to reference data through a storage interface and/or application programming interface (API), such as the storage layer interface, described below, but may not comprise an API per se.

The storage layer may maintain storage metadata, such as a forward index, to map logical identifiers of the logical address space to media storage locations on the storage device(s). The storage layer may provide for arbitrary, "any-to-any" mappings to physical storage resources. Accordingly, there may be no pre-defined and/or pre-set mappings between logical identifiers and particular, media storage locations and/or media addresses. As used herein, a media address refers to an address of a storage resource that uniquely identifies one storage resource from another to a controller that manages a plurality of storage resources, by way of example, a media address includes, but is not limited to: the address of a media storage location, a physical storage unit, a collection of physical storage units (e.g., a logical storage unit), a portion of a media storage unit (e.g., a logical storage unit address and offset, range, and/or extent), or the like. Accordingly, the storage layer may map logical identifiers to physical data resources of any size and/or granularity, which may or may not correspond to the underlying data partitioning scheme of the storage device(s). For example, in some embodiments, the storage controller is configured to store data within logical storage units that are formed by logically combining a plurality of physical storage units, which may allow the storage controller to support many different virtual storage unit sizes and/or granularities.

As used herein, a logical storage element refers to a set of two or more non-volatile storage elements that are or are capable of being managed in parallel (e.g., via an I/O and/or control bus). A logical storage element may comprise a plurality of logical storage units, such as logical pages, logical storage divisions (e.g., logical erase blocks), and so on. Each logical storage unit may be comprised of storage units on the non-volatile storage elements in the respective logical storage element. As used herein, a logical storage unit refers to logical construct combining two or more physical storage units, each physical storage unit on a respective solid-state storage element in the respective logical storage element (each solid-state storage element being accessible in parallel). As used herein, a logical storage division refers to a set of two or more physical storage divisions, each physical storage division on a respective solid-state storage element in the respective logical storage element.

The logical address space presented by the storage layer may have a logical capacity, which may comprise a finite set or range of logical identifiers. The logical capacity of the logical address space may correspond to the number of available logical identifiers in the logical address space and/or the size and/or granularity of the data referenced by the logical identifiers. For example, the logical capacity of a logical address space comprising $2^{32}$ unique logical identifiers, each referencing 2048 bytes (2 kb) of data may be $2^{43}$ bytes. In some embodiments, the logical address space may be "thinly provisioned." As used herein, a thinly provisioned logical address space refers to a logical address space having a logical capacity that exceeds the physical storage capacity of the underlying storage device(s). For example, the storage layer may present a 64-bit logical address space to the storage clients (e.g., a logical address space referenced by 64-bit logical identifiers), which exceeds the physical storage capacity of the underlying storage devices. The large logical address space may allow storage clients to allocate and/or reference contiguous ranges of logical identifiers, while reducing the chance of naming conflicts. The storage layer may leverage the "any-to-any" mappings between logical identifiers and physical storage resources to manage the logical address space independently of the underlying physical storage devices. For example, the storage layer may add and/or remove physical storage resources seamlessly, as needed, and without changing the logical interfaces used by the storage clients.

The storage controller may be configured to store data in a contextual format. As used herein, a contextual format refers to a "self-describing" data format in which persistent contextual metadata is stored with the data on the physical storage media. The persistent contextual metadata provides context for the data it is stored with. In certain embodiments, the persistent contextual metadata uniquely identifies the data that with which the persistent contextual metadata is stored. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies an order of a sequence of operations performed on the data. In a further embodiment, the persistent contextual metadata identifies security controls, a data type, or other attributes of the data. In certain embodiments, the persistent contextual metadata identifies at least one of a plurality of aspects, including data type, a unique data identifier, an operation, and an order of a sequence of operations performed on the data. The persistent contextual metadata may include, but is not limited to: a logical interface of the data, an identifier of the data (e.g., a logical identifier, file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile storage media, a storage division index, or the like). Accordingly, a contextual data format refers to a data format that associates the data with a logical interface of the data (e.g., the "context" of the data). A contextual data format is self-describing in that the contextual data format includes the logical interface of the data.

In some embodiments, the contextual data format may allow data context to be determined (and/or reconstructed) based upon the contents of the non-volatile storage media, and independently of other storage metadata, such as the arbitrary, "any-to-any" mappings discussed above. Since the media storage location of data is independent of the logical interface of the data, it may be inefficient (or impossible) to determine the context of data based solely upon the media storage location or media address of the data. Storing data in a contextual format on the non-volatile storage media may allow data context to be determined without reference to other storage metadata. For example, the contextual data format may allow the logical interface of data to be reconstructed based only upon the contents of the non-volatile storage media (e.g., reconstruct the "any-to-any" mappings between logical identifier and media storage location).

In some embodiments, the storage controller may be configured to store data on an asymmetric, write-once storage media, such as solid-state storage media. As used herein, a "write once" storage media refers to a storage media that is reinitialized (e.g., erased) each time new data is written or programmed thereon. As used herein, "asymmetric" storage media refers to storage media having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The storage media may be partitioned into storage divisions that can be erased as a group (e.g., erase blocks) in order to, inter alia, account for the asymmetric properties of the media. As such, modifying a single data segment "in-place" may require erasing the entire erase block comprising the data, and rewriting the modified data to the erase block, along with the original, unchanged data. This may result in inefficient "write amplification," which may excessively wear the media. Therefore, in some embodiments, the storage controller may be configured to write data "out-of-place." As used herein, writing data "out-of-place" refers to writing data to different media storage location(s) rather than overwriting the data "in-place" (e.g., overwriting the original physical location of the data). Modifying data "out-of-place" may avoid write amplification, since existing, valid data on the erase block with the data to be modified need not be erased and recopied. Moreover, writing data "out-of-place" may remove erasure from the latency path of many storage operations (the erasure latency is no longer part of the "critical path" of a write operation).

The storage controller may comprise one or more processes that operate outside of the regular path for servicing of storage operations (the "path" for performing a storage operation and/or servicing a storage request). As used herein, the "regular path for servicing a storage request" or "path for servicing a storage operation" (also referred to as a "critical path") refers to a series of processing operations needed to service the storage operation or request, such as a read, write, modify, or the like. The path for servicing a storage request may comprise receiving the request from a storage client, identifying the logical interface of the request (e.g., logical identifiers pertaining to the request), performing one or more storage operations on a non-volatile storage media, and returning a result, such as acknowledgement or data. Processes that occur outside of the path for servicing storage requests may include, but are not limited to: a groomer, deduplication, and so on. These processes may be implemented autonomously, and in the background from servicing storage requests, such that they do not interfere with or impact the performance of other storage operations and/or requests. Accordingly, these processes may operate independent of servicing storage requests.

In some embodiments, the storage controller comprises a groomer, which is configured to reclaim storage divisions (erase blocks) for reuse. The write out-of-place write paradigm implemented by the storage controller may result in "obsolete" or "invalid" data remaining on the non-volatile storage media. For example, overwriting data X with data Y may result in storing Y on a new storage division (rather than overwriting X in place), and updating the "any-to-any" mappings of the storage metadata to identify Y as the valid, up-to-date version of the data. The obsolete version of the data X may be marked as "invalid," but may not be immediately removed (e.g., erased), since, as discussed above, erasing X may involve erasing an entire storage division, which is a time-consuming operation and may result in write amplification. Similarly, data that is no longer is use (e.g., deleted or trimmed data) may not be immediately removed. The non-volatile storage media may accumulate a significant amount of "invalid" data. A groomer process may operate outside of the "critical path" for servicing storage operations. The groomer process may reclaim storage divisions so that they can be reused for other storage operations. As used herein, reclaiming a storage division refers to erasing the storage division so that new data may be stored/programmed thereon. Reclaiming a storage division may comprise relocating valid data on the storage division to a new storage location. The groomer may identify storage divisions for reclamation based upon one or more factors, which may include, but are not limited to: the amount of invalid data in the storage division, the amount of valid data in the storage division, wear on the storage division (e.g., number of erase cycles), time since the storage division was programmed or refreshed, and so on.

The storage controller may be further configured to store data in a log format. As described above, a log format refers to a data format that defines an ordered sequence of storage operations performed on a non-volatile storage media. In some embodiments, the log format comprises storing data in a pre-determined sequence within the media address space of the non-volatile storage media (e.g., sequentially within pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a storage division, such as an erase block). In some embodiments, sequence indicators may be applied to storage divisions when the storage divisions are reclaimed (e.g., erased), as described above, and/or when the storage divisions are first used to store data.

In some embodiments the log format may comprise storing data in an "append only" paradigm. The storage controller may maintain a current append point within a media address space of the storage device. The append point may be a current storage division and/or offset within a storage division. Data may then be sequentially appended from the append point. The sequential ordering of the data, therefore, may be determined based upon the sequence indicator of the storage division of the data in combination with the sequence of the data within the storage division. Upon reaching the end of a storage division, the storage controller may identify the "next" available storage division (the next storage division that is initialized and ready to store data). The groomer may reclaim storage divisions comprising invalid, stale, and/or deleted data, to ensure that data may continue to be appended to the media log.

The log format described herein may allow valid data to be distinguished from invalid data based upon the contents of the non-volatile storage media, and independently of the storage metadata. As discussed above, invalid data may not be removed from the storage media until the storage division comprising the data is reclaimed. Therefore, multiple "versions" of data having the same context may exist on the non-volatile storage media (e.g., multiple versions of data having the same logical interface and/or same logical identifier). The sequence indicators associated with the data may be used to distinguish "invalid" versions of data from the current, up-to-date version of the data; the data that is the most recent in the log is the current version, and all previous versions may be identified as invalid.

According to various embodiments, a logical interface of data stored in a contextual format is modified. The contextual format of the data may be inconsistent with the modified logical interface. As used herein, an inconsistent contextual data format refers to a contextual data format that defines a logical interface to data on storage media that is inconsistent with the a logical interface of the data. The logical interface of the data may be maintained by a storage layer, storage controller, or other module. The inconsistency may include, but is not limited to: the contextual data format associating the data with a different logical identifier than the logical interface; the contextual data format associating the data with a different set of logical identifiers than the logical interface; the contextual data format associating the data with a different logical identifier reference than the logical interface; or the like. The storage controller may provide access to the data in the inconsistent contextual format and may update the contextual format of the data of the non-volatile storage media to be consistent with the modified logical interface. The update may require re-writing the data out-of-place and, as such, may be deferred. As used herein, a consistent contextual data format refers to a contextual data format that defines the same (or an equivalent) logical interface as the logical interface of the data, which may include, but is not limited to: the contextual data format associating the data with the same logical identifier(s) (or equivalent logical identifier(s)) as the logical interface; the contextual data format associating the logical identifier with the same set of logical identifiers as the logical interface; the contextual data format associating the data with the same reference logical identifier as the logical interface; or the like.

According to various embodiments, a storage controller and/or storage layer performs a method for managing a logical address space, comprising: modifying a logical interface of data stored in a contextual format on a non-volatile storage media, wherein the contextual format of the data on the non-volatile storage media is inconsistent with the modified logical interface of the data; accessing the data in the inconsistent contextual format through the modified logical interface; and updating the contextual format of the data on the non-volatile storage media to be consistent with the modified logical interface. The logical interface of the data may be modified in response to a request (e.g., a request from a storage client). The request may comprise a move, clone (e.g., copy), deduplication, or the like. The request may "return" (e.g., be acknowledged by the storage layer) before the contextual format of the data is updated on the non-volatile storage media. Modifying the logical interface may further comprise storing a persistent note on the non-volatile storage media indicative of the modification to the logical interface (e.g., associate the data with the modified logical interface). The contextual format of the data may be updated out-of-place, at other media storage locations on the non-volatile storage media. Updates to the contextual format may be deferred and/or made outside of the path of other storage operations (e.g., independent of servicing other storage operations and/or requests). For example, the contextual format of the data may be updated as part of a grooming process. When reclaiming a storage division, data that is in an inconsistent contextual format may be identified, and updated as the data is relocated to new media storage locations. Providing access to the data through the modified logical interface may comprise referencing the data in the inconsistent contextual format through one or more reference entry and/or indirect entries in an index.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1A is a block diagram of one embodiment a system 100 comprising a storage layer 130. The storage layer 130 may operate on a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or storage controller 124) to a communication network, such as an Internet Protocol network, a Storage Area Network, or the like. The computing device 110 may further comprise a non-transitory, machine-readable storage media 114. The machine-readable storage media 114 may comprise machine-executable instructions configured to cause the computing device 110 (e.g., processor 111) to perform steps of one or more of the methods disclosed herein. Alternatively, or in addition, the storage layer 130 and/or one or more modules thereof may be embodied as one or more machine-readable instructions stored on the non-transitory storage media 114.

The storage layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

Figure 1B:
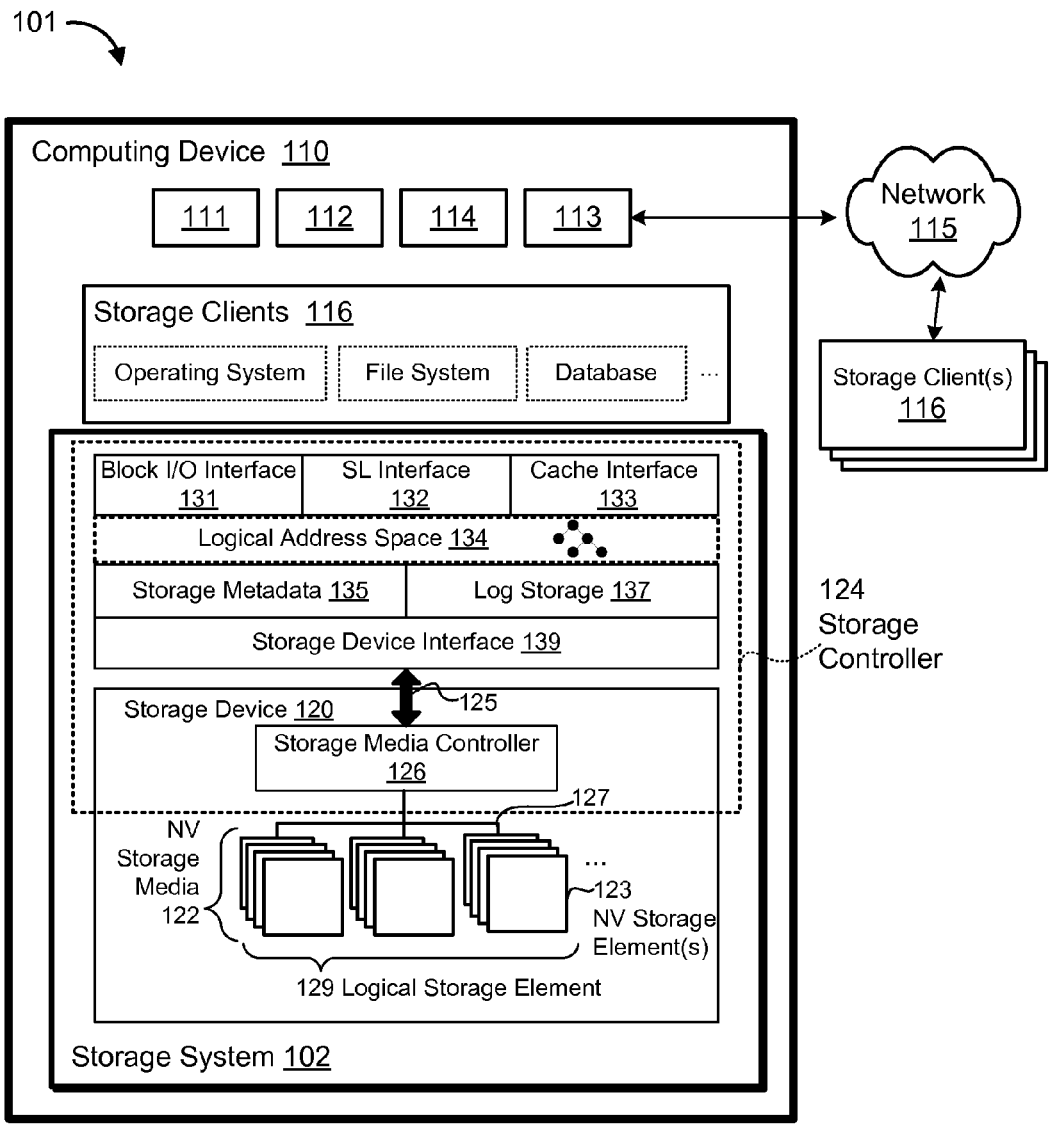
FIG. 1B is a block diagram of another embodiment of a storage system comprising a storage layer.

The storage layer 130 comprises and/or is communicatively coupled to one or more storage devices 120A-N. The storage devices 120A-N may include different types of storage devices including, but not limited to: solid-state storage devices, hard drives, SAN storage resources, or the like. The storage devices 120A-N may comprise respective controllers 126A-N and non-volatile storage media 122A-N. As illustrated in FIG. 1B, The storage layer 130 may provide access to the non-volatile storage devices 120A-N via a traditional block I/O interface 131. Additionally, the storage layer 130 may provide access to enhanced functionality (large, virtual address space) through the storage layer interface 132. The storage metadata 135 may be used to manage and/or track storage operations performed any of the Block I/O interface 131, storage layer interface 132, cache interface 133, or other, related interfaces.

The cache interface 133 may expose cache-specific features accessible via the storage layer 130. Examples of such cache-specific features are disclosed U.S. patent application Ser. No. 12/877,971, filed Sep. 8, 2010, and entitled, "Apparatus, System, and Method for an Improved Nonvolatile Caching Device," U.S. Provisional Patent Application Ser. No. 61/438,182 filed Jan. 31, 2011, and entitled "Apparatus, System, and Method for Managing Eviction of Data," U.S. Provisional Patent Application Ser. No. 61,438,194, filed Jan. 31, 2011, and entitled, "Apparatus, System, and Method for Managing Eviction of Data," U.S. Provisional Patent Application Ser. No. 61/435,192 filed Jan. 21, 2011, and entitled "Apparatus, System, and Method for Destaging Cached Data," and U.S. Provisional Patent Application Ser. No. 61/446,889, filed Feb. 25, 2011 and entitled, "Apparatus, System, and Method for Managing Contents of a Cache," each of which is hereby incorporated by reference in its entirety.

In some embodiments, the storage layer interface 132 presented to the storage clients 116 provides access to data transformations implemented by the non-volatile storage device 120 and/or the non-volatile storage media controller 126. Examples of such transformations are disclosed in U.S. Provisional Patent Application Ser. No. 61/387,082, filed on Sep. 28, 2010, and entitled, "Apparatus, System, and Method for Data Transformations within a Data Storage Device," which is hereby incorporated by reference in its entirety.

The storage layer 130 may provide storage services through one or more interfaces, which may include, but are not limited to: a block I/O interface, an extended storage layer interface, a cache interface, and the like. The storage layer 130 may present a logical address space 134 to the storage clients 116 through one or more interfaces. As discussed above, the logical address space 134 may comprise a plurality of logical identifiers, each corresponding to respective media storage locations on one or more of the storage devices 120A-N. The storage layer 130 may maintain storage metadata 135 comprising "any-to-any" mappings between logical identifiers and media storage locations, as described above. The logical address space 134 and storage metadata 135 may, therefore, define a logical interface of data stored on the storage devices 120A-N.

The storage layer 130 may further comprise a log storage module 137 that is configured to store data in a contextual, log format. The contextual, log data format may comprise associating data with persistent contextual metadata, such as the logical interface of the data (e.g., logical identifier), or the like. The contextual, log format may further comprise associating data with respective sequence identifiers on the non-volatile storage media 122, which define an ordered sequence of storage operations performed on the storage devices 120A-N, as described above.

The storage layer 130 may further comprise a storage device interface 139 configured to transfer data, commands, and/or queries to the storage devices 120A-N over a bus 125, which may include, but is not limited to: a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, a network, Infiniband, SCSI RDMA, or the like. The storage device interface 139 may communicate with the storage devices 120A-N using input-output control ("IO-CTL") command(s), IO-CTL command extension(s), remote direct memory access, or the like.

FIG. 1B is a block diagram of another embodiment a system 101 comprising a storage layer 130. The storage layer 130 may operate on a computing device 110, which, as discussed above, may comprise a processor 111, volatile memory 112, communication interface 113, and non-transitory, machine-readable storage media 114. The communication interface 113 may comprise one or more network interfaces configured to communicatively couple the computing device 110 (and/or storage controller 124) to a network 115 and/or to one or more remote, network-accessible storage clients 116.

The computing device 110 may comprise a storage controller 124 that is configured to provide storage services to the storage clients 116. The storage clients 116 may include local storage clients 116 operating on the computing device 110 and/or remote, storage clients 116 accessible via the network 115 (and network interface 113). The storage controller 124 comprises one or more storage devices 120. Although FIG. 1B depicts a single storage device 120, the disclosure is not limited in this regard and could be adapted to incorporate any number of storage devices 120.

The non-volatile storage device 120 may comprise non-volatile storage media 122, which may include but is not limited to: NAND flash memory, NOR flash memory, nano random access memory ("nano RAM or NRAM"), magneto-resistive RAM ("MRAM"), dynamic RAM ("DRAM"), phase change RAM ("PRAM"), magnetic storage media (e.g., hard disk, tape), optical storage media, or the like. The non-volatile storage media 122 may be comprised of one or more storage elements 123, which may include, but are not limited to: chips, packages, planes, die, and the like. A storage media controller 126 may be configured to manage storage operations on the storage media 122, and may comprise one or more processors, programmable processors (e.g., field-programmable gate arrays), or the like. In some embodiments, the storage media controller 126 is configured to store data on (and read data from) the storage media 122 in the contextual, log format described above, and to transfer data to/from the non-volatile storage device 120, and so on.

The storage media controller 126 may be communicatively coupled to the non-volatile storage media 122 by way of a bus 127. The bus 127 may comprise a storage I/O bus for communicating data to/from the non-volatile storage elements 123. The bus 127 may further comprise a control I/O bus for communicating addressing and other command and control information to the non-volatile storage elements 123. In some embodiments, the bus 127 may communicatively couple the non-volatile storage elements 123 to the storage media controller 126 in parallel. This parallel access may allow the elements 123 to be managed as a group, forming a logical storage element 129. As discussed above, the logical storage element may be partitioned into respective logical storage units (e.g., logical pages) and/or logical storage divisions (e.g., logical erase blocks). The logical storage units may be formed by logically combining physical storage units of each of the non-volatile storage elements. For example, if the solid state storage media 122 comprises twenty-five (25) non-volatile storage elements, each logical storage unit may comprise twenty-five (25) pages (a page of each of element 122).

The storage controller 124 may comprise a storage layer 130 and the storage media controller 126. The storage layer 130 may provide storage services to the storage clients 116 via one or more interfaces 131, 132, and/or 133. The storage controller 124 and/or storage layer 130 may comprise one or more drivers, kernel-level applications, user-level applications, or the like. The storage controller 124 and/or storage layer 130 may operate within an operating system, a virtual operating system, or the like. In some embodiments, the storage layer 130 provides a block-device I/O interface 131 through which storage clients 116 perform block-level I/O operations. Alternatively, or in addition, the storage layer 130 may provide a storage layer storage layer interface 132, which may provide other storage services to the storage clients 116. In some embodiments, the storage layer interface 132 may comprise extensions to the block device interface 131 (e.g., storage clients 116 may access the storage layer interface 132 through extensions to the block device interface 131). Alternatively, or in addition, the storage layer interface 132 may be provided as a separate API, service, and/or library. The storage layer 130 may be further configured to provide a cache interface 133 for caching data using the non-volatile storage system 102.

As described above, the storage layer 130 may present a logical address space 134 to the storage clients 116 (through the interfaces 131, 132, and/or 133). The storage layer 130 may maintain storage metadata 135 comprising "any-to-any" mappings between logical identifiers in the logical address space 134 and media storage locations on the non-volatile storage device 120. The storage system 102 may further comprise a log storage module 137, which, as described above, may be configured to store data on the storage device 120 in a contextual, log format. The contextual, log data format may comprise associating data with a logical interface (e.g., logical identifier) on the non-volatile storage media 122. The contextual, log format may further comprise associating data with respective sequence identifiers on the non-volatile storage media 122, which define an ordered sequence of storage operations performed on the non-volatile storage media 122, as described above. The storage controller 124 may further comprise a storage device interface 139 that is configured to transfer data, commands, and/or queries to the storage media controller 126 over a bus 125, as described above.

Figure 2:
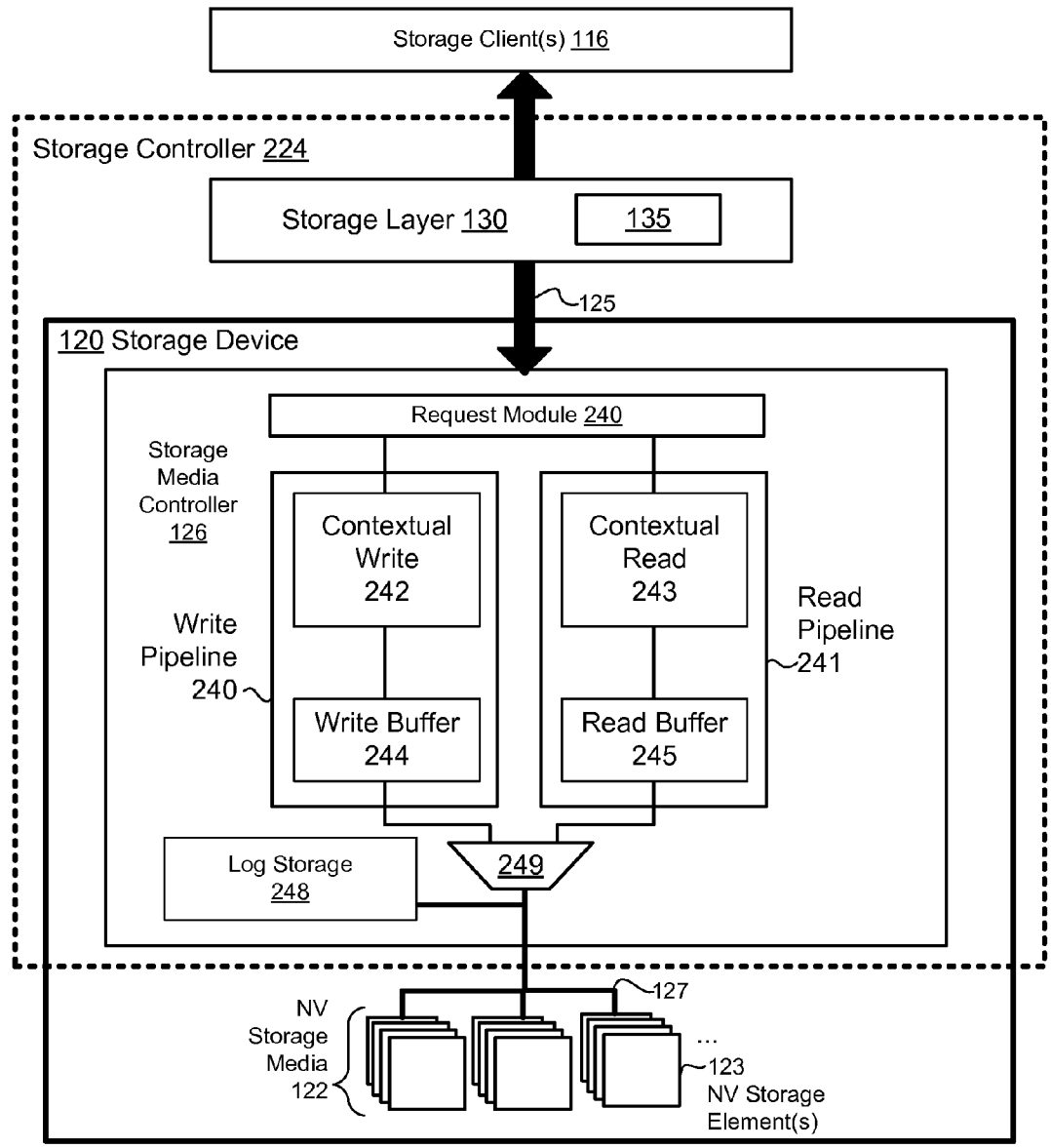
FIG. 2 is a block diagram of another embodiment of a storage system.

FIG. 2A depicts another embodiment of a storage controller 224 configured to write and/or read data in a contextual format. The non-volatile storage 220 may comprise a storage media controller 126 and non-volatile storage media 122. The non-volatile storage media 122 may comprise a plurality of non-volatile storage elements 123, which may be communicatively coupled to the storage media controller 126 via a bus 127, as described above.

The storage media controller 126 may comprise a request module 240 that is configured to receive storage requests from the storage layer 130 via a bus 125. The request module 240 may be further configured to transfer data to/from the storage layer 130 and/or storage clients 116 via the bus 125. Accordingly, the request module 240 may comprise one or more direct memory access ("DMA") modules, remote DMA modules, bus controllers, bridges, buffers, and so on.

The storage media controller 126 may comprise a write pipeline 240 that is configured to store data on the non-volatile storage media 122 in a contextual format in response to requests received via the request module 240. The requests may include and/or reference data to be stored on the non-volatile storage media 122, may include logical interface of the data (e.g., logical identifier(s) of the data), and so on. The write pipeline may comprise a contextual write module 242 and a write buffer 244. As described above, the contextual format may comprise storing a logical interface of the data (e.g., logical identifier of the data) in association with the data on the non-volatile storage media 122. For example, the contextual write module 242 may be configured to format data into packets, and may include the logical interface of the data in a packet header (or other packet field). The write buffer 244 may be configured to buffer data for storage on the non-volatile storage media 122. In some embodiments, the write buffer 244 may comprise one or more synchronization buffers to synchronize a clock domain of the storage media controller 126 with a clock domain of the non-volatile storage media 122 (and/or bus 127).

The log storage module 248 may be configured to select media storage location(s) for the data and may provide addressing and/or control information to the non-volatile storage elements 123 via the bus 127. In some embodiments, the log storage module 248 is configured to store data sequentially in a log format within the media address space of the non-volatile storage media. The log storage module 248 may be further configured to groom the non-volatile storage media, as described above.

Upon writing data to the non-volatile storage media, the storage media controller 126 may be configured to update storage metadata 135 (e.g., a forward index) to associate the logical interface of the data (e.g., the logical identifiers of the data) with the media address(es) of the data on the non-volatile storage media 122. In some embodiments, the storage metadata 135 may be maintained on the storage media controller 126; for example, the storage metadata 135 may be stored on the non-volatile storage media 122, on a volatile memory (not shown), or the like. Alternatively, or in addition, the storage metadata 135 may be maintained within the storage layer 130 (e.g., on a volatile memory 112 of the computing device 110 of FIGS. 1A and 1B). In some embodiments, the storage metadata 135 may be maintained in a volatile memory by the storage layer 130, and may be periodically stored on the non-volatile storage media 122.

The storage media controller 126 may further comprise a read pipeline 241 that is configured to read contextual data from the non-volatile storage media 122 in response to requests received via the request module 240. The requests may comprise a logical identifier of the requested data, a media address of the requested data, and so on. The contextual read module 243 may be configured to read data stored in a contextual format from the non-volatile storage media 122 and to provide the data to the storage layer 130 and/or a storage client 116. The contextual read module 243 may be configured to determine the media address of the data using a logical interface of the data and the storage metadata 135. Alternatively, or in addition, the storage layer 130 may determine the media address of the data and may include the media address in the request. The log storage module 248 may provide the media address to the non-volatile storage elements 123, and the data may stream into the read pipeline 241 via the read buffer 245. The read buffer 245 may comprise one or more read synchronization buffers for clock domain synchronization, as described above.

The storage media controller 126 may further comprise a multiplexer 249 that is configured to selectively route data and/or commands to/from the write pipeline 240 and the read pipeline 241. In some embodiments, storage media controller 126 may be configured to read data while filling the write buffer 244 and/or may interleave one or more storage operations on one or more banks of non-volatile storage elements 123 (not shown).

Figure 3A:
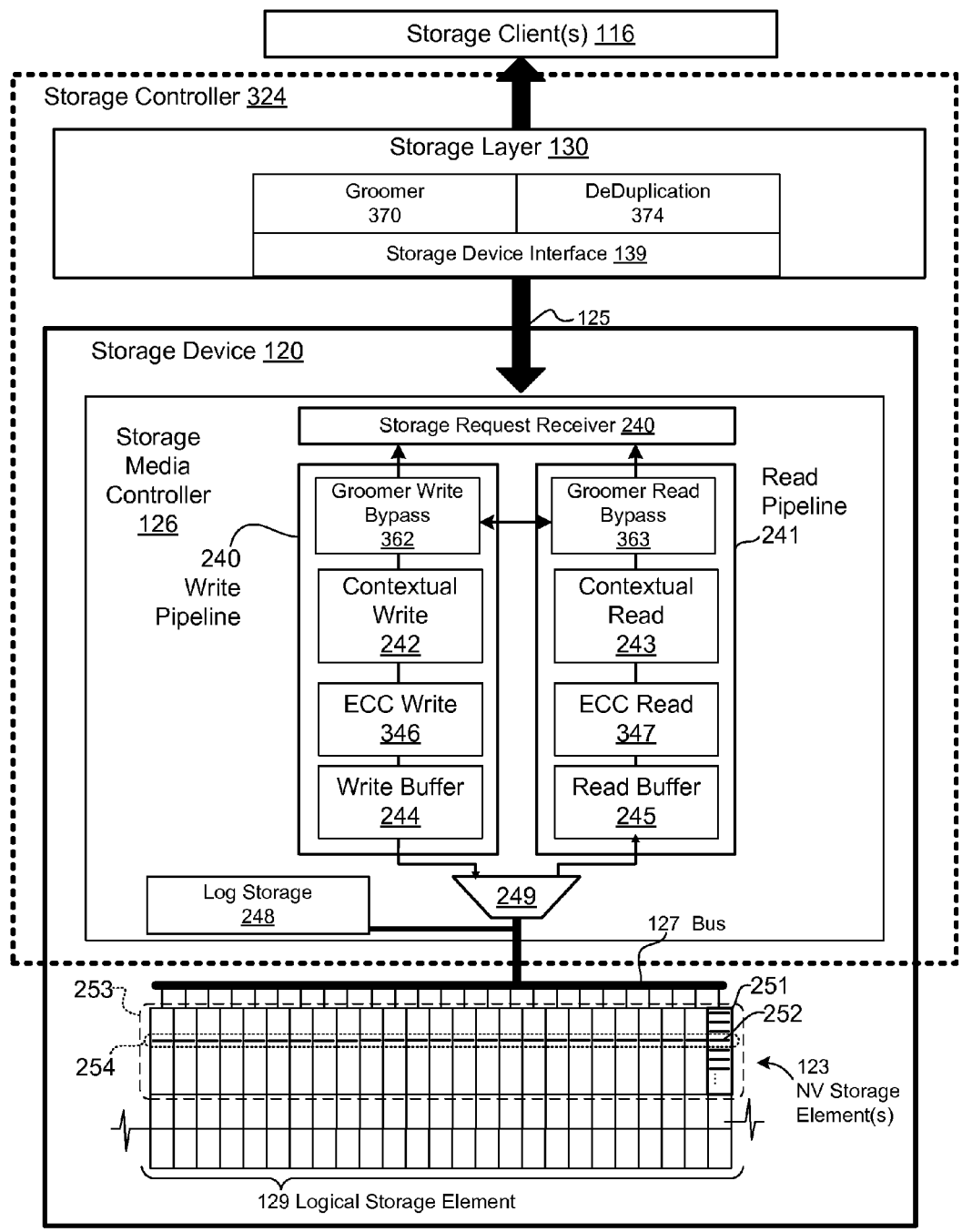
FIG. 3A is a block diagram of another embodiment of a storage system.

FIG. 3A is a block diagram depicting another embodiment of a storage controller 324. As illustrated in FIG. 3, the non-volatile storage elements 123 may be partitioned into storage divisions (e.g., erase blocks) 251, and each storage division 251 may be partitioned into a physical storage units (e.g., pages) 252. An exemplary physical storage unit 251 may be capable of storing 2048 bytes ("2 kB"). Each non-volatile storage element 123 may further comprise one or more registers for buffering data to be written to a page 251 and/or data read from a page 251. In some embodiments, the non-volatile storage elements 123 may be further arranged into a plurality of independent banks (not shown).

The storage media controller 126 may manage the non-volatile storage elements 123 as a logical storage element 129. The logical storage element 129 may be formed by coupling the non-volatile storage elements 123 in parallel using the bus 127. Accordingly, storage operations may be performed on the non-volatile storage elements 123 concurrently, and in parallel (e.g., data may be written to and/or read from the non-volatile storage elements 123 in parallel). The logical storage element 129 may comprise a plurality of logical storage divisions (e.g., logical erase blocks) 253; each comprising a respective storage division of the non-volatile storage elements 123. The logical storage divisions 254 may comprise a plurality of logical storage units (e.g., logical pages) 254; each comprising a respective physical storage unit of the non-volatile storage elements 123. The storage capacity of a logical storage unit 253 may be a multiple of the number of parallel non-volatile storage elements 123 comprising the logical storage unit 253; for example, the capacity of a logical storage element comprised of 2 kb pages on twenty-five (25) non-volatile storage elements 123 is 50 kb.

Although FIG. 3A depicts one example of a logical storage element 129, the disclosure is not limited in this regard and could be adapted to differently sized logical storage elements 129 comprising any number of non-volatile storage elements 123. The size and number of erase blocks, pages, planes, or other logical and physical divisions within the non-volatile storage elements 123 are expected to change over time with advancements in technology; it is to be expected that many embodiments consistent with new configurations are possible and are consistent with the embodiments disclosed herein.

Figure 3B:
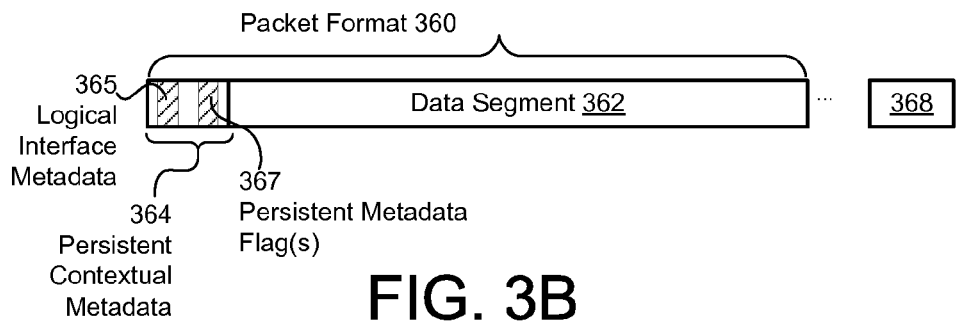
FIG. 3B depicts one example of a contextual data format.

As described above, the contextual write module 242 may be configured to store data in a contextual format. In some embodiments, the contextual format comprises a packet format. FIG. 3B depicts one example of a contextual data format (packet format 360). A packet 360 includes data (e.g., a data segment 362) that is associated with one or more logical identifiers. In some embodiments, the data segment 362 comprises compressed, encrypted, and/or whitened data. The data segment 362 may be a predetermined size (e.g., a fixed data "block" or "segment" size) or a variable size. The packet 360 may comprise persistent contextual metadata 364 that is stored on the non-volatile storage media 122 with the data segment 362. (e.g., in a header of the packet format 360 as depicted in FIG. 3B). The persistent contextual metadata 364 may include logical interface metadata 365 that defines the logical interface of the data segment 362. The logical interface metadata 365 may associate the data segment 362 with one or more logical identifiers, a logical identifier references (e.g., reference entries), a range, a size, and so on. The logical interface metadata 365 may be used to determine the context of the data independently of the storage metadata 135 and/or may be used to reconstruct the storage metadata 135 (e.g., reconstruct the "any-to-any" mappings, described above). The persistent contextual metadata 364 may comprise other metadata, which may include, but are not limited to: data attributes (e.g., an access control list), data segment delimiters, signatures, links, and/or metadata flags 367 (described below), and the like.

In some embodiments, the packet 360 may be associated with log sequence indicator 368. The log sequence indicator 368 may be persisted on the non-volatile storage media (e.g., page) with the data packet 360 and/or on the storage division (e.g., erase block) of the data packet 360. Alternatively, the sequence indicator 368 may be persisted in a separate storage division. In some embodiments, a sequence indicator 368 is applied when a storage division reclaimed (e.g., erased, when the first or last storage unit is programmed, etc.). The log sequence indicator 368 may be used to determine an order of the packet 360 in a sequence of storage operations performed on the non-volatile storage media 122, as described above.

Referring back to FIG. 3A, the contextual write module 242 may be configured to generate data packets of any suitable size. Data packets may be of a fixed size or a variable size. Due to the independence between the logical interface of data and the underlying media storage location of the data, the size of the packets generated by the contextual write module 242 may be independent of the underling structure and/or partitioning of the non-volatile storage media 122.

The write pipeline 240 may further comprise an ECC write module 346, which may be configured to encode the contextual data (e.g., data packets) into respective error-correcting code (ECC) words or chunks. The ECC encoding may be configured to detect and/or correct errors introduced through transmission and storage of data on the non-volatile storage media 122. In some embodiments, data packets stream to the ECC write module 346 as un-encoded blocks of length N ("ECC blocks"). An ECC block may comprise a single packet, multiple packets, or a portion of one or more packets. The ECC write module 346 may calculate a syndrome of length S for the ECC block, which may be appended and streamed as an ECC chunk of length N+S. The values of N and S may be selected according to testing and experience and may be based upon the characteristics of the non-volatile storage media 122 (e.g., error rate of the media 122) and/or performance, efficiency, and robustness constraints. The relative size of N and S may determine the number of bit errors that can be detected and/or corrected in an ECC chunk.

In some embodiments, there is no fixed relationship between the ECC input blocks and the packets; a packet may comprise more than one ECC block; the ECC block may comprise more than one packet; a first packet may end anywhere within the ECC block, and a second packet may begin after the end of the first packet within the same ECC block. The ECC algorithm implemented by the ECC write module 346 and/or ECC read module 347 may be dynamically modified and/or may be selected according to a preference (e.g., communicated via the bus 125), in a firmware update, a configuration setting, or the like.

The ECC read module 347 may be configured to decode ECC chunks read from the non-volatile storage medium 122. Decoding an ECC chunk may comprise detecting and/or correcting errors therein. The contextual read module 243 may be configured to depacketize data packets read from the non-volatile storage media 122. Depacketizing may comprise removing and/or validating contextual metadata of the packet, such as the logical interface metadata 365, described above. In some embodiments, the contextual read module 243 may be configured to verify that the logical interface information in the packet matches a logical identifier in the storage request.

In some embodiments, the log storage module 248 is configured to store contextual formatted data, sequentially, in a log format. As described above, log storage refers to storing data in a format that defines an ordered sequence of storage operation, which may comprise storing data at sequential media addresses within the media address space of the non-volatile storage media (e.g., sequentially within one logical storage units 254). Alternatively, or in addition, sequential storage may refer to storing data in association with a sequence indicator, such as a sequence number, timestamp, or the like, such as the sequence indicator 368, described above.

The log storage module 248 may store data sequentially at an append point. An append point may be located where data from the write buffer 244 will next be written. Once data is written at an append point, the append point moves to the end of the data. This process typically continues until a logical erase block 254 is full. The append point is then moved to next available logical erase block 254. The sequence of writing to logical erase blocks is maintained (e.g., using sequence indicators) so that if the storage metadata 135 is corrupted or lost, the log sequence of storage operations data be replayed to rebuild the storage metadata 135 (e.g., rebuild the "any-to-any" mappings of the storage metadata 135).

Figure 3C:
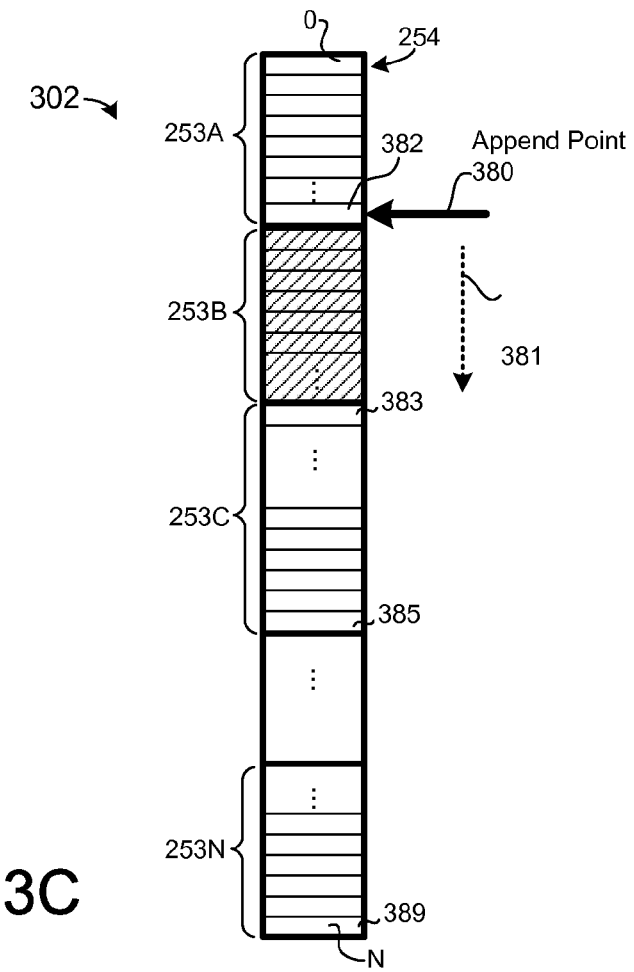
FIG. 3C is a block diagram of an exemplary log storage format.

FIG. 3C depicts one example of sequential, log-based data storage. FIG. 3C depicts a physical storage space 302 of a non-volatile storage media, such as the non-volatile storage media 122 of FIG. 3A. The physical storage space 302 is arranged into storage divisions (e.g., logical erase blocks 253A-253N), each of which can be initialized (e.g., erased) in a single operation. As described above, each logical erase block 253A-N may comprise an erase block 251 of a respective non-volatile storage element 123, and each logical erase block 253A-N may comprise a plurality of logical storage units (e.g., logical pages) 254. As described above, each logical page 254 may comprise a page of a respective non-volatile storage element 123. Storage element delimiters are omitted from FIG. 3C to avoid obscuring the details of the embodiment.

The logical storage units 254 may be assigned respective media addresses; in the FIG. 3C example, the media addresses range from zero (0) to N. The log storage module 248 may store data sequentially, at the append point 380; data may be stored sequentially within the logical page 382 and, when the logical page 382 is full, the append point 380 advances 381 to the next available logical page in the logical erase block, where the sequential storage continues. Each logical erase block 253A-N may comprise a respective sequence indicator. Accordingly, the sequential storage operations may be determined based upon the sequence indicators of the logical erase blocks 253A-N, and the sequential order of data within each logical erase block 253A-N.

As used herein, an "available" logical page refers to a logical page that has been initialized (e.g., erased) and has not yet been programmed. Some non-volatile storage media 122 can only be reliably programmed once after erasure. Accordingly, an available logical erase block may refer to a logical erase block that is in an initialized (or erased) state. The logical erase blocks 253A-N may be reclaimed by a groomer (or other process), which may comprise erasing the logical erase block 253A-N and moving valid data thereon (if any) to other storage locations. Reclaiming logical erase block 253A-N may further comprise marking the logical erase block 253A-N with a sequence indicator, as described above.

The logical erase block 253B may be unavailable for storage due to, inter alia: not being in an erased state (e.g., comprising valid data), being out-of service due to high error rates or the like, and so on. In the FIG. 3C example, after storing data on the physical storage unit 382, the append point 380 may skip the unavailable logical erase block 253B, and continue at the next available logical erase block 253C. The log storage module 248 may store data sequentially starting at logical page 383, and continuing through logical page 385, at which point the append point 380 continues at a next available logical erase block, as described above.

After storing data on the "last" storage unit (e.g., storage unit N 389 of storage division 253N), the append point 380 wraps back to the first division 253A (or the next available storage division, if storage division 253A is unavailable). Accordingly, the append point 380 may treat the media address space 302 as a loop or cycle.

Referring back to FIG. 3A, the storage controller 324 may comprise a groomer module 380 that is configured reclaim logical erase blocks, as described above. The groomer module 380 may monitor the non-volatile storage media and/or storage metadata 135 to identify logical erase blocks 253 for reclamation. The groomer module 370 may reclaim logical erase blocks in response to detecting one or more conditions, which may include, but are not limited to: a lack of available storage capacity, detecting a percentage of data marked as invalid within a particular logical erase block 253 reaching a threshold, a consolidation of valid data, an error detection rate reaching a threshold, improving data distribution, data refresh, or the like.

The groomer module 370 may operate outside of the path for servicing storage operations and/or requests. Therefore, the groomer module 370 may operate as an autonomous, background process, which may be suspended and/or deferred while other storage operations are in process. The groomer 370 may manage the non-volatile storage media 122 so that data is systematically spread throughout the logical erase blocks 253, which may improve performance, data reliability and to avoid overuse and underuse of any particular storage locations, thereby lengthening the useful life of the solid-state storage media 122 (e.g., wear-leveling, etc.). Although the groomer module 370 is depicted in the storage layer 130, the disclosure is not limited in this regard. In some embodiments, the groomer module 370 may operate on the storage media controller 126, may comprise a separate hardware component, or the like.

In some embodiments, the groomer 370 may interleave grooming operations with other storage operations and/or requests. For example, reclaiming a logical erase block 253 may comprise relocating valid data thereon to another storage location. The groomer read and groomer write bypass modules 363 and 362 may be configured to allow data packets to be read into the read pipeline 241 and then be transferred directly to the write pipeline 240 without being routed out of the storage media controller 126.

The groomer read bypass module 363 may coordinate reading data to be relocated from a reclaimed logical erase block 253. The groomer module 370 may be configured to interleave relocation data with other data being written to the non-volatile storage media 122 via the groomer write bypass 362. Accordingly, data may be relocated without leaving the storage media controller 126. In some embodiments, the groomer module 370 may be configured to fill the remainder of a logical page (or other data storage primitive) with relocation data, which may improve groomer efficiency, while minimizing the performance impact of grooming operations.

The storage controller 124 may further comprise a deduplication module 374, which may be configured to identify duplicated data on the storage device 120. The deduplication module 374 may be configured to identify duplicated data, and to modify a logical interface of the data, such that one or more logical identifiers reference the same set of data on the storage device 120 as opposed to referencing separate copies of the data. The deduplication module 374 may operate outside of the path for servicing storage operations and/or requests, as described above.

Figure 3D:
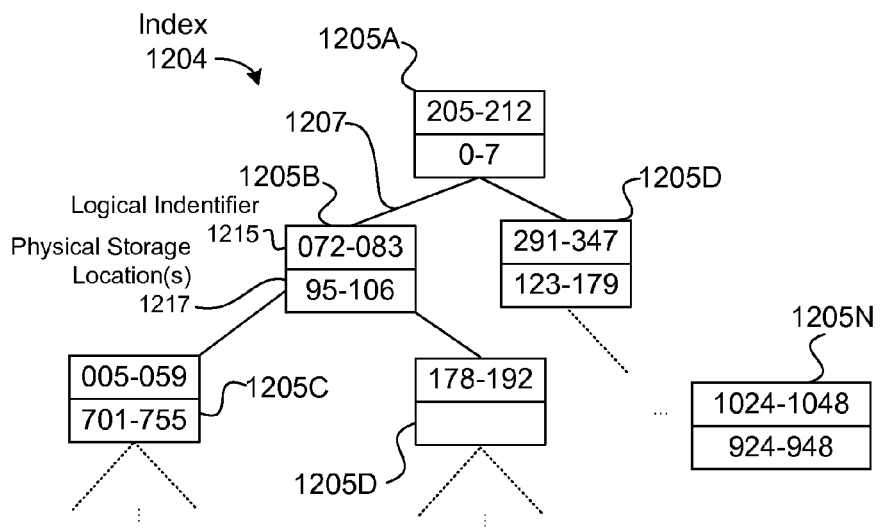
FIG. 3D depicts one embodiment of an index.

As described above, the storage controller may maintain an index corresponding to the logical address space 134. FIG. 3D depicts one example of such an index 1204. The index 1204 may comprise a one or more entries 1205A-N. Each entry 1205A may correspond to a LID (or LID range or extent) 1217 in the logical address space 134. The entries 1205A-N may represent LIDs that have been allocated by use by one or more storage clients 116. The index 1204 may comprise "any-to-any" mappings between logical identifiers and media storage locations on one or more storage devices 120. For example, the entry 1205B binds logical identifiers 072-083 to media storage locations 95-106. An entry 1205D may represent a LID that has been allocated, but has not yet been used to store data, and as such, the LIDs may not be bound to any particular media storage locations (e.g., the LIDs 178-192 are "unbound"). As described above, deferring the allocation of physical storage resources, may allow the storage controller 134 to more efficiently manage storage resources (e.g., prevent premature reservation of physical storage resources, so that the storage resources are available to other storage clients 116). One or more of the entries 1205A-N may comprise additional metadata 1219, which may include, but is not limited to: access control metadata (e.g., identify the storage client(s) authorized to access the entry), reference metadata, logical interface metadata, and so on. The index 1204 may be maintained by the storage controller 124 (and/or storage layer 130), and may be embodied as storage metadata 135 on a volatile memory 112 and/or a non-transitory machine-readable storage media 114 and/or 120.

The index 1204 may be configured to provide for fast and efficient entry lookup. The index 1204 may be implemented using one or more datastructures, including, but not limited to: a B-tree, a content addressable memory ("CAM"), a binary tree, a hash table, or other datastructure that facilitates quickly searching a sparsely populated logical address space. The datastructure may be indexed by LID, such that, given a LID, the entry 1205A-N corresponding to the LID (if any) can be identified in a computationally efficient manner.

Figure 14:
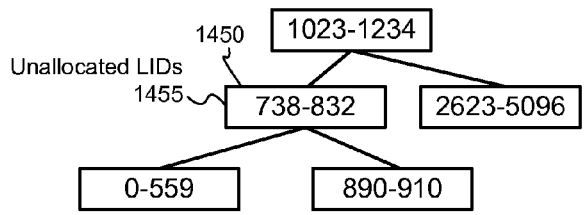
FIG. 14 depicts an example of an index for maintaining unallocated logical capacity.

In some embodiments, the index 1204 comprise one or more entries (not shown) to represent unallocated LIDs (e.g., LIDs that are available for allocation by one or more storage clients 116). The unallocated logical identifiers may be maintained in the index 1204 and/or in a separate index 1444 as depicted in FIG. 14. In some embodiments, the index 1204 may comprise one or more sub-indexes, such as a "reference index." As described below, the reference index 1222 may comprise data that is being referenced by one or more other entries 1205A-N in the index (e.g., indirect references). Although particular examples and datastructures of storage metadata 135 are described herein, the disclosure is not limited in this regard; the storage controller 124 may be configured to incorporate any type of storage metadata embodied using any suitable datastructure.

Figure 4:
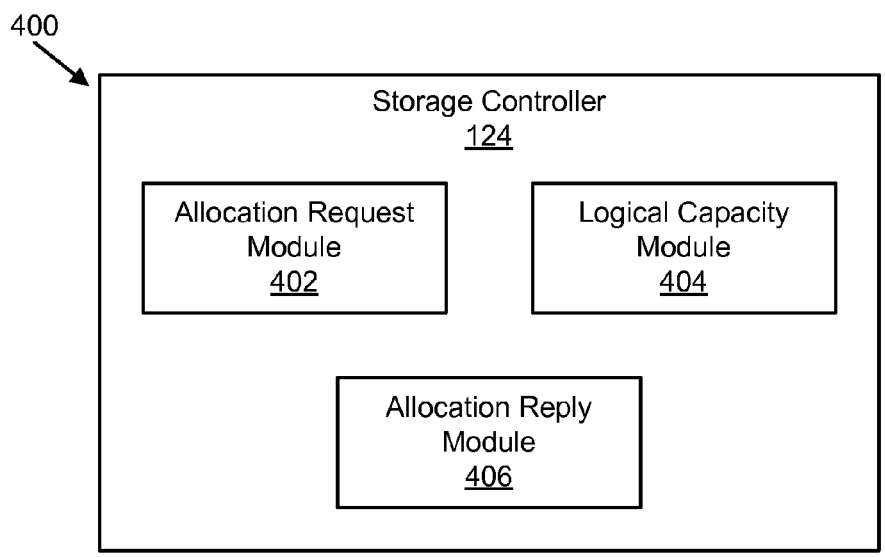
FIG. 4 is a block diagram of one embodiment of an apparatus to allocate data storage space.

FIG. 4 is a schematic block diagram illustrating an embodiment of an apparatus 400 to allocate data storage space. The apparatus 400 includes an allocation request module 402, a logical capacity module 404, and an allocation reply module 406, which are described below. The allocation request module 402, the logical capacity module 404, and the allocation reply module 406 are depicted in the storage controller 124 in general, but all or part of the allocation request module 402, the logical capacity module 404, and the allocation reply module 406 may be in a storage layer 130, storage media controller 126, or the like.

The apparatus 400 includes an allocation request module 402 that receives from a requesting device an allocation request to allocate logical capacity. The requesting device may be storage client 116, or any other device or component capable of sending an allocation request. The storage controller 124 may comprise and/or be communicatively coupled to one or more storage devices 120 (as depicted in FIGS. 1A and 1B). The logical capacity associated with the allocation request may refer to storing data on a particular storage device 120 or on any of a plurality of storage devices 120A-N.

The allocation request may include a logical allocation request or may include a request to store data. In the case of a logical allocation request, the request is typically a request for LIDs to be allocated to a client 116. In the case of a request to store data, one or more LIDs are allocated to the storage client 116, which are then bound to media storage locations. As described above, binding the LIDs may comprise associating the LIDs with media storage locations comprising the data in an index maintained in the storage metadata 135 (e.g., the index 1204). The LIDs may be bound to media storage locations at the time of allocation (e.g., the allocation request may comprise a request to store data). Alternatively, where the allocation request is separate from a request to store data, allocating LIDs to the data may be in a separate step from binding the LIDs to the media storage locations. In some embodiments, the request comes from a plurality of storage clients 116, consequently a client identifier may be associated with the request, the apparatus 400 may use the client identifier to implement an access control with respect to allocations for that storage client 116 and/or with respect to the LIDS available to allocate to the storage client 116. In addition, the client identifier may be used to manage how much physical capacity is allocated to a particular storage client 116 or set of storage clients 116.

The apparatus 400 includes a logical capacity module 404 that determines if a logical address space 134 of the data storage device includes sufficient unallocated logical capacity to satisfy the allocation request. The logical capacity module 404 may determine if the logical address space 134 has sufficient unbound and/or unallocated logical capacity using an index (or other datastructure) maintaining LID bindings and/or LID allocations. In some embodiments, the logical capacity module 404 may search a logical-to-physical map or index maintained in the storage metadata 135 and/or an unallocated index 1444 described below.

As described above, unbound LIDs may refer to LIDs that do not correspond to valid data stored on a media storage location. An unbound LID may be allocated to a client 116 or may be unallocated. In some embodiments, the logical-to-physical map is configured such that there are no other logical-to-logical mappings between the LIDs in the map and media addresses associated with the LIDs.

In some embodiments, the logical capacity module 404 searches the logical-to-physical index 1204 (or other datastructure) to identify unbound LIDs and identifies unallocated logical space therein. For example, if a logical address space 134 includes a range of logical addresses from 0000 to FFFF and logical-to-physical map indicates that the logical addresses 0000 to F000 are allocated and bound, the logical capacity module 404 may determine that logical identifiers F001 to FFFF are not allocated. If the logical identifiers F001 to FFFF are not allocated to another storage client 116, they may be available for allocation to satisfy the allocation request.

In some embodiments, the storage controller 124 may maintain a separate logical address space 134 each storage client 116. Accordingly, each storage client 116 may operate in its own, separate logical storage space 134. The storage controller 124 may, therefore, maintain separate storage metadata 135 (e.g., indexes, capacity indicators, and so on), for each storage client 116 (or group of storage clients 116). Storage clients 116 may be distinguished an identifier, which may include, but is not limited to: an address (e.g., network address), a credential, name, context, or other identifier. The identifiers may be provided in storage requests and/or may be associated with a communication channel or protocol used by the storage client 116 to access the storage controller 124.

In some embodiments, the index 1204 (or other datastructure) may comprise an allocation index or allocation entries configured to track logical capacity allocations that have not yet been bound to media storage locations. For example, a LID (or other portion of logical capacity) may be allocated to a client, but may not be associated with data stored on a storage device 120. Accordingly, although the logical capacity maybe allocated, it may be "unbound," and as such, may not be included in the logical-to-physical index. Accordingly, when determining the unallocated logical address space 134, the logical capacity module 404 may consult additional datastructures (e.g., allocation index, allocation entries, and/or an unallocated index 1444). Alternatively, the allocation entry may be included in the logical-to-physical index (e.g., entry 1205D), and may comprise an indicator showing that the entry is not bound to any particular media storage locations.

An allocation request may include a request for a certain number of LIDs. The logical capacity module 404 may determine if the available logical capacity (e.g. unbound and/or unallocated logical capacity) is sufficient to meet or exceed the requested amount of logical addresses. In another example, if the allocation request specifies a list or range of LIDs to allocate, the logical capacity module 404 can determine if the LIDs for all or a portion of the LIDs requested are unallocated or unbound.

The apparatus 400 may further comprise an allocation reply module 406 that communicates a reply to the requesting device indicating whether the request can be satisfied. For example, if the logical capacity module 404 determines that the unallocated logical space is insufficient to satisfy the allocation request, the allocation reply module 406 may include in the reply that the allocation request failed, and if the logical capacity module 404 determines that the unallocated logical space is sufficient to satisfy the allocation request (and/or the specified LIDs are unallocated), the allocation reply module 406 may include in the reply an affirmative response. An affirmative response may comprise a list of allocated LIDs, a range of LIDs, or the like.

In some embodiments, the allocation request is for a specific group of LIDs and the allocation reply module 406 may reply with the requested LIDs. In another embodiment, the allocation request is part of a write request. In one case the write request includes specific LIDs and the allocation reply module 406 may reply with the requested LIDs. In another case the write request only includes data or an indication of an amount of data and the allocation reply module 406 may reply by allocating LIDS sufficient for the write request and returning the allocated LIDS. Alternatively, if an indication of an amount of data is provided the reply may include LIDs that are unallocated. The allocation reply module 406 may reply before or after the data is written. If the allocation reply module 406 sends a reply after the data is written, the reply may be part of a confirmation of writing the data. One of skill in the art will recognize other ways that the allocation reply module 406 may reply in response to the logical capacity module 404 determining if the logical space of the data storage device has sufficient unallocated logical space to satisfy an allocation request.

The storage controller 124 may expose the logical address space 134 and/or index 1204 directly to storage clients 116 via the storage layer interface 132 (or other interface). The storage clients 116 may use the storage layer interface 132 to perform various functions including, but not limited to: identifying available logical capacity (e.g., particular LIDs or general LID ranges), determine available physical capacity, query the health of the storage media 122, identify allocated LIDs, identify LIDs that are bound to media storage locations, etc. In summary, the interface can expose all or a subset of the features and functionality of the apparatus 400 directly to clients which may leverage the storage layer interface 132 to delegate management of the logical address space 134 and/or LIDs to the storage layer 124.

Figure 5:
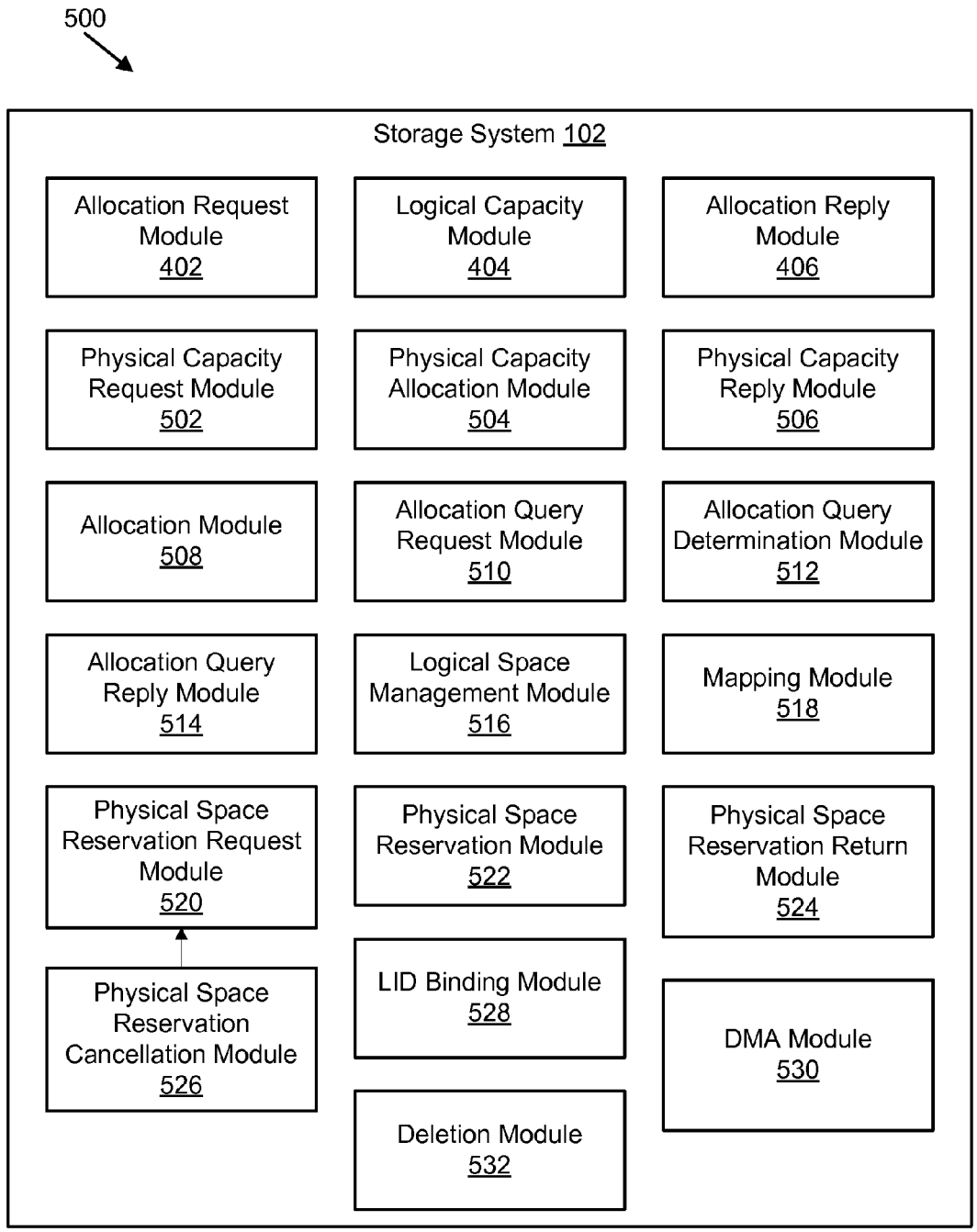
FIG. 5 is a block diagram of another embodiment of an apparatus to allocate data storage space.

FIG. 5 is a schematic block diagram illustrating another embodiment of an apparatus 500 to allocate data storage space. The apparatus 500 includes an allocation request module 402, a logical capacity module 404, and an allocation reply module 406, which are substantially similar to those described above in relation to the apparatus 400 of FIG. 4. In addition, the apparatus 500 includes a physical capacity request module 502, a physical capacity allocation module 504, a physical capacity reply module 506, an allocation module 508, an allocation query request module 510, an allocation query determination module 512, an allocation query reply module 514, a logical space management module 516, a mapping module 518, a physical space reservation request module 520, a physical space reservation module 522, a physical space reservation return module 524, a physical space reservation cancellation module 526, a LID binding module 528, a DMA module 530, and a deletion module 532, which are described below. The modules 402-406 and 502-532 of the apparatus 500 of FIG. 5 are depicted in the storage controller 124, and all or a portion may be included in the storage layer 130, a storage media controller 126, or any other appropriate location known to one of skill in the art.

The apparatus 500 includes, in one embodiment, a physical capacity request module 502, a physical capacity allocation module 504, and a physical capacity reply module 506. The physical capacity request module 502 receives from a requesting device a physical capacity request. The physical capacity request is received at the data storage device and includes a request of an amount of available physical storage capacity in the data storage device (and/or physical storage capacity allocated to the requesting device). The physical capacity request may include a quantity of physical capacity or may indirectly request physical storage capacity, for example by indicating a size of a data unit to be stored. Another indirect physical storage capacity request may include logical addresses of data to be stored which may correlate to a data size. One of skill in the art will recognize other forms of a physical capacity request.

The physical capacity allocation module 504 determines the amount of available physical storage capacity on one or more storage devices 120 and/or 120A-N. The amount of available physical storage capacity includes a physical storage capacity of unbound media storage locations. In some embodiments, amount of available physical storage capacity may be "budgeted," for example, only a portion of the physical storage capacity of a storage device 120 may be available to the requesting device. In some embodiments, amount of available physical storage capacity may be "budgeted," based on a quota associated with each storage client 116 or group of storage clients 116. The apparatus 500 may enforce these quotas. The allocation of available physical storage device may be determined by configuration parameter(s), may be dynamically adjusted according to performance and/or quality of service policies, or the like.

The physical capacity allocation module 504 may determine the amount of available physical storage capacity using an index (or other datastructure), such as the index 1204 described above. Index 1204 may identify the media storage locations that comprise valid data (e.g., entries 1205A-N that comprise bound media storage locations). The available storage capacity may be a total (or budgeted) physical capacity minus the capacity of the bound media storage locations. Alternatively, or in addition, an allocation index (or other datastructure) may maintain an indicator of the available physical storage capacity. The indicator may be updated responsive to storage operations performed on the storage device including, but not limited to: grooming operations, deallocations (e.g., TRIM), writing additional data, physical storage capacity reservations, physical storage capacity reservation cancellations, and so on. Accordingly, the module 504 may maintain a "running total" of available physical storage capacity that is available on request.

The physical capacity reply module 506 that communicates a reply to the requesting device in response to the physical capacity allocation module 504 determining the amount of available physical storage capacity on the data storage device.

The physical capacity allocation module 504, in one embodiment, tracks bound media storage locations, unbound media storage locations, reserved physical storage capacity, unreserved physical storage capacity, and the like. The physical capacity allocation module 504 may track these parameters using a logical-to-physical map, a validity map, a free media address pool, used media address pool, a physical-to-logical map, or other means known to one of skill in the art.

The reply may take many forms. In one embodiment where the physical capacity request includes a request for available physical capacity, the reply may include an amount of available physical storage capacity. In another embodiment where the physical capacity request includes a specific amount of physical capacity, the reply may include an acknowledgement that the data storage device has the requested available physical storage capacity. One of skill in the art will recognize other forms of a reply in response to a physical capacity request.

The apparatus 500 with a physical capacity request module 502, a physical capacity allocation module 504, and a physical capacity reply module 506 is advantageous for storage devices 120 where a logical-to-physical mapping is not a one-to-one mapping. In a typical random access device where read and write requests include one or more LBAs, a file server storage client 116 may track physical storage capacity of a storage device 120 by tracking the LBAs that are bound to media storage locations.

For a log storage system where multiple media storage locations can be mapped to a single logical identifier (i.e. multiple versions of data mapped to a logical identifier) or vice versa (e.g., multiple logical identifiers to a the same media storage locations) tracking logical identifiers may not provide any indication of physical storage capacity. These many-to-one relationships may be used to support snap shots, cloning (e.g., logical copies), deduplication and/or backup. Examples of systems and methods for managing many-to-one LID to media storage location logical interfaces as described below in conjunction with FIGS. 28A-35. The apparatus 500 may track available physical storage space and may communicate the amount of available physical storage space to storage clients 116, which may allow the storage clients 116 offload allocation management and physical capacity management to the storage controller 124.

In some embodiments, media storage locations are bound to corresponding LIDs. When data is stored in response to a write request, LIDs associated with the data are bound to the media storage location where the data is stored. For a log-structured file system where data is stored sequentially, the location where the data is stored is not apparent from the logical identifier, even if the logical identifier is an LBA. Instead, the data is stored at an append point and the address where the data is stored is mapped to the logical identifier. If the data is a modification of data stored previously, the LID may be mapped to the current data as well as to a location where the old data is stored. There may be several versions of the data mapped to the same LID.

The apparatus 500, in one embodiment, includes an allocation module 508 that allocates the unallocated logical space sufficient to satisfy the allocation request of the requesting device. The allocation module 508 may allocate the unallocated logical space in response to the logical capacity module 404 determining that the logical space has sufficient unallocated logical space to satisfy the allocation request.

In one embodiment, the allocation request is part of a pre-allocation where logical space is not associated with a specific request to store data. For example, a storage client 116 may request, using an allocation request, logical space and then may proceed to store data over time to the allocated logical space. The allocation module 508 allocates LIDs to the storage client 116 in response to an allocation request and to the logical capacity module 404 determining that the logical space has sufficient unallocated logical space to satisfy the allocation request.

The allocation module 508 may also allocate LIDs based on an allocation request associated with a specific storage request. For example, if a storage request includes specific LIDs and the logical capacity module 404 determines that the LIDs are available, the allocation module 508 may allocate the LIDs in conjunction with storing the data of the storage request. In another example, if the storage request does not include LIDs and the logical capacity module 404 determines that there are sufficient LIDs to for the storage request, the allocation module 508 may select and allocate LIDs for the data and the allocation reply module 406 may communicate the allocated LIDs.

The allocation module 508 may be configured to locates unallocated LIDs to satisfy an allocation request. In some embodiments, the allocation module 508 may identify unallocated LIDs by receiving a list of requested LIDs to allocate from the storage client 116 and verify that these LIDs are available for allocation. In another example, the allocation module 508 may identify unallocated LIDs by searching for unallocated LIDs that meet criteria received in conjunction with the request. The criteria may be LIDs that are associated with a particular storage device 120A-N, that are available in a RAID, that have some assigned metadata characteristic, etc.

In another example, the allocation module 508 may identify unallocated LIDs by creating a subset of LIDs that meet criteria received in conjunction with the request identified in a pool of available LIDs. In one instance, the LIDs may be a subset of LIDs that have already been allocated to the client 116. For example, if a set or group of LIDs is allocated to a particular user, group, employer, etc., a subset of the LIDs may be allocated. A specific example is if a set of LIDs is allocated to an organization and then a subset of the allocated LIDs is further allocated to a particular user in the organization. One of skill in the art will recognize other ways that the allocation module 508 can identify one or more unallocated LIDs.

The allocation module 508, in one embodiment, can expand the LIDs allocated to a storage client 116 by allocating LIDs in addition to LIDs already allocated to the storage client 116. In addition, LIDs allocated to a storage client 116 may be decreased by deallocating certain LIDs so that they return to a pool of unallocated LIDs. In other embodiments, subsets of allocated LIDs may be allocated, deallocated, increased, decreased, etc. For example, LIDs allocated to a user in an organization may be deallocated so that the LIDs allocate to the user are still allocated to the organization but not to the user.

The apparatus 500, in one embodiment, includes an allocation query request module 510, an allocation query determination module 512, an allocation query reply module 514. The allocation query request module 510 receives an allocation query the data storage device. The allocation query request module 510 receives an allocation query from some requesting device, such as a storage client 116, etc. An allocation query may include a request for information about allocating logical space or associated management of the allocated logical space. For example, an allocation query may be a request to identify allocated LIDs, identify bound LIDs, identify allocated LIDs that are not bound to media storage locations, unallocated LIDs or a range of LIDs, and the like.

The allocation query may include information about logical allocation, logical capacity, physical capacity, or other information meeting criteria in the allocation query. The information may include metadata, status, logical associations, historical usage, flags, control, etc. One of skill in the art will recognize other allocation queries and the type of information returned in response to the allocation query.

The allocation query includes some type of criteria that allows the allocation query determination module 512 to service the allocation request. The allocation query determination module 512, in one embodiment, identifies one or more LIDs that meet the criteria specified in the allocation query. The identified LIDs include allocated LIDs that are bound to media storage locations, allocated LIDs that are unbound, unallocated LIDs, and the like.

The allocation query reply module 514 communicates to the client 110 the results of the query to the requesting device or to another device as directed in the allocation query. The results of the allocation query may include a list of the identified LIDs, an acknowledgement that LIDs meeting the criteria were found, an acknowledgement that LIDs meeting the criteria in the allocation query were not found, bound/unbound status of LIDs, logical storage capacity, or the like. Typically the allocation query reply module 514 returns status information and the information returned may include any information related to managing and allocating LIDs known to those of skill in the art.

The apparatus 500, in another embodiment, includes a logical space management module 516 that manages the logical space of the data storage device from within the data storage device. For example, the logical space management module 516 may manage the logical space from a storage controller 124 or driver associated with a storage device 120 of the data storage device. The logical space management module 516 may track unbound LIDs and bound LIDs, for example, in the logical-to-physical map, in an index, or other datastructure. As described above, a bound LID refers to a LID corresponding to data; a bound LID is a LID associated with valid data stored on a media storage location of the storage device 120.

The logical space management module 516, in various embodiments, may service allocation requests and allocation queries as described above, and other functions related to allocation. The logical space management module 516 can also include receiving a deallocation request from a requesting device. The deallocation request typically includes a request to return one or more allocated LIDs to an unallocated state and then communicating to the requesting device, or other designated device, the successful deallocation. The deallocation request may include a request to return one or more storage locations which keeping the associated LIDS allocated then communicating to the requesting device, or other designated device, the successful deallocation. This might be transparent, or require that the deallocation request be extended to include an indication that a logical/physical deallocation should accompany the request. Note that deallocation request may be asynchronous and tied to the groomer. Thus, the deallocation request may is virtual (in time) until completed. The management of the allocations (logical and physical) may diverge from the actual available space at any point in time. The management module 516 is configured deal with these differences.

The logical space management module 516 may also receive a LID group command request from a requesting device and may communicate to the requesting device a reply indicating a response to the LID group command request. The LID group command request may include an action to take on, for example, two or more LIDs ("LID group"), metadata associated with the LID group, the data associated with the LID group, and the like. For example, if several users are each allocated LIDs and the users are part of a group, a LID group command may be to deallocate the LIDs for several of the users, allocate additional LIDs to each user, return usage information for each user, etc. The action taken in response to the LID group command may also include modifying the metadata, backing up the data, backing up the metadata, changing control parameters, changing access parameters, deleting data, copying the data, encrypting the data, deduplicating the data, compressing the data, decompressing the data, etc. One of skill in the art will recognize other logical space management functions that the logical space management module 516 may also perform.

The apparatus 500, in one embodiment, includes a mapping module 518 that binds, in a logical-to-physical map (e.g., the index 1204), bound LIDs to media storage locations. The logical capacity module 404 determines if the logical space has sufficient unallocated logical space using the logical-to-physical map mapped by the mapping module 518. The index 1204 may be used to track allocation of the bound LIDs, the unbound LIDs, the allocated LIDs, the unallocated LIDs, the allocated LID capacity, the unallocated LID capacity, and the like. In one embodiment, the mapping module 518 binds LIDs to corresponding media storage locations addresses in multiple indexes and/or maps.

In addition, a reverse map may be used to quickly access information related to a media address and to link to a logical identifier associated with the media address. The reverse map may be used to identify a LID from a media address. A reverse map may be used to map addresses in a data storage device 120 into erase regions, such as erase blocks, such that a portion of the reverse map spans an erase region of the storage device 120 erased together during a storage space recovery operation. Organizing a reverse map by erase regions facilitates tracking information useful during a grooming operations. For example, the reverse map may include which media addresses in an erase region have valid data and which have invalid data. When valid data is copied from an erase region and the erase region erased, the reverse map can easily be changed to indicate that the erase region does not include data and is ready for sequential storage of data.

A more detailed discussion of forward and reverse mapping is included in U.S. patent application Ser. No. 12/098, 434, titled Apparatus, System, and Method for Efficient Mapping of Virtual and Media addresses, Non-Volatile Storage, to David Flynn, et al., and filed Apr. 8, 2008, which is incorporated herein by reference. By including powerful mapping of LIDs and corresponding media addresses in the storage controller 124, the mapping efficiently consolidates functions such as thin provisioning, allocation functions, etc. that have traditionally been done at higher levels. The mapping module 518 provides an efficient way to eliminate layers of mapping used in traditional systems.

In a thinly provisioned storage system, one potential problem is that a storage client 116 may attempt to write data to a storage device only to have the write request fail because the storage device is out of available physical storage capacity. For random access devices where the file server/file system tracks available physical storage capacity relying on the one-to-one mapping of LBAs to PBAs, the likelihood of a storage device running out of storage space is very low. The storage client 116 may, however, think that the storage device is a random access if the storage device is in fact a thinly provisioned system, a log structured file system, etc. For such a situation, it is desirable to reserve physical space prior to or in conjunction with a write request so that the write request does not fail. There are other situations as well where a storage client 116 may wish to reserve physical storage space.

The apparatus 500 includes a physical space reservation request module 520, located in the storage controller 124, that receives a request from a storage client 116 to reserve available physical storage capacity on the data storage device (i.e. the storage device 120 that is part of the data storage device) [hereinafter a "physical space reservation request"]. In one embodiment, the physical space reservation request includes an indication of an amount of physical storage capacity requested by the storage client 116.

The indication of an amount of physical storage capacity requested may be expressed in terms of physical capacity. The request to reserve physical storage capacity may also include a request to allocate the reserved physical storage capacity to a logical entity. The indication of an amount of physical storage capacity may be expressed indirectly as well. For example, a storage client 116 may indicate a number of logical blocks and the data storage device may determine a particular fixed size for each logical block and then translate the number of logical blocks to a physical storage capacity. One of skill in the art will recognize other indicators of an amount of physical storage capacity in a physical space reservation request.

The physical space reservation request, in one embodiment, is associated with a write request. In one embodiment, the write request is a two-step process and the physical space reservation request and the write request are separate. In another embodiment, the physical space reservation request is part of the write request or the write request is recognized as having an implicit physical space reservation request. In another embodiment, the physical space reservation request is not associated with a specific write request, but may instead be associated with planned storage, reserving storage space for a critical operation, etc. where mere allocation of storage space is insufficient.

In certain embodiments, the data may be organized into atomic data units. For example, the atomic data unit may be a packet, a page, a logical page, a logical packet, a block, a logical block, a set of data associated with one or more logical block addresses (the logical block addresses may be contiguous or noncontiguous), a file, a document, or other grouping of related data.

In one embodiment, an atomic data unit is associated with a plurality of noncontiguous and/or out of order logical block addresses or other identifiers that the write data pipeline handles as a single atomic data unit. As used herein, writing noncontiguous and/or out of order logical blocks in a single write operation is referred to as an atomic write. In one embodiment, a hardware controller processes operations in the order received and a software driver of the client sends the operations to the hardware controller for a single atomic write together so that the write data pipeline can process the atomic write operation as normal. Because the hardware processes operations in order, this guarantees that the different logical block addresses or other identifiers for a given atomic write travel through the write data pipeline together to the nonvolatile memory. The client, in one embodiment, can back out, reprocess, or otherwise handle failed atomic writes and/or other failed or terminated operations upon recovery once power has been restored.

In one embodiment, apparatus 500 may mark blocks of an atomic write with a metadata flag indicating whether a particular block is part of an atomic write. One example metadata marking is to rely on the log write/append only protocol of the nonvolatile memory together with a metadata flag, or the like. The use of an append only log for storing data and prevention of any interleaving blocks enables the atomic write membership metadata to be a single bit. In one embodiment, the flag bit may be a 0, unless the block is a member of an atomic write, and then the bit may be a 1, or vice versa. If the block is a member of an atomic write and is the last block of the atomic write, in one embodiment, the metadata flag may be a 0 to indicate that the block is the last block of the atomic write. In another embodiment, different hardware commands may be sent to mark different headers for an atomic write, such as first block in an atomic write, middle member blocks of an atomic write, tail of an atomic write, or the like.

On recovery from a power loss or other failure of the client or of the storage device, in one embodiment, the apparatus 500 scans the log on the nonvolatile storage in a deterministic direction (for example, in one embodiment the start of the log is the tail and the end of the log is the head and data is always added at the head). In one embodiment, the power management apparatus scans from the head of the log toward the tail of the log. For atomic write recovery, in one embodiment, when scanning head to tail, if the metadata flag bit is a 0, then the block is either a single block atomic write or a non-atomic write block. In one embodiment, once the metadata flag bit changes from 0 to 1, the previous block scanned and potentially the current block scanned are members of an atomic write. The power management apparatus, in one embodiment, continues scanning the log until the metadata flag changes back to a 0, at that point in the log, the previous block scanned is the last member of the atomic write and the first block stored for the atomic write.

In one embodiment, the nonvolatile memory uses a sequential, append only write structured writing system where new writes are appended on the front of the log (i.e. at the head of the log). In a further embodiment, the storage controller reclaims deleted, stale, and/or invalid blocks of the log using a garbage collection system, a groomer, a cleaner agent, or the like. The storage controller, in a further embodiment, uses a forward map to map logical block addresses to media addresses to facilitate use of the append only write structure and garbage collection.

The apparatus 500, in one embodiment, includes a physical space reservation module 522 that determines if the data storage device (i.e. storage device 120) has an amount of available physical storage capacity to satisfy the physical storage space request. If the physical space reservation module 522 determines that the amount of available physical storage capacity is adequate to satisfy the physical space reservation request, the physical space reservation module 522 reserves an amount of available physical storage capacity on the storage device 120 to satisfy the physical storage space request. The amount of available physical storage capacity reserved to satisfy the physical storage space request is the reserved physical capacity.

The amount of reserved physical capacity may or may not be equal to the amount of storage space requested in the physical space reservation request. For example, the storage controller 124 may need to store additional information with data written to a storage device 120, such as metadata, index information, error correcting code, etc. In addition, the storage controller 124 may encrypt data, which may affect storage size. The storage controller 124 may also compress data, which may reduce the amount of physical storage capacity required to satisfy the requested amount in the physical space reservation request.

In one embodiment, the physical space reservation request includes an amount of logical space and the indication of an amount of physical storage capacity requested is derived from the requested logical space. In another embodiment, the physical space reservation request includes one or more LIDs and the indication of an amount of physical storage capacity requested is derived from an amount of data associated with the LIDs. In one example, the data associated with the LIDs is data that has been bound to the LIDs, such as in a write request. In another example, the data associated with the LIDs is a data capacity allocated to each LID, such as would be the case if a LID is an LBA and a logical block size could be used to derive the amount of requested physical storage capacity.

In another embodiment, the physical space reservation request is a request to store data. In this embodiment the physical space reservation request may be implied and the indication of an amount of physical storage capacity requested may be derived from the data and/or metadata associated with the data. In another embodiment, the physical space reservation request is associated with a request to store data. In this embodiment, the indication of an amount of physical storage capacity requested is indicated in the physical space reservation request and may be correlated to the data of the request to store data.

The physical space reservation module 522 may also then factor metadata, compression, encryption, etc. to determine an amount of required physical capacity to satisfy the physical space reservation request. The amount of physical capacity required to satisfy the physical space reservation request may be equal to, larger, or smaller than an amount indicated in the physical space reservation request.

Once the physical space reservation module 522 determines an amount of physical capacity required to satisfy the physical space reservation request, the physical space reservation module 522 determines if one or more storage devices 120A-N of the storage controller 124, either individually or combined, have enough available physical storage capacity to satisfy the physical space reservation request. The request may be for space on a particular storage device (e.g. 120A), a combination of storage devices 120A-N, such as would be the case if some of the storage devices 120A-N are in a RAID configuration, or for available space generally in the storage controller 124. The physical space reservation module 522 may tailor a determination of available capacity to specifics of the physical space reservation request.

Where the physical space reservation request is for space on more than one storage device, the physical space reservation module 522 will typically retrieve available physical storage capacity information from each logical-to-physical map of each storage device 120 or a combined logical-to-physical map of a group of storage devices 120A-N. The physical space reservation module 522 typically surveys bound media addresses. Note that the physical space reservation module 522 may not have enough information to determine available physical capacity by looking at bound LIDs, because there is typically not a one-to-one relationship between LIDs and media storage locations.

The physical space reservation module 522 reserves physical storage capacity, in one embodiment, by maintaining enough available storage capacity to satisfy the amount of requested capacity in the physical space reservation request. Typically, in a log structured file system or other sequential storage device, the physical space reservation module 522 would not reserve a specific media region or media address range in the storage device 120, but would instead reserve physical storage capacity.

For example, a storage device 120 may have 500 gigabytes ("GB") of available physical storage capacity. The storage device 120 may be receiving data and storing the data at one or more append points, thus reducing the storage capacity. Meanwhile, a garbage collection or storage space recovery operation may be running in the background that would return recovered erase blocks to storage pool, thus increasing storage space. The locations where data is stored and freed are constantly changing so the physical space reservation module 522, in one embodiment, monitors storage capacity without reserving fixed media storage locations.

The physical space reservation module 522 may reserve storage space in a number of ways. For example, the physical space reservation module 522 may halt storage of new data if the available physical storage capacity on the storage device 120 decreased to the reserved storage capacity, may send an alert if the physical storage capacity on the storage device 120 was reduced to some level above the reserved physical storage capacity, or some other action or combination of actions that would preserve an available storage capacity above the reserved physical storage capacity.

In another embodiment, the physical space reservation module 522 reserves a media region, range of media addresses, etc. on the data storage device. For example, if the physical space reservation module 522 reserved a certain quantity of erase blocks, data associated with the physical space reservation request may be stored in the reserved region or address range. The data may be stored sequentially in the reserved storage region or range. For example, it may be desirable to store certain data at a particular location. One of skill in the art will recognize reasons to reserve a particular region, address range, etc. in response to a physical space reservation request.

In one embodiment, the apparatus 500 includes a physical space reservation return module 524 that transmits to the storage client 116 an indication of availability or unavailability of the requested amount of physical storage capacity in response to the physical space reservation module 522 determining if the data storage device has an amount of available physical storage space that satisfies the physical space reservation request. For example, if the physical space reservation module 522 determines that the available storage space is adequate to satisfy the physical space reservation request, the physical space reservation return module 524 may transmit a notice that the physical space reservation module 522 has reserved the requested storage capacity or other appropriate notice.

If, on the other hand, the physical space reservation module 522 determines that the storage device 120 or storage controller 124 does not have enough available physical storage capacity to satisfy the physical space reservation request, the physical space reservation return module 524 may transmit a failure notification or other indicator that the requested physical storage space was not reserved. The indication of availability or unavailability of the requested storage space, for example, may be used prior to writing data to reduce a likelihood of failure of a write operation.

The apparatus 500, in another embodiment, includes a physical space reservation cancellation module 526 that cancels all or a portion of reserved physical storage space in response to a cancellation triggering event. The cancellation triggering event may come in many different forms. For example, the cancellation triggering event may include determining that data to be written to the storage device 120 or storage controller 124 and associated with available space reserved by the physical space reservation module 522 has been previously stored in the storage controller 124.

For example, if a deduplication process (deduplication module 374) determines that the data already exists in the storage controller 124, the data may not need to be stored again since the previously stored data could be mapped to two or more LIDs. In a more basic example, if reserved physical storage space is associated with a write request and the write request is executed, the cancellation triggering event could be completion of storing data of the write request. In this example, the physical space reservation cancellation module 526 may reduce or cancel the reserved physical storage capacity.

If the data written is less than the reserved space, the physical space reservation cancellation module 526 may merely reduce the reserved amount, or may completely cancel the reserved physical storage capacity associated with the write request. Writing to less than the reserved physical space may be due to writing a portion of a data unit where the data unit is the basis of the request, where data associated with a physical space reservation request is written incrementally, etc. In one embodiment, physical storage space is reserved by the physical storage space reservation module 522 to match a request and then due to compression or similar procedure, the storage space of the data stored is less than the associated reserved physical storage capacity.

In another embodiment, the cancellation triggering event is a timeout. For example, if a physical space reservation request is associated with a write request and the physical space reservation module 522 reserves physical storage capacity, if the data associated with the write request is not written before the expiration of a certain amount of time the physical space reservation cancellation module 526 may cancel the reservation of physical storage space. One of skill in the art will recognize other reasons to cancel all or a portion of reserved physical capacity.

The physical space reservation module 522, in one embodiment, may increase or otherwise change the amount of reserved physical storage capacity. For example, the physical space reservation request module 520 may receive another physical space reservation request, which may or may not be associated with another physical space reservation request. Where the physical space reservation request is associated with previously reserved physical storage capacity, the physical space reservation module 522 may increase the reserved physical storage capacity. Where the physical space reservation request is not associated with previously reserved physical storage capacity, the physical space reservation module 522 may separately reserve physical storage capacity and track the additional storage capacity separately. One of skill in the art will recognize other ways to request and reserve available physical storage capacity and to change or cancel reserved capacity. Standard management should include some kind of thresholds, triggers, alarms and the like for managing the physical storage capacity, providing indicators to the user that action needs to be taken. Typically, this would be done in the management system. But, either the management system would have to pool the devices under management or said devices would have to be configured/programmed to interrupt the manger when a criteria was met (preferred).

The apparatus 500, in another embodiment, includes a LID binding module 528 that, in response to a request from a storage client 116 to write data, binds one or more unbound LIDs to media storage locations comprising the data and transmits the LIDs to the storage client 116. The LID assignment module 528, in one embodiment, allows on-the-fly allocation and binding of LIDs. The request to write data, in another embodiment, may be a two step process. The LID binding module 528 may allocate LIDs in a first step for data to be written and then in a second step the data may be written along with the allocated LIDs.

In one embodiment, the LID allocation module 402 allocates LIDs in a contiguous range. The LID binding module 528 may also allocate LIDs in a consecutive range. Where a logical space is large, the LID allocation module 402 may not need to fragment allocated LIDs but may be able to choose a range of LIDs that are consecutive. In another embodiment, the LID allocation module 402 binds LIDs that may not be contiguous and may use logical spaces that are interspersed with other allocated logical spaces.

The apparatus 500, in another embodiment, includes a DMA module 530 that pulls data from a client 110 in a direct memory access ("DMA") and/or a remote DMA ("RDMA") operation. The data is first identified in a request to store data, such as a write request, and then the storage controller 124 executes a DMA and/or RDMA to pull data from the storage client 116 to a storage device 120. In another embodiment, the write request does not use a DMA or RDMA, but instead the write request includes the data. Again the media storage locations of the data are bound to the corresponding LIDs.

In one embodiment, the apparatus 500 includes a deletion module 532. In response to a request to delete data from the data storage device, in one embodiment, the deletion module 532 removes the mapping between storage space where the deleted data was stored and the corresponding LID. The deletion module 532 may also unbind the one or more media storage locations of the deleted data and also may deallocate the one or more logical addresses associated with the deleted data.

Figure 6:
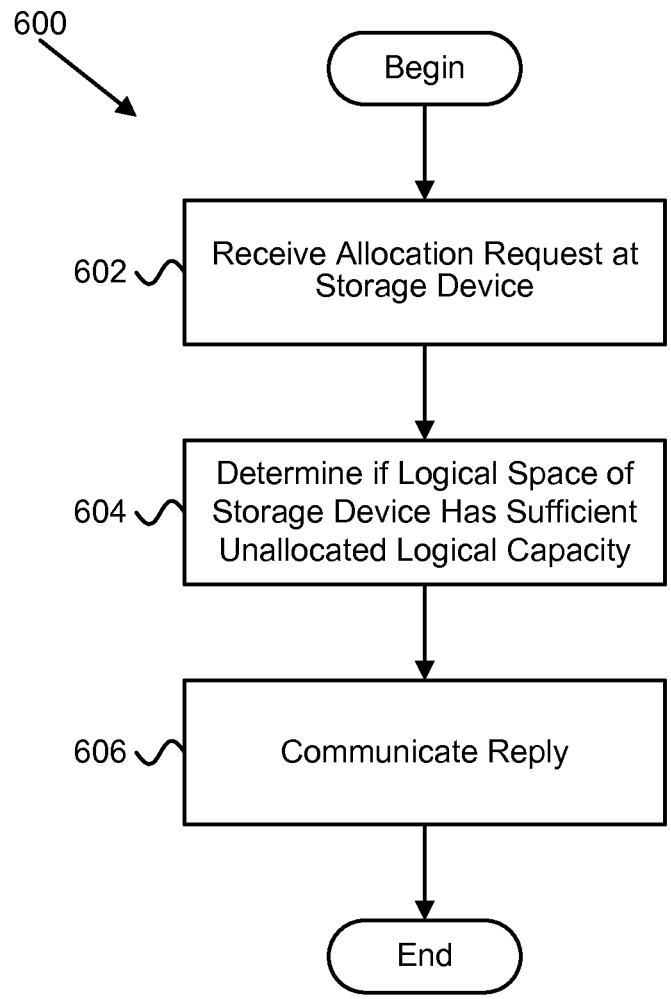
FIG. 6 is a schematic flow diagram of one embodiment of a method for allocating data storage space.

FIG. 6 is a schematic flow chart diagram illustrating one embodiment of a method 600 for allocating data storage space. The method 600 begins and the allocation request module 402 receives 602 from a requesting device (e.g., storage client 116). The allocation request is received at a storage controller 124.

The logical capacity module 404 determines 604 if a logical address space 134 includes sufficient unallocated logical capacity to satisfy the allocation request where the determination includes a search of a logical-to-physical map (e.g., index 1204, or other datastructure). The logical-to-physical map includes bindings between LIDs of the logical space and corresponding media storage locations comprising data of the bound LIDs, wherein a bound LID differs from the one or more media storage locations addresses bound to the LID. The allocation reply module 406 communicates 606 a reply to the requesting device and the method 600 ends.

Figure 7:
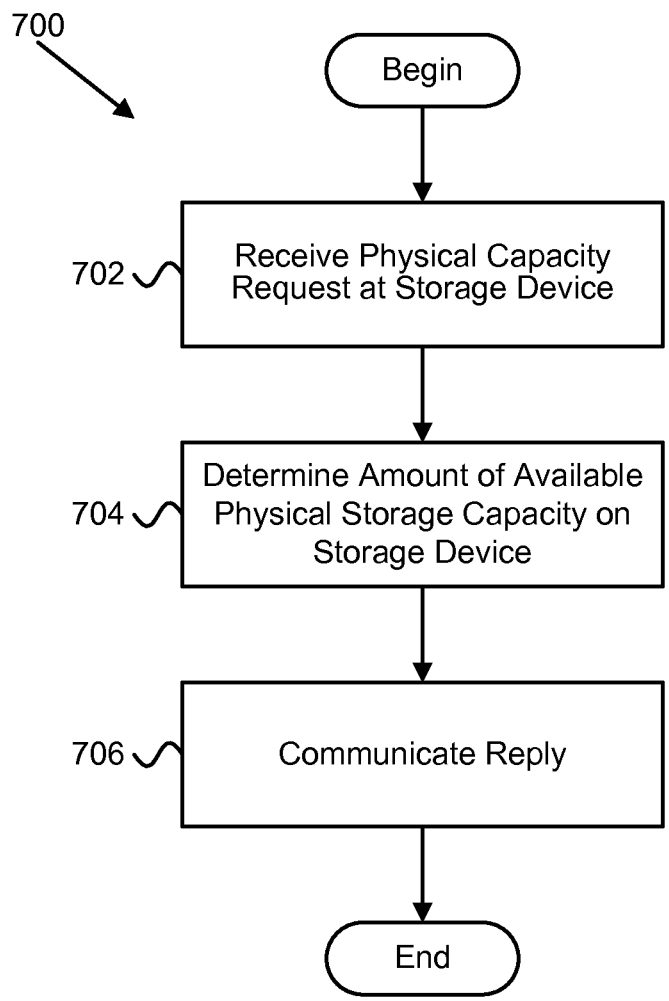
FIG. 7 is a flow diagram of one embodiment of a method for servicing a physical capacity request.

FIG. 7 is a schematic flow chart diagram illustrating one embodiment of a method 700 for allocating data storage space. The method 700 begins and the physical capacity request module 502 receives 702 from a requesting device a physical capacity request. The physical capacity request is received at the data storage device. The physical capacity request includes a request of an amount of available physical storage capacity in the data storage device. The physical capacity request, for example, may be a specific amount of physical capacity, may be derived from a request to store data, etc.

The physical capacity allocation module 504 determines 704 the amount of available physical storage capacity on the data storage device where the amount of available physical storage capacity includes a physical storage capacity of unbound storage locations in the data storage device. The physical capacity reply module 506 communicates 706 a reply to the requesting device in response to the physical capacity allocation module 504 determining the amount of available physical storage capacity on the data storage device, and the method 700 ends.

Figure 8:
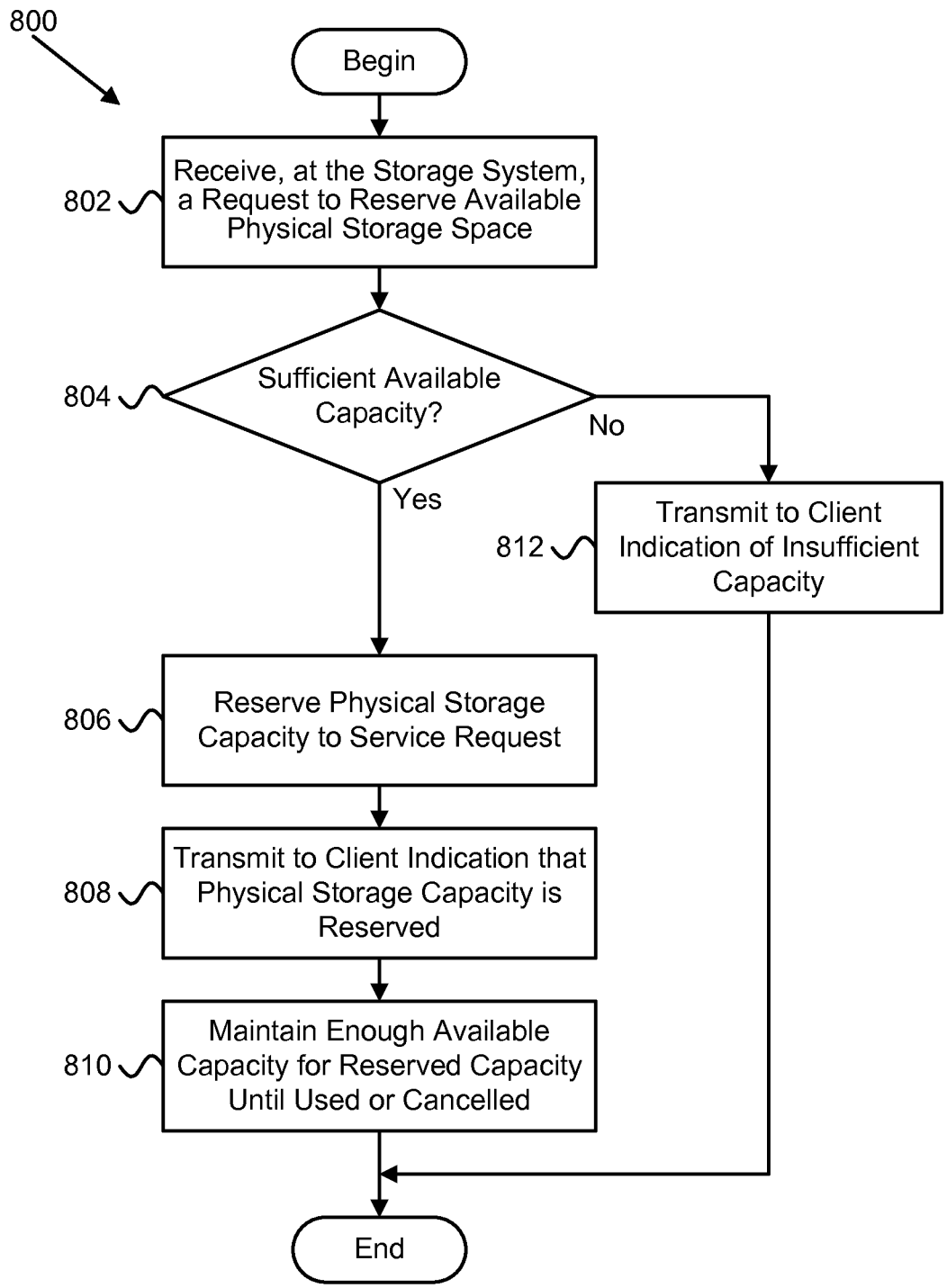
FIG. 8 is a flow diagram of one embodiment of a method for reserving physical storage space.

FIG. 8 is a schematic flow chart diagram illustrating one embodiment of a method 800 for reserving physical storage space. The method 800 begins and the physical space reservation request module 520 receives 802 a physical space reservation request to reserve available physical storage space. The physical space reservation request includes an indication of an amount of physical storage capacity requested. The indication of an amount of physical storage capacity could take many forms, such as a number of bytes or a number of logical blocks, a request to store specific data, or other indirect indication where the indication of an amount of physical storage is derived from the request.

The physical space reservation module 522 determines 804 if the data storage device has available physical storage capacity to satisfy the physical storage space request. If the physical space reservation module 522 determines 804 that the data storage device has available physical storage capacity to satisfy the physical storage space request, the physical space reservation module 522 reserves 806 physical storage capacity adequate to service the physical space reservation request and the physical space reservation return module 524 transmits 808 to the requesting storage client 116 an indication that the requested physical storage space is reserved.

The physical allocation module 404 maintains 810 enough available physical storage capacity to maintain the reservation of physical storage capacity until the reservation is used by storing data associated with the reservation or until the reservation is cancelled, and the method 800 ends. If the physical space reservation module 522 determines 804 that the data storage device does not have available physical storage capacity to satisfy the physical storage space request, the physical space reservation return module 524 transmits 812 to the requesting storage client 116 an indication that the requested physical storage space is not reserved or an indication of insufficient capacity, and the method 800 ends.

Figure 9:
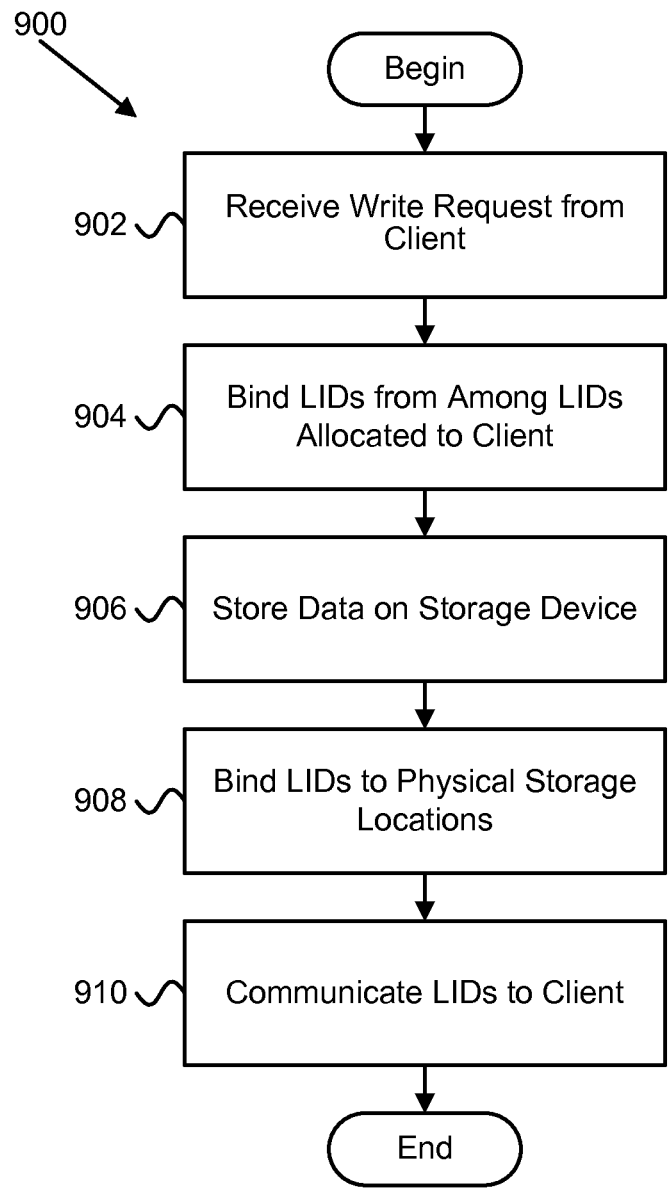
FIG. 9 is a flow chart diagram of one embodiment of a method for binding allocated logical identifiers to media storage locations.

FIG. 9 is a schematic flow chart diagram illustrating one embodiment of a method 900 for binding logical identifiers to media storage locations. The method 900 begins and the LID binding module 528 receives 901 a write request from a storage client 116. The write request is a request to write data to one or more storage devices 120 in the storage controller 124 where the data has not been associated with any logical identifiers or logical identifiers have not been allocated for the data. The request may be received by the storage controller 124 or other component that may recognize that LIDs have not been allocated for the data in the write request and the request is forwarded to the LID binding module 528.

The LID binding module 528 binds 904 one or more unbound LIDs to the data. The storage controller 124 stores the data on the storage device 120 and the mapping module 518 maps 908 one or more media storage locations addresses where the data was stored to the corresponding LIDs (e.g., binds the LIDs to the media storage locations in one or more entries 1205A-N in the index 1204). Where data is stored sequentially on the storage device 120, media storage locations where the data is stored may not be known prior to the write request but are determined after or just prior to storing the data. The LID binding module 528 communicates 910 the bound LIDs to the storage client 116, and the method 900 ends. The communication could be part of a confirmation that the data is stored successfully.

Figure 10:
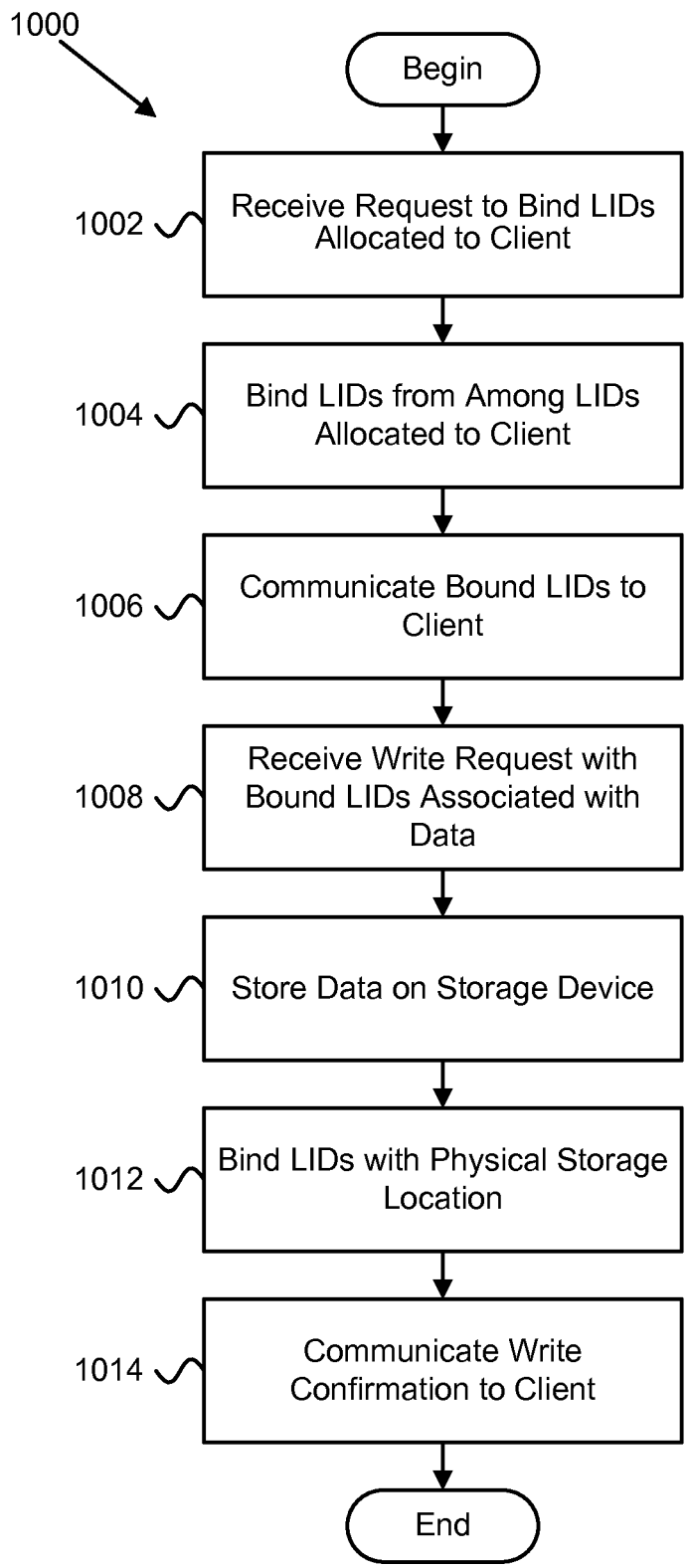
FIG. 10 is a flow diagram of another embodiment of a method for binding allocated logical identifiers to media storage locations.

FIG. 10 is a schematic flow chart diagram illustrating another embodiment of a method 1000 for binding allocated logical identifiers in data storage device 120. The method 1000 begins and the LID binding module 528 receives 1002 a request to bind LIDs to data where the LIDs are allocated to the storage client 116 making the request. The LID binding module 528 binds 1004 LIDs to media storage locations comprising the data. The LID binding module 528 communicates 1006 the bound LIDs to the storage client 116.

The storage controller 124 receives 1006 a write request to write data to a storage device 120 in the storage controller 124 where the data is already associated with bound LIDs. In other embodiments, the write request is to store the data on more than one storage device 120 in the storage system 102, such as would be the case if the storage devices 120 are RAIDed or if the data is written to a primary storage device 120 and to a mirror storage device 120. The storage controller 104 stores 1010 the data on the storage device 120 and the mapping module 518 maps 1012 one or more media storage locations where the data is stored to the bound LIDs (e.g., updates the binding between the LIDs and media storage locations in the index 1204). The storage controller 104 or other component in the storage controller 124 communicates 1014 a write confirmation to the storage client 116 and the method 1000 ends.

Figure 11:
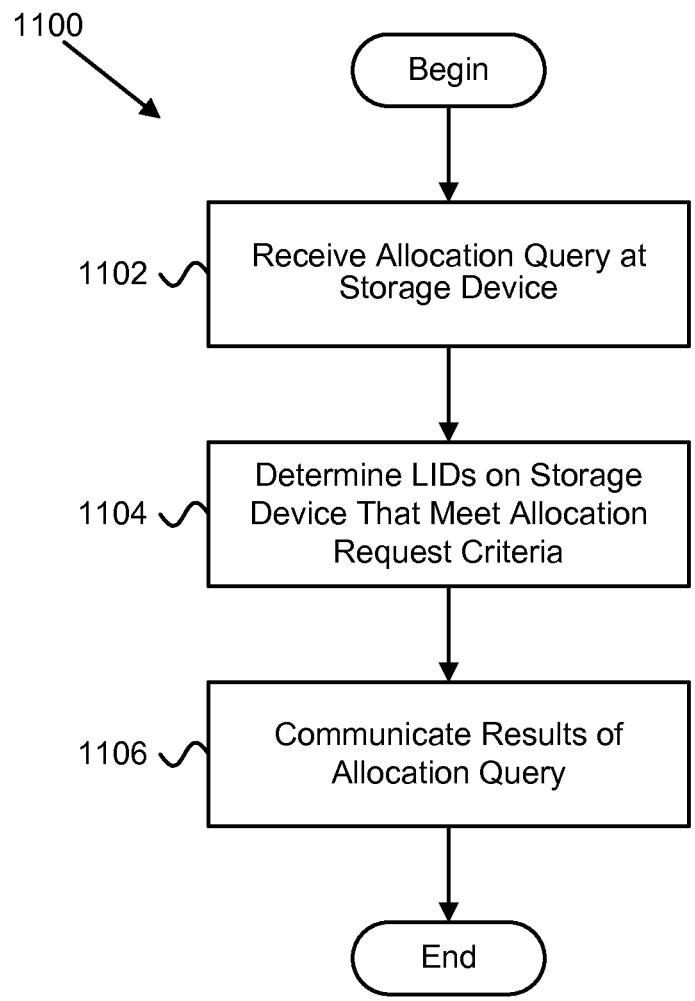
FIG. 11 is a flow diagram of one embodiment of a method for servicing an allocation query at a storage device.

FIG. 11 is a schematic flow chart diagram illustrating an embodiment of a method 1100 for servicing an allocation query at a storage device. The allocation query request module 510 receives 1102 an allocation query at the data storage device. The allocation query determination module 512 identifies 1104 one or more LIDs that meet a criteria specified in the allocation query. The identified LIDs include allocated LIDs that are bound, allocated LIDs that are unbound, and/or unallocated LIDs. The allocation query reply module 514 communicates 1106 the results of the allocation query to a requesting device or other designated device and the method 1100 ends. The results may include a list of the identified LIDs, an acknowledgement that LIDs meeting the criteria were found, an acknowledgement that LIDs meeting the criteria in the allocation query were not found, etc.

Figure 12:
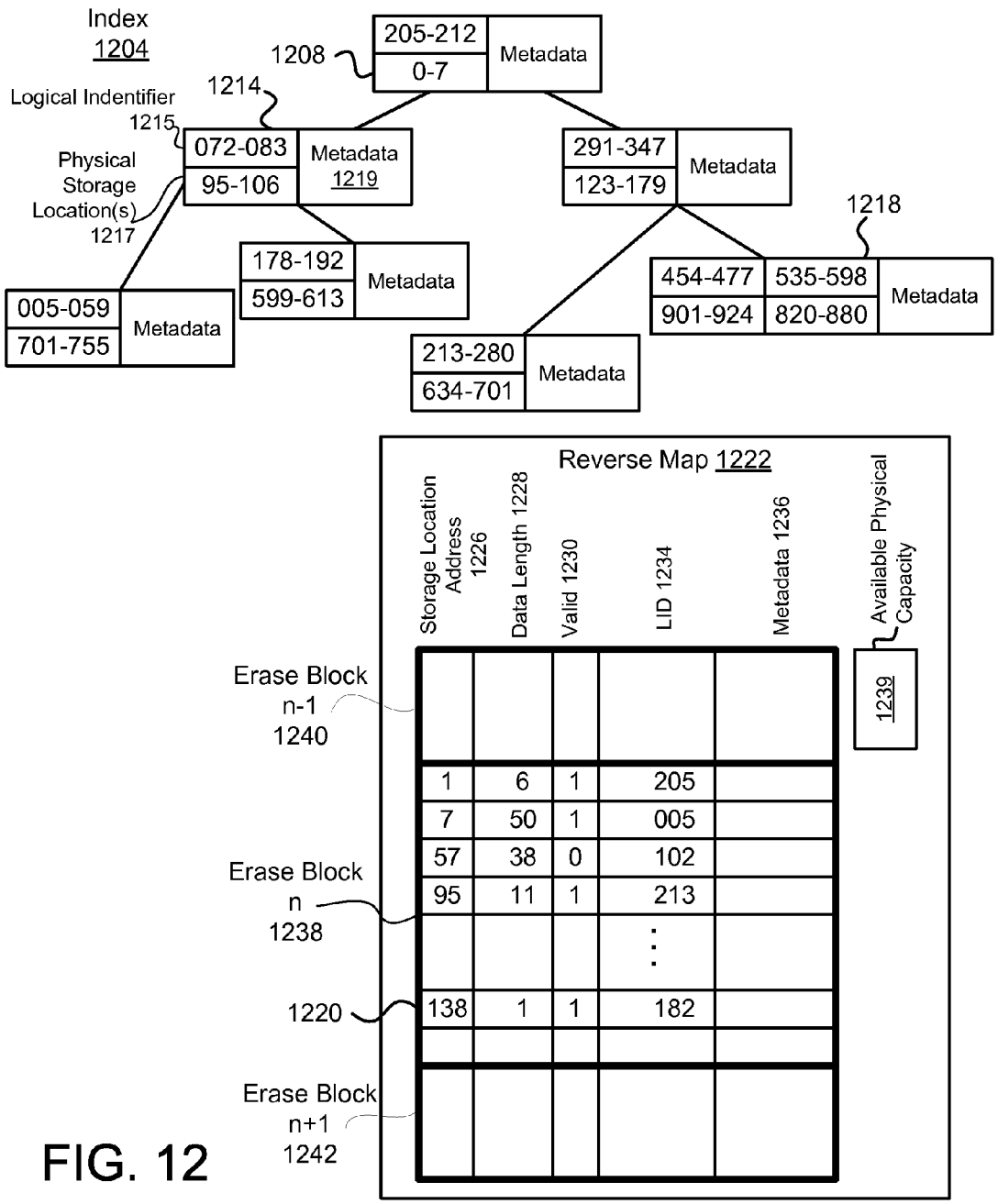
FIG. 12 is a schematic diagram of exemplary embodiments of indexes to associate logical identifiers with storage locations of a storage device.

FIG. 12 depicts another example of an index 1204 for associating LIDs with storage locations on a non-volatile storage device. The index 1204 may comprise a tree (or other datastructure) comprising a plurality of entries (e.g., entries 1208, 1214, 1218 and so on). Each entry in the index 1204 may associate a LID (or LID range, extent, or set) with one or more media storage locations, as described above. The LIDs may be contiguous (e.g. 072-083). Other entries, such as 1218, may comprise a discontiguous set of LIDs (e.g., LID 454-477 and 535-598). Accordingly, the index 1204 may be used to represent variable sized storage entries (e.g., storage entries corresponding to one or more storage locations of the—volatile storage device 120 comprising data of an arbitrary set or range of LIDs).

The storage entries may further comprise and/or reference metadata 1219, which may comprise metadata pertaining to the LIDs, such as age, size, LID attributes (e.g., client identifier, data identifier, file name, group identifier), and so on. Since the metadata 1219 is associated with the storage entries, which are indexed by LID (e.g., address 1215), the metadata 1219 may remain associated with the storage entry 1214 regardless of changes to the location of the underlying storage locations on the non-volatile storage device 120 (e.g., changes to the storage locations 1217).

The index 1204 may be used to efficiently determine whether the non-volatile storage device 120 comprises a storage entry referenced in a client request and/or to identify a storage location of data on the device 120. For example, the non-volatile storage device 120 may receive a client request 1202 to allocate a particular LID. The request 1202 may specify a particular LID, a LID and a length or offset (e.g., request 3 units of data starting from LID 074), a set of LIDs or the like. Alternatively, or in addition, the client request 1202 may comprise a set of LIDs, LID ranges (continuous or discontinuous), or the like.

The non-volatile storage device 120 may determine whether a storage entry corresponding to the requested LIDs is in the index 1204 using a search operation. If a storage entry comprising the requested LIDs is found in the index 1204, the LID(s) associated with the request 1202 may be identified as being allocated and bound. Accordingly, data corresponding to the LID(s) may be stored on the non-volatile storage device 120. If the LID(s) are not found in the index 1204, the LID(s) may be identified as unbound (but may be allocated). Since the storage entries may represent sets of LIDS and/or LID ranges, a client request may result in partial allocation. For example, a request to allocate 068-073 may successfully allocate LIDs 068 to 071, but may fail to allocate 072 and 073 since these are included in the storage entry 1214. In the event of a partial allocation, the entire allocation request may fail, the available LIDs may be allocated and other LIDs may be substituted for the failed LIDs, or the like.

In the example depicted in FIG. 12, the storage entry corresponding to the storage request 1202 is in the index 1204 (storage entry 1214), and, as such, the LIDs associated with the request 1202 are identified as allocated and bound. Therefore, if the client request 1202 is to read data at the specified LIDs; data may be read from the storage locations 1217 identified in the storage entry 1214 and returned to the originator or the request. If the client request 1202 is to allocate the identified LIDs, the allocation request may fail (and/or substitute LIDs may be allocated as described above).

When new storage entries are added to the index 1204, a merge operation may occur. In a merge operation, an existing storage entry may be "merged" with one or more other storage entries. For instance, a new storage entry for LIDs 084-088 may be merged with entry 1214. The merge may comprise modifying the LID 1215 of the storage entry to include the new addresses (e.g., 072-088) and/or to reference the storage locations 1217 to include the storage location on which the data was stored.

Although the storage entries in the index 1204 are shown as comprising references to storage locations (e.g., addresses 1217), the disclosure is not limited in this regard. In other embodiments, the storage entries comprise reference or indirect links to the storage locations. For example, the storage entries may include a storage location identifier (or reference to the reverse map 1222).

FIG. 12 depicts another example of an index comprising a reverse map 1222, which may associate storage locations of the non-volatile storage device 120 with LIDs in the logical address space 134. The reverse map 1222 may also associate a storage location with metadata, such as a validity indicator 1230, and/or other metadata 1236. In some embodiments, the storage location address 1226 and/or length 1228 may be explicitly included in the reverse map 1222. Alternatively, the storage location address 1226 and/or data length 1228 may be inferred from a location and/or arrangement of an entry in the reverse map 1222 and, as such, the address 1226 and/or data length 1228 may be omitted. In some embodiments, the reverse map 1222 may include references to LIDs 1234.

As discussed above, the reverse map 1222 may comprise metadata 1236, which may include metadata pertaining to sequential storage operations performed on the storage locations, such as sequence indicators (e.g., timestamp) to indicate a ordered sequence of storage operations performed on the storage device (e.g., as well as an "age" of the storage locations and so on). The metadata 1236 may further include metadata pertaining to the storage media, such as wear level, reliability, error rate, disturb status, and so on. The metadata 1236 may be used to identify unreliable and/or unusable storage locations, which may reduce the physical storage capacity of the non-volatile storage device 120.

The reverse map 1222 may be organized according to storage divisions (e.g., erase blocks) of the non-volatile storage device 120. In this example, the entry 1220 that corresponds to storage entry 1218 is located in erase block n 1238. Erase block n 1238 is preceded by erase block n−1 1240 and followed by erase block n+1 1242 (the contents of erase blocks n−1 and n+1 are not shown). An erase block may comprise a predetermined number of storage locations. An erase block may refer to an area in the non-volatile storage device 120 that is erased together in a storage recovery operation.

The validity indicator 1230 may be used to selectively "invalidate" data. Data marked as invalid in the reverse index 1222 may correspond to obsolete versions of data (e.g., data that has been overwritten and/or modified in a subsequent storage operation). Similarly, data that does not have a corresponding entry in the index 1204 may be marked as invalid (e.g., data that is no longer being referenced by a storage client 116). Therefore, as used herein, "invalidating" data may comprise marking the data as invalid in the storage metadata 135, which may include removing a reference to the media storage location in the index 1204 and/or marking a validity indicator 1230 of the data in the reverse map.

In some embodiments, the groomer module 370, described above, uses the validity indicators 1230 to identify storage divisions (e.g., erase blocks) for recovery. When recovering (or reclaiming) an erase block, the erase block may be erased and valid data thereon (if any) may be relocated to new storage locations on the non-volatile storage media. The groomer module 370 may identify the data to relocate using the validity indicator(s) 1230. That is invalid may not be relocated (may be deleted), whereas data that is still valid (e.g., still being referenced within the index 1204) may be relocated. After the relocation, the groomer module 370 (or other process) may update the index 1204 to reference the new media storage location(s) of the valid data. Accordingly, marking data as "invalid" in the storage metadata 135 may cause data to be removed from the non-volatile storage media 122. The removal of the data, however, may not occur immediately (when the data is marked "invalid"), but may occur in response to a grooming operation or other processes that is outside of the path for servicing storage operations and/or requests. Moreover, when relocating data the groomer module 370 may be configured to determine whether the contextual format of the data should be updated by referencing the storage metadata 135 (e.g., the reverse map 1222 and/or index 1204).

The validity metadata 1230 may be used to determine an available physical storage capacity of the non-volatile storage device 120 (e.g., a difference between physical capacity (or budgeted capacity) and the storage locations comprising valid data). The reverse map 1222 may be arranged by storage division (e.g. erase blocks) or erase region to enable efficient traversal of the physical storage space (e.g., to perform grooming operations, determine physical storage capacity, and so on). Accordingly, in some embodiments, the available physical capacity may be determined by traversing the storage locations and/or erase blocks in the reverse map 1222 to identify the available physical storage capacity (and/or is being used to store valid data).

Alternatively, or in addition, the reverse map 1222 (or other datastructure) may comprise an indicator 1239 to track the available physical capacity of the non-volatile storage device 120. The available physical capacity indicator 1239 may be initialized to the physical storage capacity (or budgeted capacity) of the non-volatile storage device 120, and may be updated as storage operations are performed. The storage operations resulting in an update to the available physical storage capacity indicator 1238 may include, but are not limited to: storing data on the storage device 120, reserving physical capacity on the storage device 120, canceling a physical capacity reservation, storing data associated with a reservation where the size of the stored data differs from the reservation, detecting unreliable and/or unusable storage locations and/or storage division (e.g., taking storage locations out of service), and so on.

In some embodiments, the metadata 1204 and/or 1222 may be configured to reflect reservations of physical storage capacity. As described above in conjunction with FIG. 8, a storage client may reserve physical storage capacity for an operation that is to take place over time. Without a reservation, the storage client may begin the operation, but other clients may exhaust the physical capacity before the operation is complete. In some embodiments, the storage client issues a request to reserve physical capacity before beginning the storage operation. The storage controller 124 updates storage metadata (e.g., the indexes 1204 and/or 1222), the indicate that the requested portion has been reserved. The reserved portion may not be associated with any particular media storage locations; rather, the reservation may indicate that the storage controller 124 is to maintain at least enough physical storage capacity to satisfy the reservation. For example, the indicator 1239 of remaining physical storage capacity may be reduced by the amount of reserved physical storage capacity. Requests subsequent to the reservation may be denied if satisfying the requests would exhaust the remaining physical storage capacity in the updated indicator 1239. In some embodiments, a reservation of physical storage capacity may be valid for a pre-determined time, until released by the storage client, until another, higher-priority request is received, or the like. The reservation may expire once the storage client that reserved the physical capacity users the reserved physical storage capacity in subsequent storage operations. If the storage operations occur over a series of storage operations (as opposed to a single operation), the reservation may be incrementally reduced accordingly.

Figure 13:
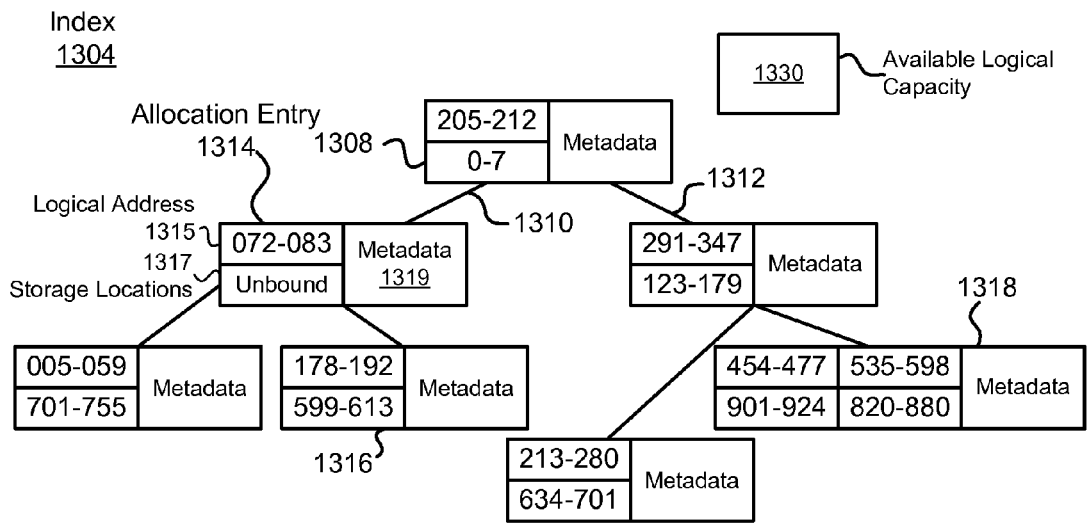
FIG. 13 is a schematic diagram of exemplary embodiments of indexes to associate logical identifiers with storage locations of a storage device.

FIG. 13 depicts another example of an index 1304 for managing storage allocation of a non-volatile storage device. In the FIG. 13 example, the index 1304 may be modified to include one or more allocation entries (e.g., allocated entry 1314). An allocation entry may be used to track LIDs that are allocated to a client, but are not yet bound (e.g., are not associated with data stored on the non-volatile storage device 120). Therefore, unlike the storage entries (e.g., entries 1308, 1316, and 1318), an allocation entry 1314 may not include references to storage locations 1317; these references may be set to "unbound," NULL, or may be omitted. Similarly, metadata 1319 associated with the allocation entry 1314 may indicate that the entry is not bound and/or associated with data.

The index 1304 may be used to determine an available logical capacity of the logical address space 134 (e.g., by traversing the index 1304). The available logical capacity may consider LIDs that are bound (using the storage entries), as well as LIDs that are allocated, but not yet bound (using the allocation entries, such as 1314).

As shown in FIG. 13, in some embodiments, the allocation entries 1314 may be maintained in the index 1304 with the storage entries. Alternatively, allocation entries may be maintained in a separate index (or other datastructure). When an allocation entry becomes associated with data on the non-volatile storage device 120 (e.g., as associated with storage locations), the allocation entry may be modified and/or replaced by a storage entry.

In some embodiments, the index 1304 (or index 1204) may comprise an indicator 1330 to track the available logical capacity of the logical address space 134. The available logical capacity may be initialized according to the logical address space 134 presented by the storage device 120. Changes to the index 1304 may cause the available logical capacity indicator 1330 to be updated. The changes may include, but are not limited to: addition of new allocation entries, removal of allocation entries, addition of storage entries, removal of allocation entries, or the like.

FIG. 14 depicts an example of an unallocated index 1444, which may be used to allocate storage in a non-volatile storage device. The index 1444 may comprise entries 1450, which may correspond to "holes" in the LIDs indexes 1204 and/or 1304 described above. Accordingly an entry 1450 in the available index 1444 may correspond to a LID (and/or LID range, set, or the like) that is available (e.g., is not allocated nor bound). The index 1444 may be used to quickly determine the logical storage capacity of a logical storage space and/or to identify LIDs to allocate in response to client requests. In the FIG. 14 example, the entries in the index 1444 are shown as being indexed by LID. In some embodiments, however, the index 1444 may indexed in other (or additional) ways. For example, the unallocated index 1444 may be indexed by LID range (e.g., by the size of the LID range) as well as LID. This indexing may be used to identify unallocated LIDs sized according to client requests (e.g., to efficiently fill "holes" in the logical address space 134).

Figure 15:
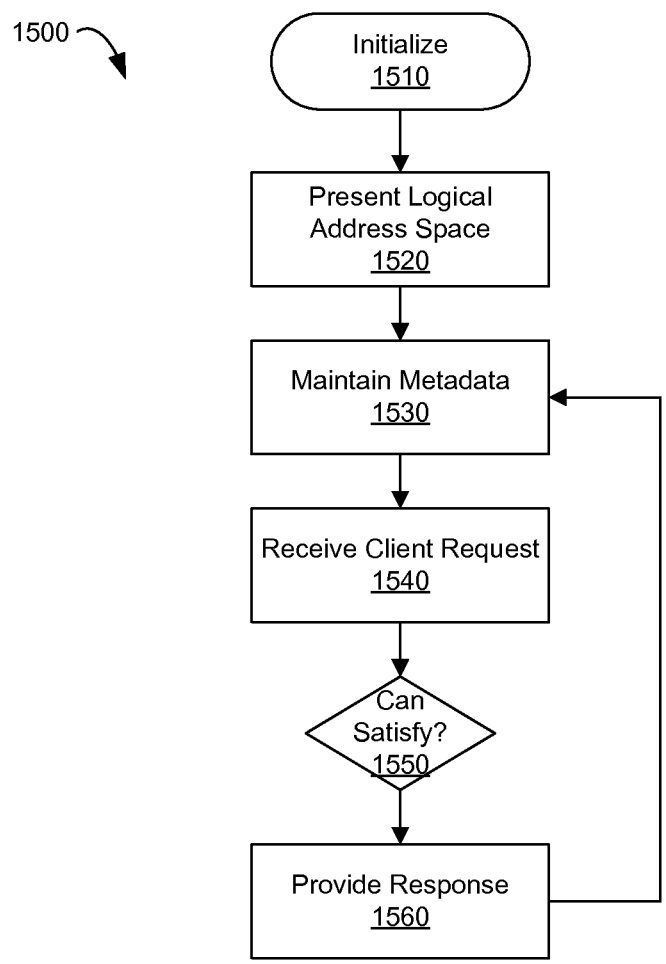
FIG. 15 is a flow diagram of one embodiment of a method for allocating a storage device.

FIG. 15 is a flow diagram of one embodiment of a method 1500 for allocating storage. As described above, steps of the method 1500 may be tied to particular machine components and/or may be implemented using machine-readable instructions stored on a non-transitory machine-readable storage medium.

At step 1510 a non-volatile storage device may be initialized for use. The initialization may comprise allocating resources for the non-volatile storage device (e.g., solid-state storage device 120), such as communications interfaces (e.g., bus, network, and so on), allocating volatile memory, accessing solid-state storage media, and so on. The initialization may further comprise presenting a logical address space 134 to storage clients 116, initializing one or more indexes (e.g., the indexes described above in conjunction with FIGS. 12-14), and so on.

At step 1520, the non-volatile storage device may present a logical space to one or more clients. Step 1520 may comprise implementing and/or providing an interface (e.g., API) accessible to one or more clients, or the like.

At step 1530, the non-volatile storage device may maintain metadata pertaining to logical allocation operations performed by the method 1500. The logical allocation operations may pertain to operations in the logical address space 134 presented at step 1520, and may include, but are not limited to: allocating logical capacity, binding logical capacity to media storage locations, and so on. The metadata may include, but is not limited to: indexes associating LIDs in the logical address space 134 with media storage locations on the non-volatile storage device; indexes associating storage locations with LIDs (e.g., index 1204 of FIG. 12), allocation entries indicating allocated LIDs having no associated storage location (e.g., index 1304 of FIG. 13), an unallocated index (e.g. index 1444 of FIG. 14), maintaining an indicator of unallocated logical capacity (e.g., indicator 1330 of FIG. 13), and so on.

At step 1540, a client request pertaining to a LID in the logical address space 134 may be received. The client request may comprise a query to determine if a particular LID and/or logical capacity can be allocated, a request to allocate a LID and/or logical capacity, a request to store data on the non-volatile storage device, or the like.

At step 1550, the metadata maintained at step 1530 may be referenced to determine whether the client request can be satisfied. Step 1550 may comprise referencing the metadata (e.g., indexes and/or indicators) maintained at step 1530 to determine an available logical capacity of the logical address space 134 and/or to identify available LIDs (or LID range) as described above.

At step 1560, the method 1500 may provide a response to the client request, which if the request cannot be satisfied may comprise providing a response to indicate such. If the client request can be satisfied, the providing the response may comprise one or more of: an indicator that the allocation can be satisfied, allocating LIDs satisfying the request, providing allocated LIDs satisfying the request, providing one or more requested LIDs and/or one or more additional LIDs, (e.g., if a portion of a requested set of LIDs can be allocated), or the like.

Following step 1560, the flow may return to step 1530, where the method 1500 may update the metadata (e.g., indexes, indicators, and so on) according to the allocation operation (if any) performed at step 1560.

Figure 16:
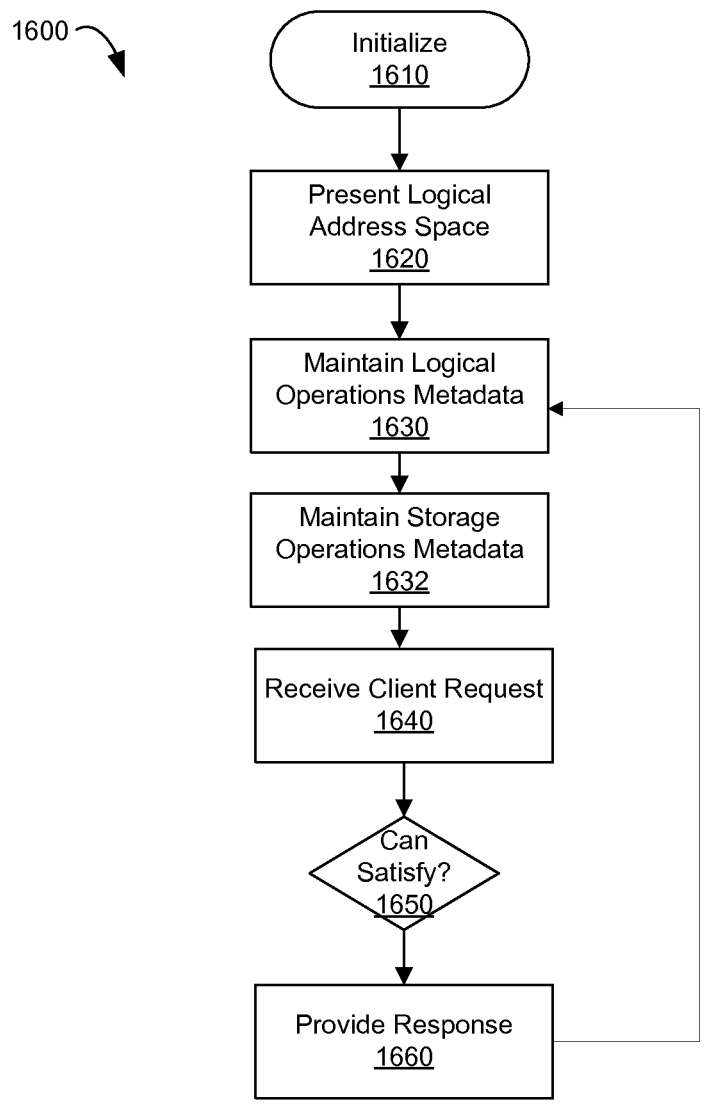
FIG. 16 is a flow diagram of one embodiment of a method for allocating a storage device.

FIG. 16 is a flow diagram depicting an embodiment of a method 1600 for allocating storage. As described above, steps of the method 1600 may be tied to particular machine components and/or may be implemented using machine-readable instructions stored on a non-transitory machine-readable storage medium.

At steps 1610, 1620, and 1630, the method 1600 may be initialized, present a logical storage space to one or more clients, and/or maintain metadata pertaining to logical operations performed by the method 1600.

At step 1632, the method 1602 may maintain metadata pertaining to physical storage operations performed by the method 1600. The storage operations may include, but are not limited to: reserving physical storage capacity, canceling physical storage capacity reservations, storing data on the non-volatile storage device, deallocating physical storage capacity, grooming operations (e.g., garbage collection, error handling, and so on), physical storage space budgeting, and so on. As discussed above, metadata maintained at step 1632 may include, but is not limited to: indexes associating LIDs in the logical address space 134 with storage locations on the non-volatile storage device; indexes associating storage locations with LIDs (e.g., index 1204 of FIG. 12), allocation entries indicating allocated LIDs having no associated storage location (e.g., index 1304 of FIG. 13), an unallocated index (e.g. index 1444 of FIG. 14), maintaining an indicator of unallocated logical address space 134 (e.g., indicator 1330 of FIG. 13), and so on.

At step 1642, a client request pertaining to physical storage capacity of the non-volatile storage device may be received. The client request may comprise a query to determine of a physical storage capacity is available, a request to reserve physical storage capacity, a request to store data, a request to deallocate data (e.g., TRIM), or the like.

At step 1650, the metadata maintained at steps 1630 and/or 1632 may be referenced to determine whether the client request can be satisfied. Step 1650 may comprise referencing the metadata at steps 1630 and/or 1632 to determine an available physical storage capacity of the non-volatile storage device and/or to identify storage locations associated with particular LIDs (e.g., in a deallocation request or TRIM) as described above.

At step 1660, the method 1600 may provide a response to the client request, which if the request cannot be satisfied may comprise providing a response to indicate such. If the client request can be satisfied, the providing the response may comprise one or more of: indicating that the client request can and/or was satisfied, reserving physical storage capacity for the client; cancelling a physical storage capacity reservation, storing data on the non-volatile storage device, deallocating physical storage capacity, or the like.

Referring back to FIGS. 1A and 1B, the storage controller 124 and/or storage layer 130 may simplify data storage operations for storage clients 116. As described above, the storage controller 124 may be configured to maintain allocations of the logical address space 134 and/or bindings between LIDs and media storage locations using, inter alia, the storage metadata 135. The storage controller 124 may be further configured to store data in contextual format, which describes the context (e.g., logical interface) of the data independent of the storage metadata 135. Moreover, the storage controller 124 may store data in a sequential, log, such that a sequence of storage operations performed on the non-volatile storage device 120 can be replayed and/or the storage metadata 135 may be reconstructed based upon the contents of the non-volatile storage media 122. In some embodiments, the storage controller 124 may maintain a large, thinly provisioned logical address space 134, which may simplify LID management for the storage clients (e.g., allow the storage clients 116 to operate within large, contiguous LID ranges, with low probability of LID collisions). The storage controller 124 may be further configured to deter the reservation of media storage locations until needed, to prevent premature exhaustion or over-reservation of physical storage resources.

The storage controller 124 may expose access to the logical address space 134 and/or storage metadata 135 to the storage clients 116 through the storage layer interface 132 (or other interface). The storage clients 116 may leverage the storage layer interface 132 to delegate certain functions to the storage controller 124. Storage clients 116 may leverage the storage layer interface 132 to perform various operations, including, but not limited to: logical address space 134 management, media storage location management (e.g., mappings between logical identifiers and media storage locations, such as thin provisioning), deferred physical resource reservation, crash recovery, logging, backup (e.g., snap shots), crash recovery, data integrity, transactions, data move operations, cloning, deduplication, and so on.

In some embodiments, storage clients 116 may leverage the contextual, log format to delegate crash recovery and/or data integrity functionality to the storage controller 124 (through the storage layer 130 and/or storage layer interface 132). For example, after an invalid shutdown and reconstruction operation, the storage controller 124 may expose the reconstructed storage metadata 135 to storage clients 116 via the storage layer interface 132 (or other interface). The storage clients 116 may, therefore, delegate crash-recovery and/or data integrity to the storage controller 124. For instance, a file system storage client 116 may require crash-recovery and/or data integrity services for some of its metadata, such as I-node tables, file allocation tables, and so on. The storage client 116 may have to implement these services itself, which may impose significant overhead and/or complexity on the storage client 116. The storage client 116 may be relieved from this overhead by delegating crash recovery and/or data integrity to the storage controller 124, as described above.

In some embodiments, storage clients may also delegate allocations in the logical address space 134 and/or physical storage reservations to the storage layer 130. For example, a storage client 116, such as a file system, may maintain its own metadata to track logical and physical allocations for files; the storage client 116 may maintain a set of logical addresses that "mirrors" the media storage locations of the non-volatile storage device 120. If the underlying storage device 120 provides a one-to-one mapping between logical block address and media storage locations, as with conventional storage devices, the block storage layer performs appropriate LBA-to-media address translations and implements the requested storage operations. If, however, the underlying non-volatile storage device does not support one-to-one mappings (e.g., the underlying storage device is a sequential, or write-out-of-place device, such as a solid-state storage device), another redundant set of translations are needed (e.g., a Flash Translation Layer, or other mapping). The redundant set of translations and the requirement that the storage client 116 maintain logical address allocations may represent a significant overhead, and may make allocating contiguous LBA ranges difficult or impossible without time-consuming "defragmentation" operations. The storage client 116 delegate allocation functionality to the storage controller 124 via the storage layer interface 132. The storage client 116 may access the storage layer interface 132 to request logical ranges in the logical address space 134. The storage controller 124 manages the allocation logical capacity and/or physical storage resources, as described above. The storage controller 124 may leverage a thinly provisioned logical address space 134 to enable large, contiguous LID ranges for the storage client 116, without the need for redundant translations address layers. Moreover, the storage client may identify unallocated LIDs through the storage layer interface 132, which frees the storage client 116 from this overhead.

Figure 17:
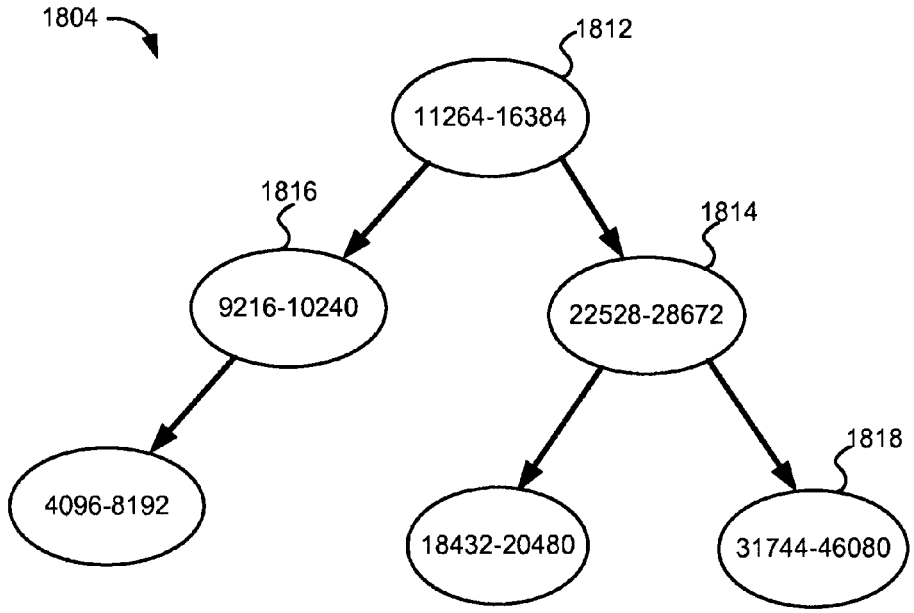
FIG. 17 is a schematic diagram of exemplary embodiments of storage metadata.

FIG. 17 depicts one exemplary embodiment of an index 1804 for maintaining allocations within a logical address space, such as the logical address space 134, described above. The index 1804 may be embodied as a datastructure on a volatile memory 112 and/or non-transitory, machine-readable storage media 114 (e.g., part of the storage metadata 135). The index 1804 may comprise an entry for each allocated range of LIDs. The allocated LIDs may or may not be associated with media storage locations on the non-volatile storage device (e.g., non-volatile storage device 120). The entries may be indexed and/or linked by LID. As discussed above, in some embodiments, the storage metadata (e.g., metadata 135) may comprise a separate index to track unallocated LIDs in the logical address space 134.

The entries in the index 1804 may include LIDs that are allocated, but that are not associated with media storage locations on a non-volatile storage device. Like the index 1204 described above, inclusion in the index 1804 may indicate that a LID is both allocated and associated with valid data on the non-volatile storage device 120. Alternatively, the index 1804 may be implemented similarly to the index 1304 of FIG. 13. In this case, the index 1804 may comprise entries that are associated with valid data on the non-volatile storage device 120 along with entries that are allocated but are not associated with stored data. The entries that are associated with valid data may identify the media storage location of the data, as described above. Entries that are not associated with valid, stored data (e.g., "allocation entries" such as the entry 1314 of FIG. 13) may have a "NULL" media storage location indicator or some other suitable indicator.

In some embodiments, the index 1804 may comprise security-related metadata, such as access control metadata, or the like. The security related metadata may be associated with each respective entry (e.g., entry 1812) in the index 1804. When storage requests pertaining to a particular LID are received by the storage layer 130, the storage layer 130 may access and/or enforce the security-related metadata (if any) in the corresponding entry. In some embodiments, the storage layer 130 delegates enforcement of security-related policy enforcement to another device or service, such as an operating system, access control system, or the like. Accordingly, when implementing storage operations, the storage layer 130 may access security-related metadata and verify that the requester is authorized to perform the operating using a delegate. If the delegate indicates that the requester is authorized, the storage layer 130 implements the requested storage operations; if not, the storage layer 130 returns a failure condition.

The storage layer 130 may access the storage metadata 135, such as the index 1804, to allocate LIDs in the logical address space 134, to determine a remaining logical capacity of the logical address space 134, to determine the remaining physical storage capacity of the non-volatile storage device(s) 120, and so on. The storage layer 130 may respond to queries for the remaining logical capacity, remaining physical storage capacity, and the like via the storage layer interface 132. Similarly, the storage layer 130 may service requests to reserve physical storage capacity on the non-volatile storage device 120. As described above, a storage client 116 may wish to perform a sequence of storage operations that occur over time (e.g., receive a data stream, perform a DMA transfer, or the like). The storage client 116 may reserve sufficient logical and/or physical storage capacity to perform the sequence of storage operations up-front to ensure that the operations can be completed. Reserving logical capacity may comprise allocating LIDs through the storage layer 130 (using the storage layer interface 132). Physical capacity may be similarly allocated. The storage client 116 may request to reserve physical capacity through the storage layer interface 132. If a sufficient amount of physical capacity is available, the storage layer 130 acknowledges the request and updates the storage metadata accordingly (and as described above in conjunction with FIGS. 8 and 12).

The storage layer 130 and/or storage metadata 135 is not limited to the particular, exemplary datastructures described above. The storage metadata 135 may comprise any suitable datastructure (or datastructure combination) for efficiently tracking logical address space 134 allocations and/or associations between LIDs and media storage locations. For example, the index 1804 may be adapted such that entries in the index 1804 comprise and/or are linked to respective physical binding metadata. The physical binding metadata may comprise a "sub-index" of associations between LIDs in a particular allocated range and corresponding media storage locations on the non-volatile storage medium. Each "sub-range" within the allocated LID comprises an entry associating the sub-range with a corresponding media storage location (if any).

Figure 18:
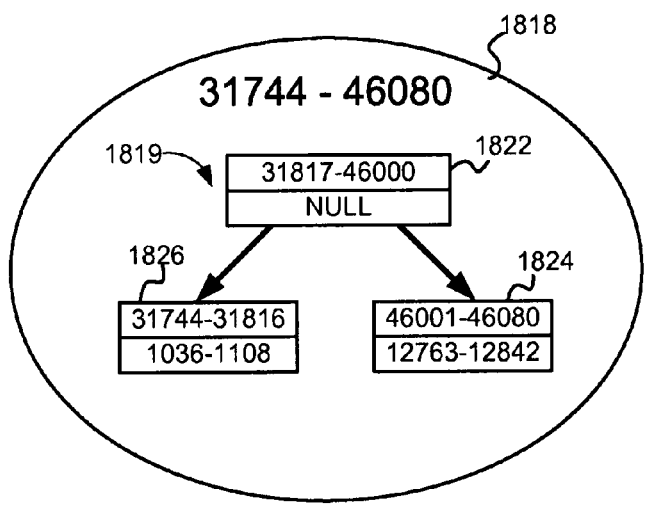
FIG. 18 is a schematic diagram of exemplary embodiments of physical reservation metadata.
Figure 18A:
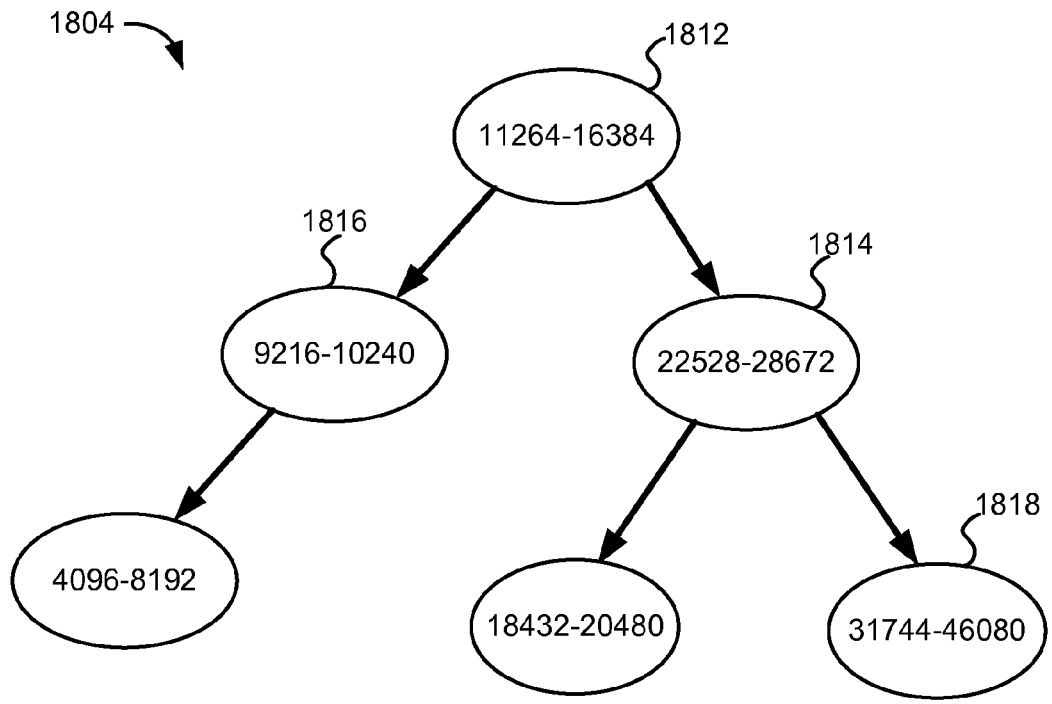
Figure 18B:
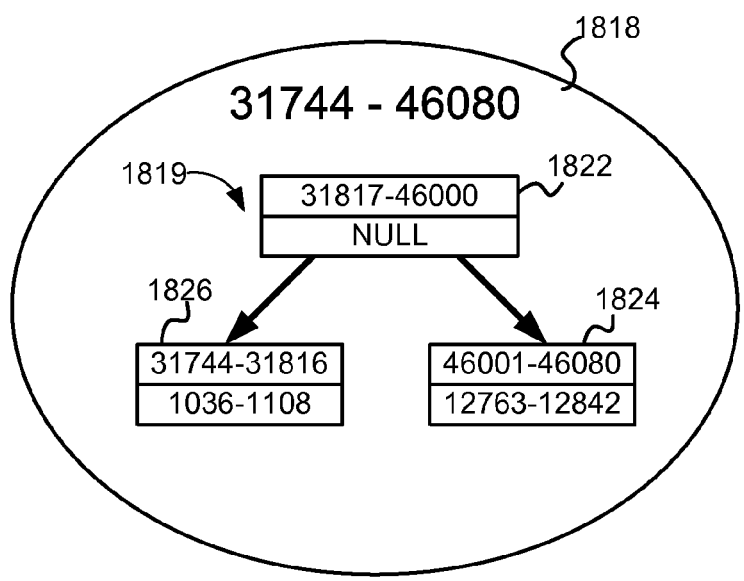

FIG. 18 depicts one example of an index entry comprising physical binding metadata. The entry 1818 represents an allocated LID having a range from 31744 through 46080 in the logical address space. The entries of the physical binding metadata associate sub-ranges of the LID with corresponding media storage locations (if any). The physical binding metadata 1819 may be indexed by LID as described above. In the FIG. 18 example, the LID sub-range comprising 31817 to 46000 of entry 1822 is not associated with valid data on the non-volatile storage device and, as such, is associated with a "NULL" media storage location. The entry 1824 for the sub-range 46001 to 46080 is associated with valid data. The entry 1824 identifies the media storage location of the data on the non-volatile storage device (locations 12763 through 12842). The entry 1826 identifies the media storage location of the valid data associated with the sub-range for 31744-31816.

Figure 19A:
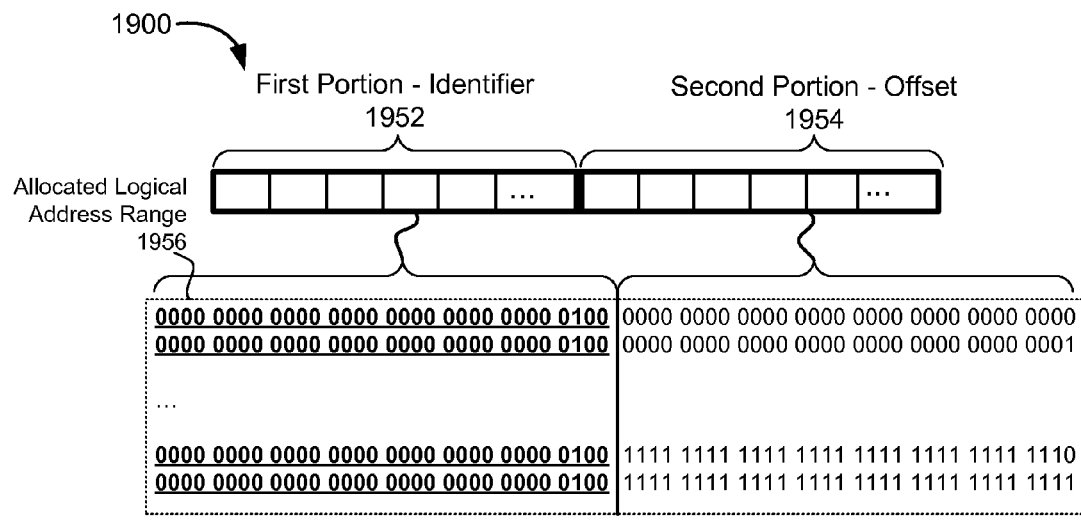
FIG. 19A depicts a logical identifier that has been segmented into a first portion and a second portion.

In some embodiments, the storage layer 130 is configured to segment the LIDs in the logical address space 134 into two or more portions. As shown in FIG. 19A, a LID 1900 is segmented into a first portion 1952 and a second portion 1954. In some embodiments, the first portion 1952 comprises "high-order" bits of the LID 1900, and the second portion comprises "low-order" bits. However, the disclosure is not limited in this regard and could segment LIDs using any suitable segmentation scheme.

The first portion 1952 may serve as a reference or identifier for a storage entity. The second portion 1954 may represent an offset into the storage entity. For example, the storage layer 130 may reference the logical address space 134 comprising 64-bit LIDs (the logical address space 134 may comprise $2^{64}$ unique LIDs). The storage layer 130 may partition the LIDs into a first portion 1952 comprising the high-order 32 bits of the 64-bit LID and a second portion 1954 comprising the low-order 32 bits of the LID. The resulting logical address space 134 may be capable of representing $2^{32}-1$ unique storage entities (e.g., using the first portion of the LIDs), each having a maximum size (or offset) of $2^{32}$ virtual storage locations (e.g., 2 TB for a virtual storage location size of 512 bytes). The disclosure is not limited in this regard, however, and could be adapted to use any suitable segmentation scheme. For example, in implementations that require a large number of small storage entities (e.g., database applications, messaging applications, or the like), the first portion 1952 may comprise a larger proportion of the LID. For instance, the first portion 1952 may comprise 42 bits (providing $2^{42}-1$ unique identifiers), and the second portion may comprise 22 bits (providing a maximum offset of 4 GB). Alternatively, where larger files are required, the segmentation scheme may be similarly modified. Furthermore, the storage layer 130 may present larger logical address spaces (e.g., 128 bits and so on) in accordance with the requirements of the storage clients 116, configuration of the computing device 110, and/or configuration of the non-volatile storage device 120. In some embodiments, the storage layer 130 segments the logical address space 134 in response to a request from a storage client 116 or other entity.

The storage layer 130 may allocate LIDs based on the first portion 1952. For example, in a 64 bit address space, when the storage layer 130 allocates a LID comprising a first portion 1952 [0000 0000 0000 0000 0000 0000 0000 0100] (e.g., first portion 1952 logical address 4), the storage layer 130 is effectively allocating a logical address range comprising $2^{32}$ unique LIDs 1956 (4,294,967,296 unique LIDS) ranging from:

[0000 0000 0000 0000 0000 0000 0000 0100 0000 0000 0000 0000 0000 0000 0000 0000]

to,

[0000 0000 0000 0000 0000 0000 0000 0100 1111 1111 1111 1111 1111 1111 1111 1111].

In some embodiments, the storage layer 130 uses the segmentation of the LIDs to simplify the storage metadata 135. In one example, the number of bits in the first portion 1952 is X, and the number of bits in the second portion 1954 is Y. The storage layer 130 may determine that the maximum number of uniquely LID that can be uniquely allocated is $2^X$, and that the allocated LIDs can be referenced using only the first portion of the LID (e.g., the set of X bits). Therefore, the storage layer 130 may simplify the storage metadata index to use entries comprising only the first portion of a LID. Moreover, the storage layer 130 may determine that the LIDs are allocated in fixed-sized ranges of $2^Y$. Accordingly, each entry in the storage metadata 135 (e.g., index 1804) may be of the same extent. Therefore, the range portion of the metadata entries may be omitted.

Figure 19B:
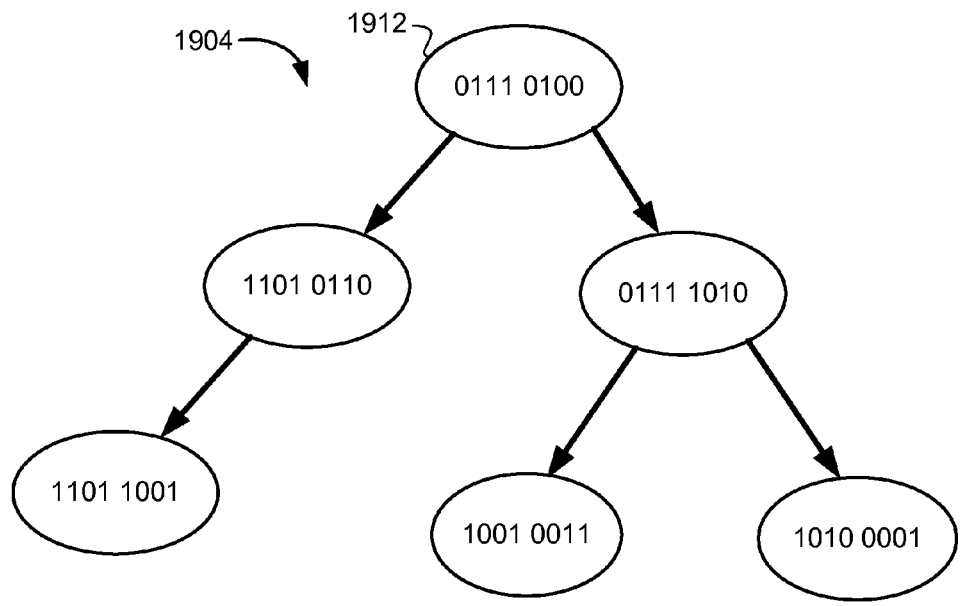
FIG. 19B is a schematic diagram of exemplary embodiments of storage metadata for segmented logical identifiers.

FIG. 19B depicts one example of an allocation index 1904 that has been simplified by segmenting the logical address space 134 (e.g., logical address space 134). For clarity, the first portion 1952 of the LIDs in the logical address space 134 managed by the index 1904 is depicted using eight (8) bits. The remaining portion of the LID (e.g., remaining 54 bits) may be used as the second portion 1954. Alternatively, other portions of the LID may be used for other logical address space 134 segmentation schemes, such as logical volume identifiers, partition identifiers, and so on.

Each entry 1912 in the index 1904 may be uniquely identified using the first portion (eight bits) of a LID. Accordingly, the entries 1904 may be indexed using only the first portion 1954 (e.g., 8 bits). This simplification may reduce the amount of data required to identify an entry 1912 from 64 bits to 8 bits (assuming a 64-bit LID with an 8-bit first portion). Moreover, the LIDs may be allocated in fixed sized logical ranges (e.g., in accordance with the second portion 1956). Therefore, each entry 1912 may represent the same range of allocated LIDs. As such, the entries 1912 may omit explicit range identifiers, which may save an additional 64 bits per entry 1912.

The storage layer 130 may use the simplified index 1904 to maintain LID allocations in the logical address space 134 and/or identify LIDs to allocate in response to requests from storage clients 116. In some embodiments, the storage layer 130 maintains a listing of "first portions" that are unallocated. Since, in some embodiments, allocations occur in a pre-determined way (e.g., using only the first portion 1954, and within a fixed range 1956), the unallocated LIDs may be expressed in a simple list or map as opposed to an index or other datastructure. As LIDs are allocated, they are removed from the datastructure and are replaced when they are deallocated.

Figure 19C:
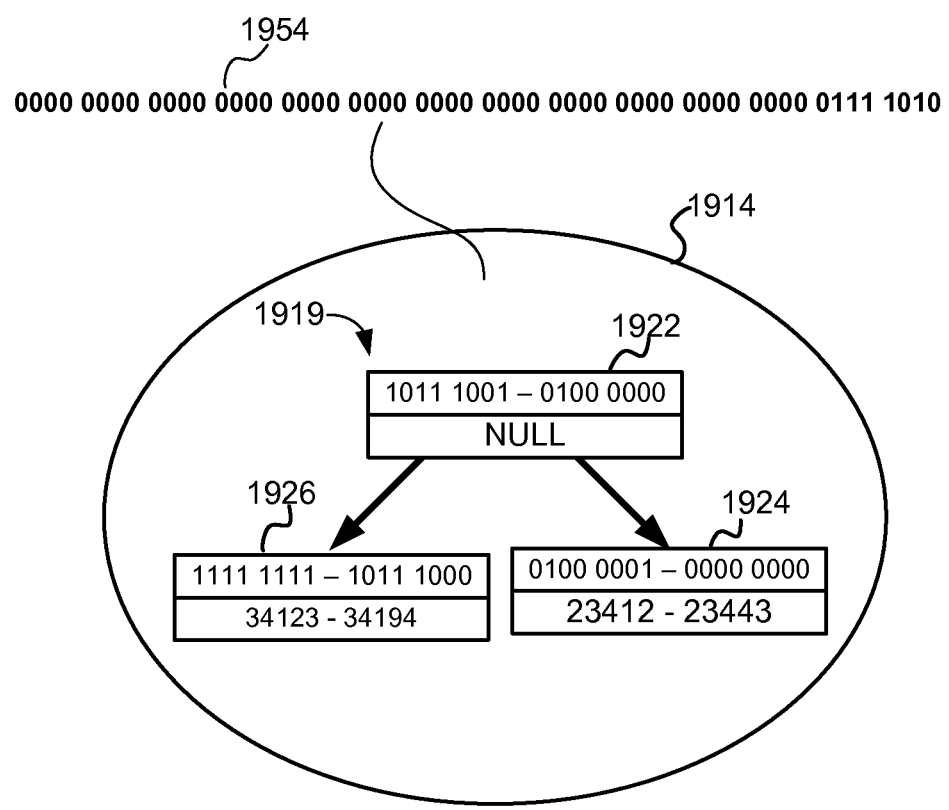
FIG. 19C is a schematic diagram of exemplary embodiments of physical reservation metadata for segmented logical identifiers.

Associations between portions of the entry and valid data on the non-volatile storage device may be maintained in the index 1904 (using physical binding metadata as described above). FIG. 19C depicts an example of physical binding metadata for use in a segmented logical addressing scheme. For clarity, in the FIG. 19C example, LIDs are segmented such that the first portion 1954 comprises 56 bits, and the second portion 1956 comprises 8 bits (the reverse of FIG. 19B). The entry 1914 is identified using the first portion 0000 0000 0000 0000 0000 0000 0000 0000 0000 0000 0000 0000 0111 1010. The entries 1922 of the index 1919 may be simplified to reference only offsets within the entry 1914 (e.g., within the second portion, which comprises 8 bits in the FIG. 19C example). Moreover, the head entry 1926 may omit the top-end of the second portion (e.g., may omit 1111 1111 since it can be determined that the top-most entry will necessarily include the maximal extent of the range defined by the second portion). Similarly, the tail entry 1924 may omit the bottom-end of the second portion 1956 (e.g., may omit 0000 0000 since it can be determined that the bottom-most entry will necessarily include the beginning of the range defined by the second portion 1956). Each entry 1914 associates a range within the second portion with valid data on the non-volatile storage device (if any), as described above.

As described above, storage clients 116 may delegate LID allocation to the storage layer 130 using the storage layer interface 132. The delegation may occur in a number of different ways. For example, a storage client 116 may query the storage layer 130 (via the storage layer 130 interface 1940) for any available LID. If a LID is available, the storage layer 130 returns an allocated LID to the storage client 116. Alternatively, the storage client 116 may request a particular LID for allocation. The request may comprise the first portion of the LID or an entire LID (with an offset). The storage layer 130 may determine if the LID is unallocated and, if so, may allocate the LID for the client and return an acknowledgement. If the LID is allocated (or the LID falls within an allocated range), the storage layer 130 may allocate an alternative LID and/or may return an error condition. The storage layer 130 may indicate whether particular LIDs are allocated and/or whether particular LIDs are bound to media storage locations on the non-volatile storage device 120. The queries may be serviced via the storage layer interface 132.

In embodiments in which the storage layer 130 implements segmented LIDs, the storage layer 130 may expose the segmentation scheme to the storage clients 116. For example, storage clients 116 may query the storage layer 130 to determine the segmentation scheme currently in use. The storage clients 116 may also configure the storage layer 130 to use a particular LID segmentation scheme adapted to the needs of the storage client 116.

The storage layer 130 may allocate LIDs using only the first portion 1954 of a LID. If the LID is unallocated, the storage layer 130 acknowledges the request, and the storage client 116 is allocated a range of LIDs in the logical address space 134 corresponding to the first portion 1954 and comprising the range defined by the second portion 1956. Similarly, when allocating a "nameless LID" (e.g., any available LID selected by the storage layer 130), the storage layer 130 may return only the first portion of the allocated LID. In some embodiments, when a client requests a LID using the first portion and the second portion, the storage layer 130 extracts the first portion from the requested LID, and allocates a LID corresponding to the first portion to the client (if possible). Advantageously, the disclosed embodiments support such a large number of addresses for the second portion over such a high number of contiguous addresses that storage requests that cross a LID boundary are anticipated to be very rare. In certain embodiments, the storage layer 130 may even prevent allocations that cross LID boundaries (as used herein a LID boundary is between two contiguous LIDs, the first being the last addressable LID in a second portion of a LID and the second being the first addressable LID in a next successive first portion of a LID). If the request crosses a boundary between pre-determined LID ranges, the storage layer 130 may return an alternative LID range that is properly aligned to the LID segmentation scheme, return an error, or the like. In other embodiments, if the request crosses a boundary between pre-determined LID ranges, the storage layer 130 may allocate both LIDs (if available).

Figure 20A:
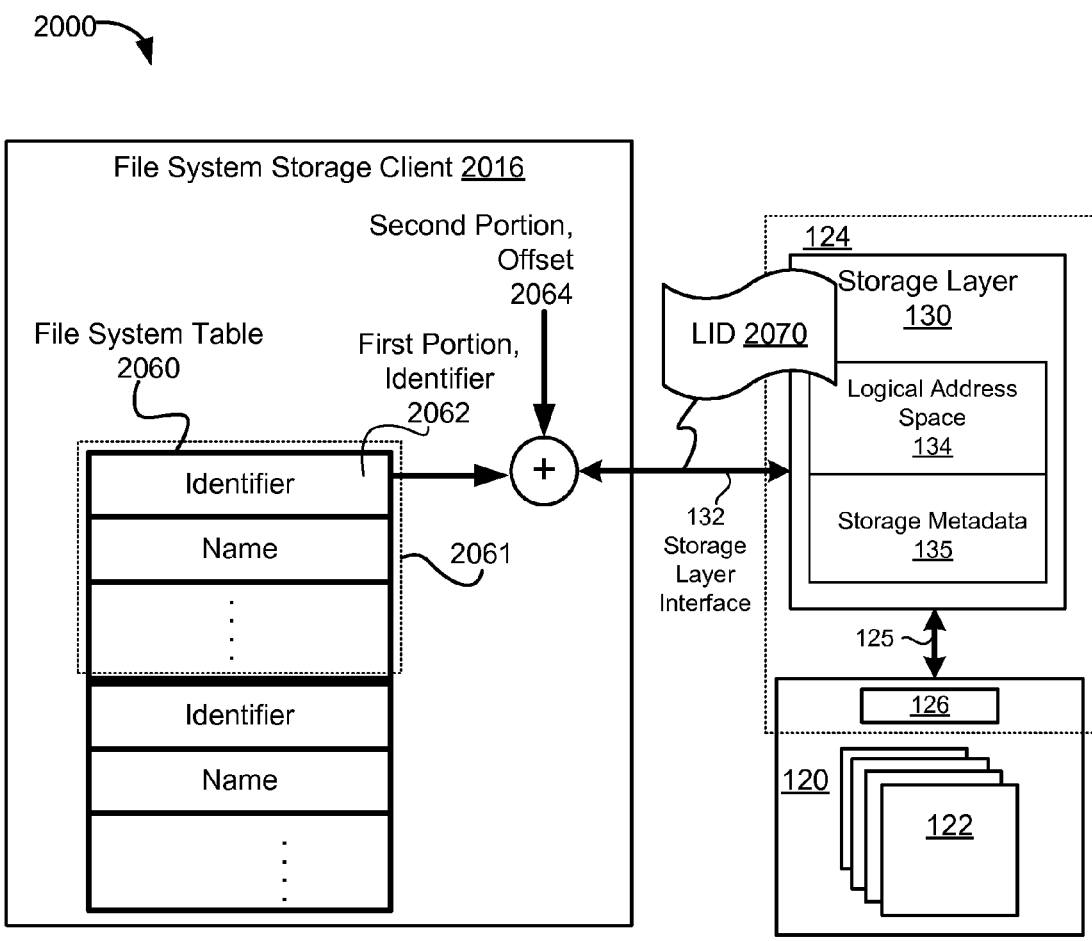
FIG. 20A is a schematic diagram of exemplary embodiments of a file system storage client accessing a storage layer using segmented logical identifiers.

As described above, the storage layer 130 may be leveraged by the storage clients 116 for logical allocations, physical storage bindings, physical storage reservations, crash-recovery, data integrity, and the like. FIG. 20A is a block diagram depicting a file system storage client 2016 leveraging the storage layer 130 to perform file system operations.

The file system storage client application 2016 accesses the storage layer 130 via the storage layer interface 132 to allocate LIDs for storage entities, such as file system objects (e.g., files). In some embodiments, when a new file is created, the file system storage client 2016 queries the storage layer 130 for a LID. The allocation request may be implemented as described above. If the requested LIDs can be allocated, the storage layer 130 returns an allocated LID to the file system storage client 2016. The LID may be returned as a LID and an offset (indicating an initial size for the file), a LID range, a first portion of a LID, or the like. The FIG. 20A example shows the storage layer 130 implementing a segmented LID range and, as such, the storage layer 130 may return the first portion of a LID 2062 in response to an allocation request.

In some embodiments, the storage client 2016 may implement a fast and efficient mapping between LIDs and storage entities. For example, when the first portion of the LID is sufficiently large, the file system storage client 2016 may hash file names into LID identifiers (into hash codes of the same length as the first portion of the LID 2062). When a new file is created, the file system storage client 2016 hashes the file name to generate the first portion of the LID 2062 and issues a request to the storage layer 130 to allocate the LID. If the LID is unallocated (e.g., no hash collisions have occurred), the storage layer 130 may grant the request. The file system storage client 2016 may not need to maintain an entry in the file system table 2060 for the new file (or may only be required to maintain an abbreviated version of a table entry 2061), since the LID 2062 can be derived from the file name. If a name collision occurs, the storage layer 130 may return an alternative LID, which may be derived from the hash code (or file name), which may obviate the need for the file system table 2060 to maintain the entire identifier.

The file system storage client 2016 may maintain a file system table 2060 to associate file system objects (e.g., files) with corresponding LIDs in the logical address space 134 of the storage layer 130. In some embodiments, the file system table 2060 is persisted on the non-volatile storage device 120 at a pre-determined LID. Accordingly, the file system storage client 2016 may delegate crash recovery and/or data integrity for the file system table 2060 (as well as the file system objects themselves) to the storage layer 130.

The file system storage client 2016 may reference files using the file system table 2060. To perform storage operations on a particular file, the file system storage application 2016 may access a file system entry 2061 corresponding to the file (e.g., using a file name lookup or another identifier, such as an I-node, or the like). The entry 2061 comprises a LID of the file, which, in the FIG. 20C example, is a first portion of a LID 2062. The file system storage client 2016 performs storage operations using the first portion 2062 of the LID along with an offset (the second portion 2064). The file system storage client 2016 may combine the file identifier (first portion 2062) with an offset 2064 to generate a full LID 2070. The LID 2070 may be sent to the storage layer 130 in connection with requests to perform storage operations within the logical address space 134.

The storage layer 130 performs storage operations using the storage metadata 135. Storage requests to persist data in the logical address space 134 comprise the storage layer 130 causing the data to be stored on the non-volatile storage device 120 in a contextual, log-based format, log-based format as described above. The storage layer 130 updates the storage metadata 135 to associate LIDs in the logical address space 134 with media storage locations on the non-volatile storage comprising data stored in the storage operation.

Storage operations to access persisted data on the non-volatile storage device may comprise the storage client, such as the file system storage client 2016 requesting the data associated with one or more LIDs 2070 in the logical address space. The file system storage client 2016 may identify the LIDs using the file system table 2060 or another datastructure. In response to the request, the storage layer 130 determines the media storage location of the LIDs 2070 on the non-volatile storage device 120 using the storage metadata 135, which is used to access the data.

In some embodiments, storage clients, such as the file system storage client 2016 may deallocate a storage entity. Deallocating a storage entity may comprise issuing a deallocation request to the storage layer 130 via the storage layer interface 132. In response to a deallocation request, the storage layer 130 removes the deallocated LIDs from the storage metadata 135 and/or may mark the deallocated LIDs as unallocated. The storage layer 130 may also invalidate the media storage locations corresponding to the deallocated LIDs in the storage metadata 135 and/or the non-volatile storage device 120 (e.g., using a reverse map as described above). A deallocation may be a "hint" to a groomer 370 of the non-volatile storage device 120 that the media storage locations associated with the deallocated LIDs are available for recovery.

The groomer 370, however, may not actually remove the data for some time after the deallocation request issued. Accordingly, in some embodiments, the storage layer interface 132 may provide an interface through which storage clients may issue a deallocation "directive" (as opposed to a hint). The deallocation directive may configure the storage layer 130 to return a pre-determined value (e.g., "0" or "NULL") for subsequent accesses to the deallocated LIDs (or the media storage locations associated therewith), even if the data is still available on the non-volatile storage device 120. The pre-determined value may continue to be returned until the LIDs are reallocated for another purpose.

In some embodiments, the storage layer 130 implements a deallocation directive by removing the deallocated LIDs from the storage metadata and returning a pre-determined value in response to requests for LIDs that are not allocated in the storage metadata 135 and/or are not bound (e.g., are not associated with valid data on the non-volatile storage device).

Alternatively, or in addition, in response to a deallocation directive the storage layer 130 may cause the corresponding media storage locations on the non-volatile storage device 120 to be erased. The storage layer 130 may provide the storage client 2016 with an acknowledgement when the erasure is complete. Since erasures make take a significant amount of time to complete relative to other storage operations, the acknowledgement may be issued asynchronously.

Figure 20B:
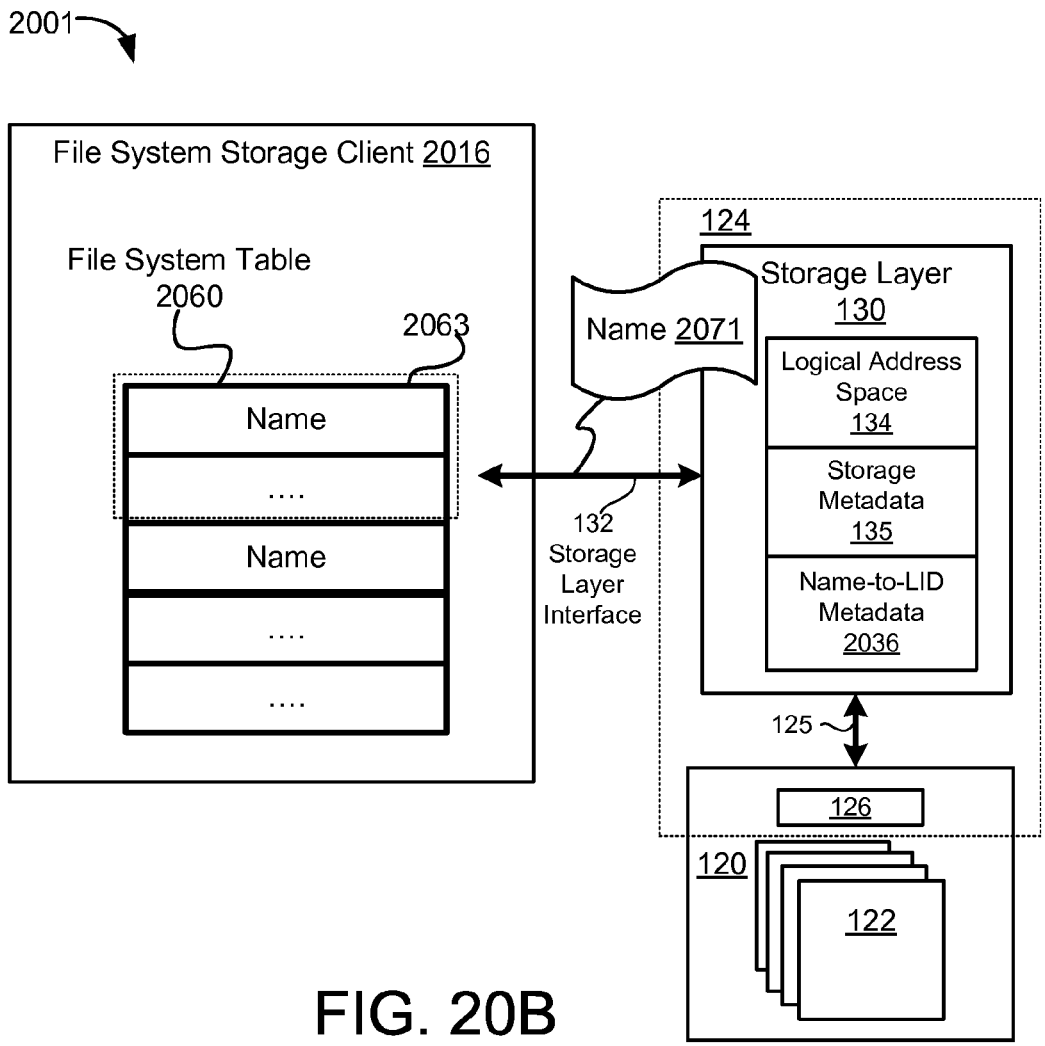
FIG. 20B is a schematic diagram of exemplary embodiments of a file system storage client accessing a storage layer using segmented logical identifiers.

FIG. 20B is a block diagram depicting another embodiment 2001 of storage client leveraging the storage layer 130. In the FIG. 20B example, the storage layer 130 presents a logical address space 134 to the storage client 2016 and maintains storage metadata 135 as described above. In addition, the storage layer 130 maintains name-to-LID association metadata 2036. This metadata 2036 may comprise associations between LIDs in the logical address space 134 and storage entity identifiers of storage clients 116. For example, a file system client 2016, may request LID allocations using a storage entity identifier or name 2071 (e.g., file name) as opposed to a LID. The storage client 2016 relies on the storage layer 130 to select an available LID (as opposed to specifying a particular LID), is referred to as a "nameless write" or "nameless allocation." In response, the storage layer 130 allocates a LID for the file system storage client 2016 within the logical address space 134. In addition, the storage layer 130 may maintain an association between the allocated LID and the name 2071 in name-to-LID metadata 2036. Storage clients 2016 may request subsequent storage operations on the storage entity using the name 2071 (along with an offset, if needed). The file system table 2060 of the client 2016 may be simplified since entries 2063 need only maintain the name of a file as opposed to the name and LID. In response to storage requests comprising a name 2071, the storage layer 130 accesses the name-to-LID metadata 2036 to determine the LID associated with the name 2071 and implements the storage request as described above.

In some embodiments, the name-to-LID metadata 2036 may be included with the storage metadata 135. For example, entries in the index 1804 of FIGS. 17 and 18 may be indexed by name in addition to (or in place of) a logical identifier. The storage layer 130 may persist the name-to-LID metadata 2036 on the non-volatile storage device 120, such that the integrity of the metadata 2036 is maintained despite invalid shutdown conditions. Alternatively, or in addition, the name-to-LID metadata 2036 may be reconstructed using the contextual, log-based data format on the non-volatile storage device 120.

Figure 21:
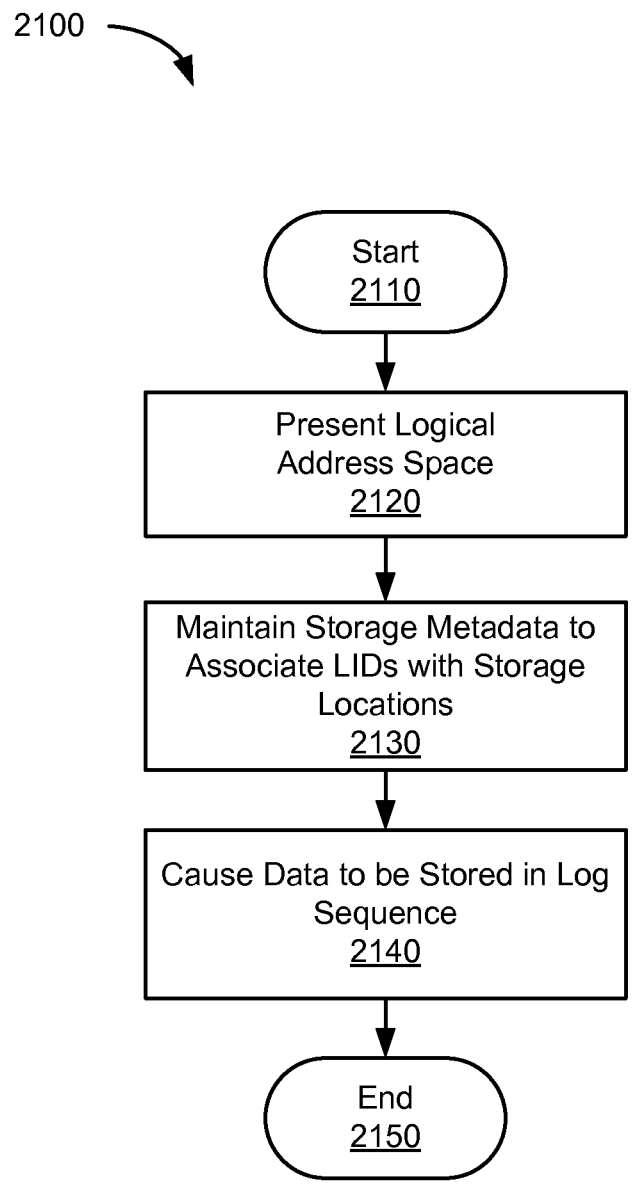
FIG. 21 is a flow diagram of one embodiment of a method for providing a storage layer.

FIG. 21 is a flow diagram of one embodiment of a method for providing a storage layer 130. At step 2110, the method starts and is initialized. Step 2110 may comprise initializing a storage layer 130, such as the storage layer 130 described above, which may comprise initializing access to a non-volatile storage device (via a communication bus), initializing storage metadata, and so on.

At step 2120, the method 2100 presents a logical address space 134 for the non-volatile device to storage clients. The logical address space 134 may be defined independently of the non-volatile storage device. Accordingly, the logical capacity of the logical address space 134 (e.g., the size of the logical address space 134 and/or the size of the virtual storage blocks thereof) may exceed the physical storage capacity of the non-volatile storage device. In some embodiments, the logical address space 134 is presented via an application-programming interface (API) that is accessible to storage clients, such as operating systems, file systems, database applications, and the like.

At step 2130, storage metadata is maintained. The storage metadata may track allocations of LIDs within the logical address space 134, as well as bindings between LIDs and media storage locations of the non-volatile storage device. The metadata may further comprise indications of the remaining logical capacity of the logical address space 134, the remaining physical storage capacity of the non-volatile storage device, the status of particular LIDs, and so on.

In some embodiments, the metadata is maintained in response to storage operations performed within the logical address space. The storage metadata is updated to reflect allocations of LIDs by storage clients. When storage clients persist data to allocated LIDs, bindings between the LIDs and the media storage locations comprising the data are updated.

At step 2140, storage operations are performed using an log-based sequence. As described above, the storage layer 130 (and non-volatile storage device) may be configured to store data in a log-based format, such that an ordered sequence of storage operations performed on the storage device can be reconstructed in the event of an invalid shutdown (or other loss of storage metadata 135). The ordered sequence of storage operations allows storage clients to delegate crash recovery, data integrity, and other functionality to the storage layer 130.

At step 2150, the method terminates, until additional storage operations are performed, at which point the flow continues at step 2120.

Figure 22:
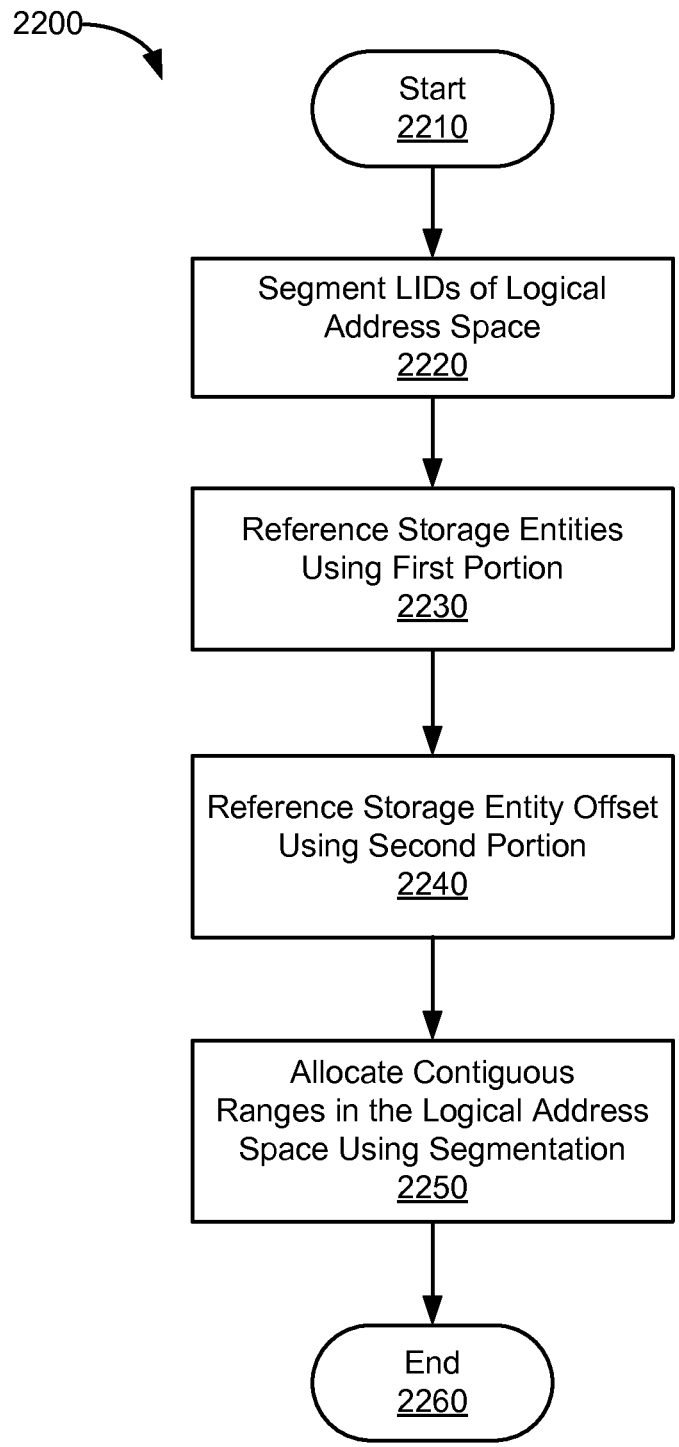
FIG. 22 is a flow diagram of one embodiment of a method for segmenting logical identifiers of a logical address space.

FIG. 22 is a flow diagram of one embodiment of a method for segmenting logical identifiers of a logical address space. At step 2210, the method 2200 starts and is initialized as described above.

At step 2220, the method 2200 segments logical identifiers of a logical address space 134 into at least a first portion and a second portion. The segmentation of step 2230 may be performed as part of a configuration process of the storage layer 130 and/or non-volatile storage device (e.g., when the device is initialized). Alternatively, or in addition, the segmentation of step 2220 may be performed in response to a request from a storage client. The storage client may request a particular type of LID segmentation according to the storage requirements thereof. For example, if the storage client has a need to store a large number of relatively small storage entities, the storage client may configure the LID segmentation to dedicate a larger proportion of the LID to identification bits and a smaller proportion to offset bits. Alternatively, a storage client who requires a relatively small number of very large storage entities may configure the method 2220 to implement a different type of segmentation that uses a larger proportion of the LID for offset bits (allowing for larger storage entities).

At step 2230, the storage layer 130 uses the first portion of the LID to reference storage client allocations (e.g., as a reference for storage entities). Step 2230 may comprise reconfiguring the storage metadata to allocate LIDs using only the first portion of the LID (e.g., the upper X bits of a LID). The size of the first portion may determine the number of unique storage entities that can be expressed in the storage metadata (e.g., as $2^X-1$, where X is the number of bits in the first portion). Accordingly, a first portion comprising 32 bits may support approximately $2^{32}$ unique storage entities. The reconfiguration may simplify the storage metadata, since each entry may be identified using a smaller amount of data (only the first portion of the LID as opposed to the entire LID).

At step 2240, the storage layer 130 uses the second portion of the LID as an offset into a storage entity. The size of the second portion may define the maximum size of a storage entity (under the current segmentation scheme). The size of a LID may be defined as the virtual block size times $2^Y$, where Y is the number of bits in the second portion. As discussed above, a virtual block size of 512 and second portion comprise thirty two (32) bits results in a maximum storage entity size of 2 TB. Step 2240 may comprise reconfiguring the storage metadata to reference LID to media storage location bindings using only the second portion of the LID. This may allow the storage metadata entries (e.g., entries in physical binding metadata) to be simplified, since the bindings can be expressed using a smaller number of bits.

At step 2250, the storage layer 130 uses the LID segmentation of step 2220 to allocate LIDs comprising contiguous logical address ranges in the logical address space. Step 2250 may comprise the storage layer 130 allocating LIDs using only the first portion of the LID (e.g., the upper X bits). The allocated LID may comprise a contiguous logical address range corresponding to the number of bits in the second portion as described above.

In some embodiments, allocating a LID at step 2250 does not cause corresponding logical storage locations to be reserved of "bound" thereto. The bindings between allocated LIDs and media storage locations may not occur until the storage client actually performs storage operations on the LIDs (e.g., stores data in the LIDs). The delayed binding prevents the large, contiguous LID allocations from exhausting the physical storage capacity of the non-volatile storage device.

At step 2260, the flow ends until a next storage operation is requested, at which point the flow continues at step 2240.

Figure 23:
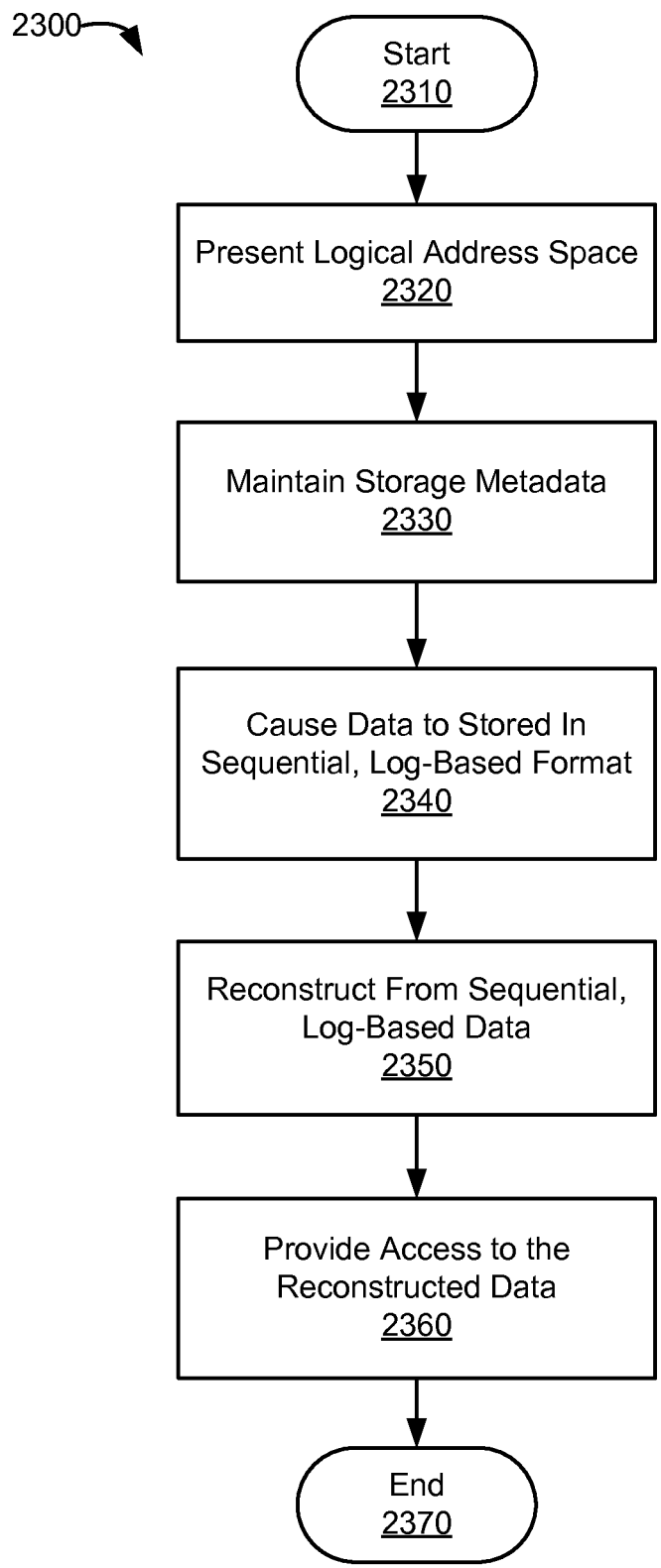
FIG. 23 is a flow diagram of one embodiment of a method for providing crash recovery and data integrity in a storage layer.

FIG. 23 is a flow diagram of one embodiment of a method for providing crash recovery and data integrity in a storage layer 130. At step 2310, the method starts and is initialized as described above.

At step 2320, the storage layer 130 presents a logical address space 134, and at step 2330, metadata is maintained to associate LIDs in the logical address space 134 with media storage locations on the non-volatile storage device.

At step 2340, the storage layer 130 causes data to be stored on the non-volatile storage device in a contextual, log-based format. As described above, the contextual, log-based formatting of the data is configured such that, in the event of an invalid shutdown, the data (and metadata pertaining thereto) can be reconstructed.

At step 2350, the storage layer 130 reconstructs data stored on the non-volatile storage device using the data formatted in the contextual, log-based format. As described above, the log-based format may comprise storing LID identifiers with data on the non-volatile storage device. The LID identifiers may be used to associate the data with LIDs in the logical address space 134 (e.g., reconstruct the storage metadata). Sequence indicators stored with the data on the non-volatile storage device are used to determine the most current version of data associated with the same LID; since data is written out-of-place, updated data may be stored on the non-volatile storage device along with previous, obsolete versions. The sequence indicators allow the storage layer 130 to distinguish older versions from the current version. The reconstruction of step 2350 may comprise reconstructing the storage metadata, determining the most current version of data for a particular LID (e.g., identifying the media storage location that comprises the current version of the data), and so on.

At step 2360, the storage layer 130 provides access to the reconstructed data to storage clients. Accordingly, the storage clients may delegate crash recovery and/or data integrity functionality to the storage layer 130, which relieves the storage clients from implementing these features themselves. Accordingly, the storage clients can be simpler and more efficient.

At step 2370, the flow ends until subsequent storage operations are performed, at which point the flow continues at step 2320.

Figure 24A:
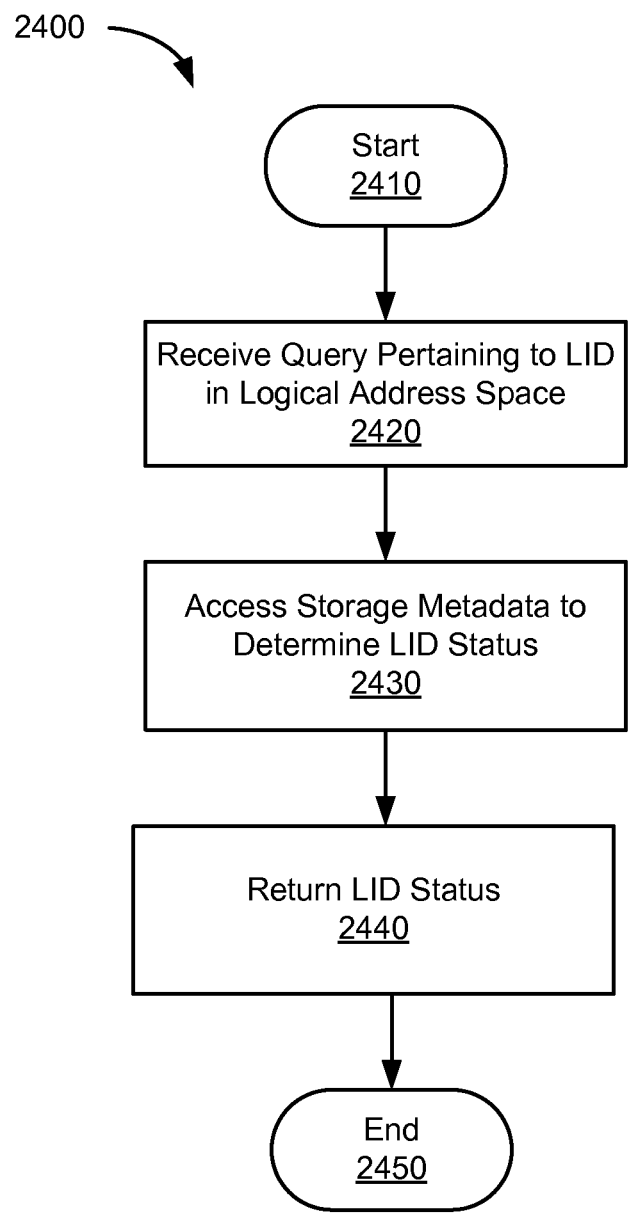
FIG. 24A is a flow diagram of one embodiment of a method for servicing queries pertaining to the status of a logical identifier.

FIG. 24A is a flow diagram of one embodiment of a method for servicing queries pertaining to the status of a logical identifier. At step 2410, the method 2400 starts and is initialized as described above.

At step 2420, the storage layer 130 receives a request pertaining to the status of a particular LID in the logical address space 134 presented by the storage layer 130. Alternatively, the query may pertain to the logical address space 134 as a whole (e.g., a query for the remaining logical capacity of the logical address space 134, or the like). Similarly, the query may pertain to the physical storage capacity of the non-volatile storage device, such as a query regarding the physical storage capacity that is bound to LIDs in the logical address space 134 (e.g., currently occupied), available physical storage capacity, and so on.

At step 2430, the storage layer 130 accesses storage metadata to determine the status of the requested LID, logical capacity, physical storage capacity, or the like. The access may comprise identifying an entry for the LID in a logical-to-physical map, in an allocation index, or the like. If the particular LID falls within an entry in an allocation index and/or logical to physical index, the storage layer 130 may determine that the LID is allocated and/or may determine whether the LID is bound to a media storage location. The access may further comprise, traversing a metadata index to identify unallocated LIDs, unused media storage locations, and so on. The traversal may further comprise identifying allocated (or unallocated) LIDs to determine current LID allocation (or unallocated LID capacity), to determine bound physical storage capacity, determine remaining physical storage capacity, or the like.

At step 2440, the storage layer 130 returns the status determined at step 2430 to the storage client, and the flow end at step 2450 until a next query is received, at which point the flow continues at step 2420.

Figure 24B:
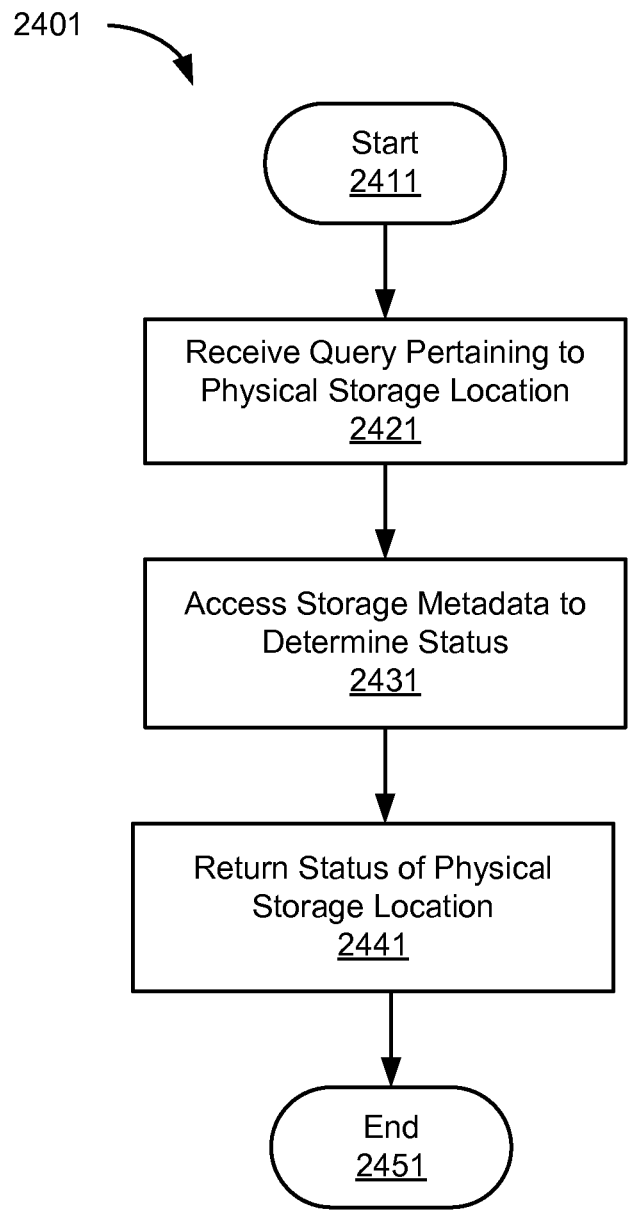
FIG. 24B is a flow diagram of one embodiment of a method of servicing queries pertaining to a media storage location.

FIG. 24B is a flow diagram of one embodiment of a method for servicing queries pertaining to the status of a media storage location (or range of media storage locations) of a non-volatile storage device. At step 2411, the method 2401 starts and is initialized as described above.

At step 2421, the storage layer 130 receives a request pertaining to the status of a particular media storage location on a non-volatile storage device. The media storage location may be associated with a LID in the logical address space 134 presented by the storage layer 130. Alternatively, the query may be "iterative" and may pertain to all media storage locations on the non-volatile storage device (e.g., a query regarding the status of all media storage locations on the device). Similarly, the query may pertain to the physical storage capacity of the non-volatile storage device, such as a query regarding the physical storage capacity that is bound to LIDs in the logical address space 134 (e.g., currently occupied), available physical storage capacity, and so on.

The query of step 2421 may be useful in various different contexts. For example, in a RAID rebuild operation, a second non-volatile storage device may be configured to mirror the contents of a first non-volatile storage device. The data stored on the first logical storage device may be stored sequentially (e.g., in a contextual, log-based format). As such, the first non-volatile storage device may comprise "invalid" data (e.g., data was deleted, was made obsolete by a sequent storage operation, etc.). The query of step 2421 may be issued by the second, non-volatile storage device to determine which media storage locations on the first, non-volatile storage device "exist" (e.g., are valid), and should be mirrored on the second non-volatile storage device. Accordingly, the query of step 2421 may be issued in the form of an iterator, configured to iterate over (e.g., discover) all media storage locations that comprise "valid data," and the extent of the valid data.

Step 2431 comprises accessing storage metadata, such as the index 1204 or reverse map 1222 described above in conjunction with FIG. 12, to determine whether the specified media storage location comprises valid data and/or to determine the extent (or range) of valid data in the specified media storage location.

At step 2441, the storage layer 130 returns the status determined at step 2431 to the requester, and the flow end at step 2451 until a next query is received, at which point the flow continues at step 2421.

In some embodiments, methods 2400 and 2401 are used to implement conditional storage operations. As used herein, a conditional storage operation refers to a storage operation that is to occur if one or more conditions are met. A conditional write may comprise a storage client requesting that data be written to a particular set of LIDs. The storage layer 130 may implement the conditional write if the specified LIDs do not exist (e.g., are not already allocated to another storage client), and the non-volatile storage comprises sufficient physical storage capacity to satisfy the request. Similarly, a conditional read may comprise a storage client requesting data from a particular set of LIDs. The storage layer 130 may implement the conditional read if the specified LIDs exist and are bound to valid data (e.g., are in storage metadata maintained by the storage layer 130, and are bound to media storage locations). In other examples, the storage layer 130 provides for "nameless" reads and writes, in which a storage client presents identifier, and the storage layer 130 determines the LIDs associated with the identifier, and services the storage request accordingly (e.g., "nameless" writes as described above). In this case, the storage layer 130 offloads management of identifier-to-LID mappings for the storage client.

In some embodiments, the storage metadata maintained by the storage layer 130 may provide for designating certain portions of the logical address space 134 as being "temporary" or "ephemeral." As used herein, an ephemeral address range is an address range that is set to be automatically deleted under certain conditions. The conditions may include, but are not limited to: a restart operation, a shutdown event (planned or unplanned), expiration of a pre-determined time, resource exhaustion, etc.

Data may be identified as ephemeral in storage metadata maintained by the storage layer 130, in metadata persisted to the solid-state storage media, or the like. Referring back to FIG. 12, an entry 1214 in the index 1204 (forward map) may be identified as ephemeral in the metadata 1219 thereof. When the storage layer 130 persists the index 1204 as part of a shutdown, restart, or other operation, entries that include an ephemeral indicator may be omitted, effectively "invalidating" the corresponding data. Alternatively, or in addition, the storage layer 130 may designate an a portion of the large logical address space 134 as comprising ephemeral data. Any entries in the ephemeral address range may be designated as ephemeral in the index without additional modifications to entry metadata.

Figure 25A:
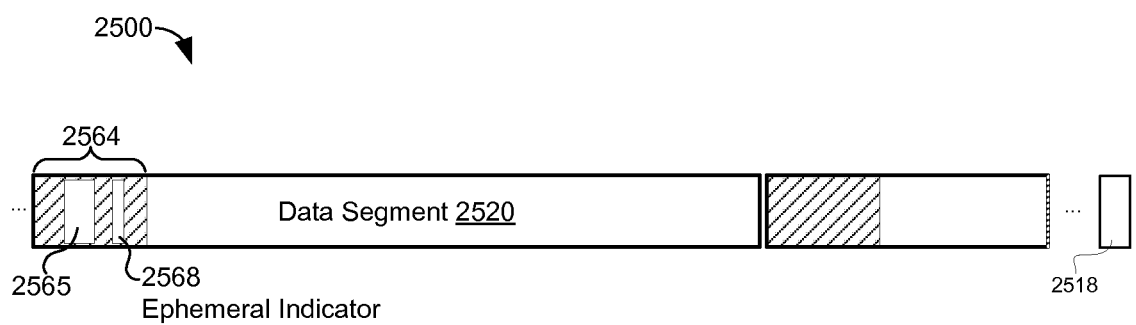
FIG. 25A depicts one embodiment of a contextual, log-based data format.

In some embodiments, an ephemeral indicator may be included in a media storage location on the non-volatile storage media. FIG. 25A depicts one example of a contextual data format (e.g., packet format) 2500, which may be used to store a data segment 2520 on a non-volatile storage media. As described above, in some embodiments, packets 2500 may be subject to further processing before being persisted on a media storage location (e.g., packets may be encoded into ECC codewords by an ECC generator 304 as described above).

The packet format 2500 may comprise persistent contextual metadata 2564, which may include logical interface metadata 2565, as described above. The packet format 2500 may comprise and/or be associated with a sequence indicator 2518, which may include, but is not limited to a sequence number, timestamp, or other suitable sequence indicator. The sequence indicator 2518 may be included in the persistent contextual metadata 2564 (e.g., as another field, not shown). Alternatively, or in addition, a sequence indicator 2518 may be stored elsewhere on the non-volatile storage media 122. For example, a sequence indicator 2518 may be stored on a page (or virtual page) basis, on an erase-block basis, or the like. As described above, each logical erase block may be marked with a respective marking, and packets may be stored sequentially therein. Accordingly, the sequential order of packets may be determined by a combination of the logical erase block sequence indicators (e.g., indicators 2518) and the sequence of packets 2500 within each logical erase block.

The storage layer 130 may be configured to reconstruct the storage metadata (e.g., index, etc.) using the contextual, log-based formatted data stored on the non-volatile storage media 122. Reconstruction may comprise the storage layer 130 (or another process) reading packets 2500 formatted in the contextual, log-based format from media storage locations of the solid-state storage media 122. As each packet 2500 is read, a corresponding entry in the storage metadata (e.g., the indexes described above) may be created. The LID range associated with the entry is derived from the LID 2516 in the header 2512 of the packet. The sequence indicator 2518 associated with the data packet may be used to determine the most up-to-date version of data 2514 for a particular LID. As described above, the storage layer 130 may write data "out-of-place" due to, inter alia, wear leveling, write amplification, and other considerations. Accordingly, data intended to overwrite an existing LID may be written to a different media storage location than the original data. The overwritten data is "invalidated" as described above; this data, however, remains on the solid-state storage media 122 until the erase block comprising the data is groomed (e.g., reclaimed and erased). The sequence identifier may be used to determine which of two (or more) contextual, log-based packets 2500 corresponding to the same LID comprises the current, valid version of the data.

In some embodiments, and as illustrated in FIG. 25A, the header 2512 includes an ephemeral indicator 2568. When reconstructing the storage metadata, the ephemeral indicator 2568 may be used to identify data that should be invalidated (e.g., deleted). Invalidating ephemeral data may comprise omitting the LIDs 2514 referenced in the logical interface 2565 of the packet 2500, marking the data segment 2520 as invalid in a reverse-index, and so on. Similarly, if data marked as ephemeral is more "up-to-date" than other data per the sequence indicator 2518, the original, "older" data may be retained and the ephemeral data may be ignored.

The storage layer 130 may provide an API through which storage clients may designate certain LID ranges (or other identifiers) as being ephemeral. Alternatively, or in addition, the storage layer 130 may implement higher-level interfaces using ephemeral data. For example, a multi-step atomic write (e.g., multi-block atomic write), may be implemented by issuing multiple write requests, each of which designates the data as being ephemeral. When all of the writes are completed, the ephemeral designation may be removed. If a failure occurs during the multi-step atomic write, data that was previously written can be ignored (no "roll-back" is necessary), since the data will be removed the next time the device is restarted. A similar approach may be used to provide support for transactions. As used herein, a "transaction" refers to a plurality of operations that are completed as a group. If any one of the transaction operations is not completed, the other transaction operations are rolled-back. As a transaction are implemented, the constituent storage operations may be marked as ephemeral. Successful completion of the transaction comprises removing the ephemeral designation from the storage operations. If the transaction fails, the ephemeral data may be ignored.

In some embodiments, ephemeral data may be associated with a time-out indicator. The time-out indicator may be associated with the operation of a storage reclamation process, such as a groomer. When the groomer evaluates a storage division (e.g., erase block, page, etc.) for reclamation, ephemeral data therein may be treated as invalid data. As such, the ephemeral data may be omitted during reclamation processing (e.g., not considered for storage division selection and/or not stored in another media storage location during reclamation). In some embodiments, ephemeral data may not be treated as invalid until its age exceeds a threshold. The age of ephemeral data may be determined by the sequence indicator 2518 associated therewith. When the age of ephemeral data exceeds a pre-determined threshold, it may be considered to be part of a failed transaction, and may be invalidated as described above. The threshold may be set on a per-packet basis (e.g., in the header 2512), may be set globally (through an API or setting of the storage layer 130), or the like.

Figure 25B:
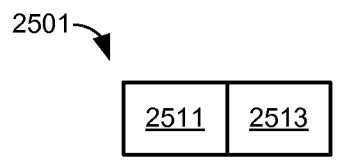
FIG. 25B depicts one embodiment of a persistent note.

As described above, removing an ephemeral designation may comprise updating storage metadata (e.g., index 1204) to indicate that a particular entry is no longer to be considered to be ephemeral. In addition, the storage layer 130 may update the ephemeral indicator stored on the solid-state storage media (e.g., in persistent contextual metadata 2564 of a packet 2500). However, if the solid-state storage media is write-out-of-place, it may not be practical to overwrite (or rewrite) these indicators. Therefore, in some embodiments, the storage layer 130 persists a "note" on the solid-state storage media (e.g., writes a persistent note to a media storage location of the solid-state storage media). As used herein, a persistent note refers to a "metadata note" that is persistently stored on the solid-state storage media. Removing the ephemeral designation may comprise persisting a metadata note indicating the removal to the solid-state storage media. As depicted in FIG. 25B, a persistent note 2501 may comprise a reference 2511 that identifies one or more packets 2500 on a media storage location. The reference 2511 may comprise any suitable identifying information including, but not limited to: a logical interface, a LID, a range, a media storage location identifier, a sequence indicator, or the like. The persistent note 2501 may also include a directive 2513, which, in the FIG. 25B example, may be a directive to remove an ephemeral designation from the identified packets. Additional details regarding persistent notes are disclosed in U.S. patent application Ser. No. 13/330,554, entitled "Apparatus, System, and Method for Persistent Metadata," filed Dec. 19, 2011, and which is hereby incorporated by reference.

In some embodiments, the logical address space 134 presented by the storage layer 130 may include an "ephemeral" LID range. As used herein, an ephemeral LID range comprises references to ephemeral data (e.g., LIDs that are to be "auto-deleted" on restart, or another condition). This segmentation may be possible due to the storage layer 130 maintaining a large (e.g., sparse) logical address space 134, as described above. The storage layer 130 maintains ephemeral data in the ephemeral logical address range, as such, each entry therein is considered to be ephemeral. An ephemeral indicator may also be included in contextual, log-based formatted data bound to the LIDs within the ephemeral range.

Figure 25C:
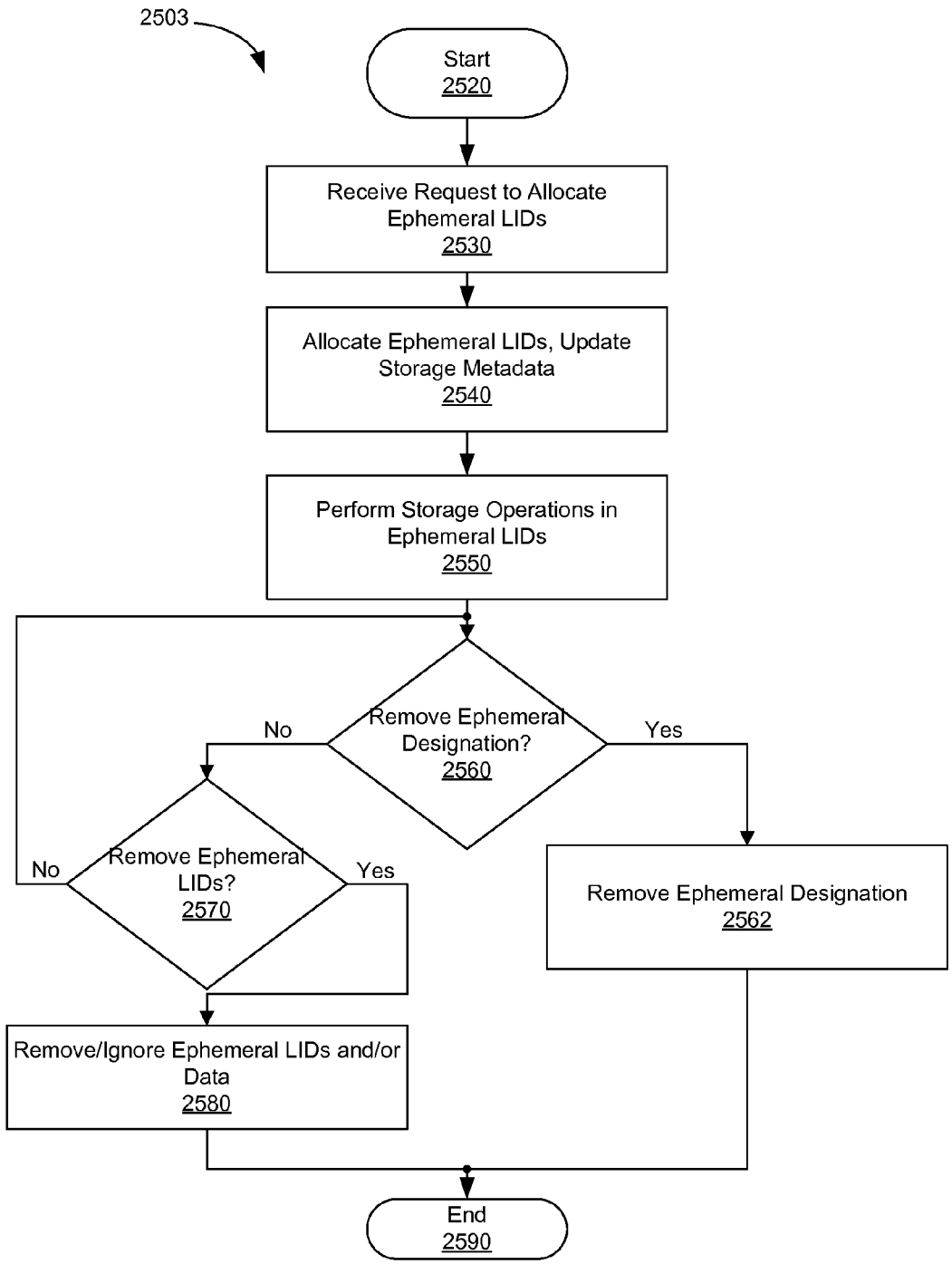
FIG. 25C is a flow diagram of one embodiment of a method for designating ephemeral data.

FIG. 25C depicts one example of a method for using ephemeral designations to implement a multi-step operation. At step 2520, the method 2503 may start and be initialized as described above. At step 2530, the method receives a request to allocate a range of LIDs in a logical address space. The request may indicate that the LIDs are to be designated as ephemeral. The request may be received from a storage client (e.g., an explicit allocation request). Alternatively, or in addition, the request may be made as part of a higher-level API provided by the storage layer 130, which may include, but is not limited to: a transaction API, a clone API, move API, deduplication API, an atomic-write API, or the like.

At step 2540, the requested LIDs are allocated as described above (unless not already allocated by another storage client). Step 2540 may further comprise updating storage metadata to indicate that the LIDs ephemeral, which may include, but is not limited to: setting an indicator in an entry for the LIDs in the storage metadata (e.g., index), allocating the LIDs in an "ephemeral range" of the index.

At step 2550, the storage client may request one or more persistent storage operations on the ephemeral LIDs of step 2540. The storage operations may comprise a multi-block atomic write, operations pertaining to a transaction, a snapshot operation, a clone (described in additional detail below), or the like. Step 2550 may comprise marking contextual, log-based data associated with the persistent storage operations as ephemeral as described above (e.g., in a header of a packet comprising the data).

At step 2560, if the method receives a request to remove the ephemeral designation, the flow continues to step 2562; otherwise, the flow continues to step 2570. The request of step 2560 may be issued by a storage client and/or the request may be part of a higher-level API as described above. For example, the request may be issued when the constituent operations a transaction or atomic operation are complete.

At step 2562, the ephemeral designation applied at steps 2540 and 2550 are removed.

Step 2562 may comprise removing metadata indicators from storage metadata, "folding" the ephemeral range into a "non-ephemeral range" of the storage metadata index, or the like (folding is described in additional detail below). Step 2562 may further comprising storing one or more persistent notes on the non-volatile storage media that remove the ephemeral designation from data corresponding to the formerly ephemeral data as described above.

At step 2570, the method 2500 may determine whether the ephemeral data should be removed. If not, the flow continues back to step 2560; otherwise, the flow continues to step 2780. At step 2780, the ephemeral data is removed (or omitted) when the storage metadata is persisted (as part of a shutdown or reboot operation). Alternatively, or in addition, data that is designated as ephemeral on the non-volatile storage media may be ignored during a reconstruction process.

At step 2790, the flow ends until a next request is received, at which point the flow continues at step 2530.

Figure 26:
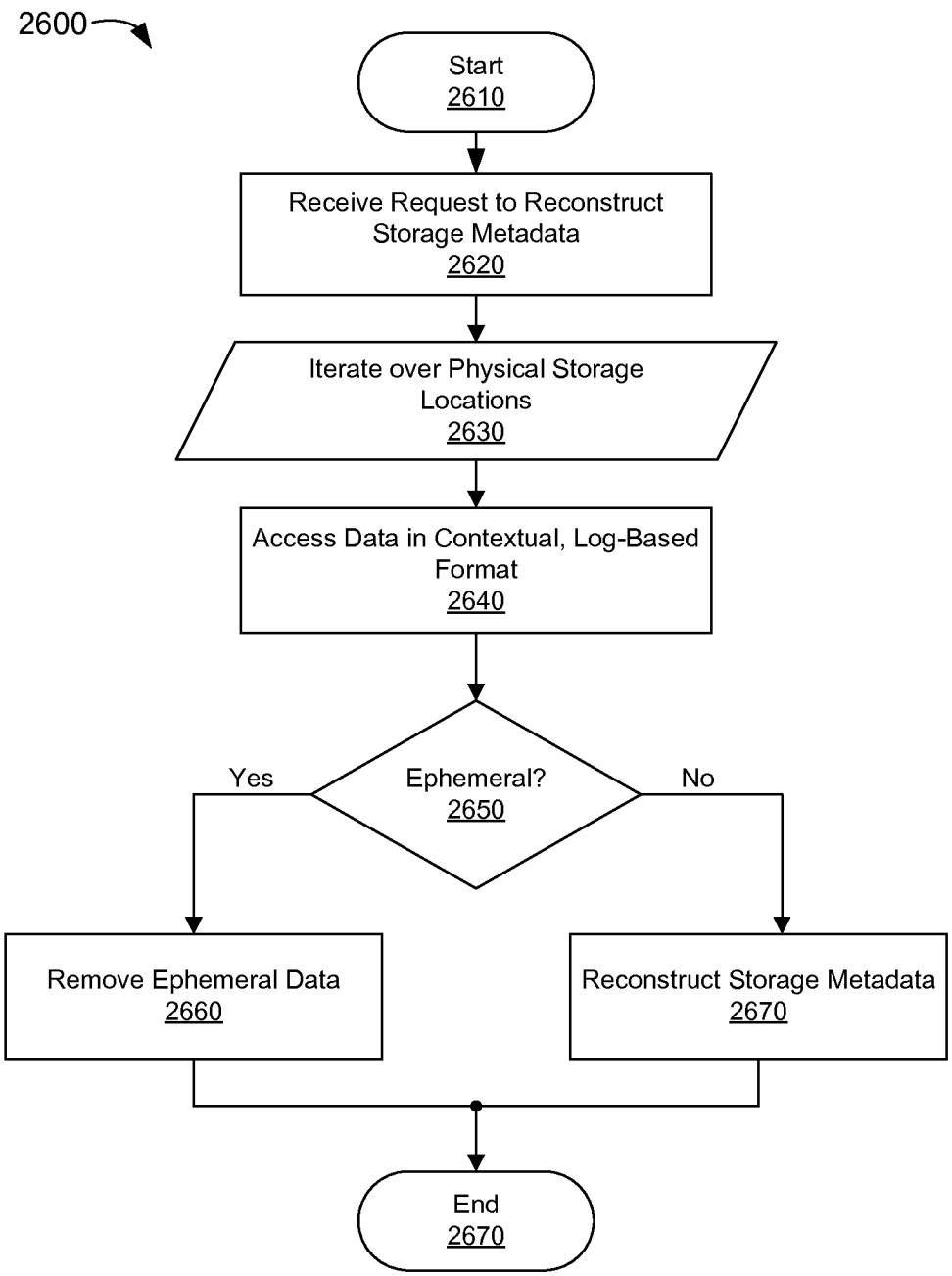
FIG. 26 is a flow diagram of one embodiment of a method reconstructing storage metadata and/or determining the status of media storage locations using a contextual, log-based data format.

FIG. 26 depicts one example of a method for reconstructing storage metadata from data stored on a non-volatile storage medium in a contextual, log-based format. At step 2610, the method 2600 starts and is initialized as described above.

At step 2620, the method 2600 receives a request to reconstruct storage metadata from the contents of a non-volatile storage medium or device. The request may be received in response to storage metadata maintained by the storage layer 130 (or another entity) being lost or out-of-sync with the contents of the physical storage media. For example, portions of the storage metadata described herein (e.g., the index 1204 and/or reverse map 1222) may be maintained in volatile memory. In an invalid shutdown, the contents of the volatile memory may be lost before the storage metadata can be stored in non-volatile storage. In another example, a second storage device may be configured to mirror the contents of a first storage device; accordingly, the second storage device may maintain storage metadata describing the contents of the first storage device. The second storage device may lose communication with the first storage device and/or may need to be rebuilt (e.g., initialized). The initialization may comprise reconstructing storage metadata from the contents of the first storage device (e.g., through queries to the first storage device as described above in conjunction with FIG. 24B).

At step 2630, the method iterates over media storage locations of the storage device. The iteration may comprise accessing a sequence of media storage locations on the non-volatile storage medium, as described above in conjunction with FIG. 23.

At step 2640, for each media storage location, the method 2600 access data formatted in the contextual, log-based format described above. The method 2600 may reconstruct the storage metadata using information determined from the contextual, log-based data format on the non-volatile storage media 122. Using the contextual, log-based data format, the method 2600 may determine the LIDs associated with the data, may determine whether the data is valid (e.g., using persistent notes and/or sequence indicators as described above), and so on. Alternatively, step 2640 may comprise issuing queries to another storage device to iteratively determine which media storage locations comprise valid data. The iterative query approach (described above in conjunction with FIG. 24B) may be used to mirror a storage device.

In addition, at step 2650, the method 2600 determines whether a particular data packet is designated as being ephemeral. The determination may be based on an ephemeral indicator in a header of the packet. The determination may also comprise determining whether a persistent note that removes the ephemeral designation exists (e.g., a persistent note as described above in conjunction with FIG. 25B). Accordingly, step 2650 may comprise the method 2650 maintaining the metadata for the packet in a temporary (e.g., ephemeral) location, until the iteration of step 2630 completes and the method 2600 can determine whether a persistent note removing the ephemeral designation exists.

If step 2650 determines that the data is ephemeral, the flow continues to step 2660; otherwise, the flow continues to step 2670. At step 2660, the method 2600 removes the ephemeral data. Removing the data may comprise omitting LIDs associated with the data from storage metadata (e.g., the index 1204 described above), marking the media storage location as "invalid" and available to be reclaimed (e.g., in the reverse map 1222), or the like.

At step 2670, the method reconstructs the storage metadata as described above. In some embodiments, step 2670 may further comprise determining whether the data is valid (as described above in conjunction with FIG. 24B). If the data is valid, the method 2600 may be configured to perform further processing. For example, if the method 2600 is being used to construct a mirror of another storage device, step 2670 may comprise transferring the valid data to the mirror device.

At step 2680, the flow ends.

In some embodiments, the storage layer 130 may provide an API to order storage operations performed thereon. For example, the storage layer 130 may provide a "barrier" API to determine the order of operations. As used herein, a "barrier"

refers to a primitive that enforces an order of storage operations. A barrier may specify that all storage operations that were issued before the barrier are completed before the barrier, and that all operations that were issued after the barrier complete after the barrier. A barrier may mark a "point-in-time" in the sequence of operations implemented on the non-volatile storage device.

In some embodiments, a barrier is persisted to the non-volatile storage media as a persistent note. A barrier may be stored on the non-volatile storage media, and may, therefore, act as a persistent record of the state of the non-volatile storage media at a particular time (e.g., a particular time within the sequence of operations performed on the non-volatile storage media). The storage layer 130 may issue an acknowledgement when all operations issued previous to the barrier are complete. The acknowledgement may include an identifier that specifies the "time" (e.g., sequence pointer) corresponding to the barrier. In some embodiments, the storage layer 130 may maintain a record of the barrier in the storage metadata maintained thereby.

Barriers may be used to guarantee the ordering of storage operations. For example, a sequence of write requests may be interleaved with barriers. Enforcement of the barriers may be used to guarantee the ordering of the write requests. Similarly, interleaving barriers between write and read requests may be used to remove read before write hazards.

Barriers may be used to enable atomic operations (similarly to the ephemeral designation described above). For example, the storage layer 130 may issue a first barrier as a transaction is started, and then issue a second barrier when complete. If the transaction fails, the storage layer 130 may "roll back" the sequence of storage operations between the first and second barriers to effectively "undo" the partial transaction. Similarly, a barrier may be used to obtain a "snapshot" of the state of the non-volatile storage device at a particular time. For instance, the storage layer 130 may provide an API to discover changes to the storage media that occurred between two barriers.

In another example, barriers may be used to synchronize distributed storage systems. As described above, a second storage device may be used to mirror the contents of a first storage device. The first storage device may be configured to issue barriers periodically (e.g., every N storage operations). The second storage device may lose communication with the first storage device for a certain period of time. To get back in sync, the second storage device may transmit its last barrier to the first storage device, and then may mirror only those changes that occurred since the last barrier.

Distributed barriers may also be used to control access to and/or synchronize shared storage devices. For example, storage clients may be issued a credential that allows access to a particular range of logical identifiers (read only access, read/write, delete, etc.). The credentials may be tied to a particular point or range in time (e.g., as defined by a barrier). As the storage client interacts with the distributed storage device, the credential may be updated. However, if a storage client loses contact with the distributed storage device, the credential may expire. Before being allowed access to the distributed storage device, the client may first be required to access a new set of credentials and/or ensure that local data (e.g., cached data, etc.), is updated accordingly.

Figure 27:
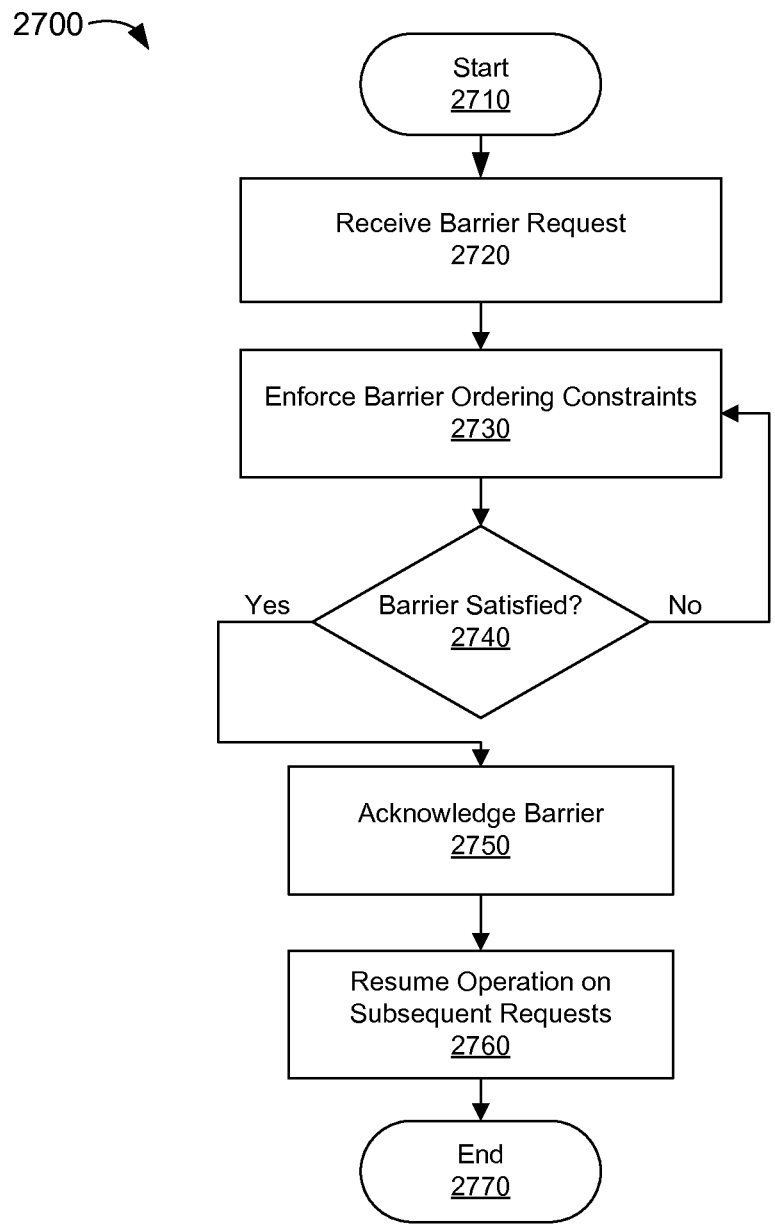
FIG. 27 is a flow diagram of one embodiment of a method ordering storage operations using barriers.

FIG. 27 is a flow chart of one embodiment of a method for providing barriers in a non-volatile storage device. At step 2710, the method 2700 starts and is initialized as described above. At step 2720, a request to issue a barrier is received. The request may be received from a storage client and/or as part of a high-level API provided by the storage layer 130 (e.g., an atomic write, transaction, snapshot, or the like).

At step 2730, the method 2700 enforces the ordering constraints of the barrier. Accordingly, step 2730 may comprise causing all previously issued storage requests to complete. Step 2730 may further comprise queuing all subsequent requests until the previously issued requests complete, and the barrier is acknowledged (at step 2740).

At step 2740, the method 2700 determines if the ordering constraints are met, and if so, the flow continues to step 2750; otherwise, the flow continues at step 2730.

At step 2750, the barrier is acknowledged, which may comprise returning a current "time" (e.g., sequence indicator) at which the operations issued before the barrier were completed. Step 2750 may further comprise storing a persistent note of the barrier on the non-volatile storage. At step 2760, the method resumes operation on storage requests issued subsequent to the barrier at step 2720. At step 2770, the flow ends until a next request for a barrier is received.

In some embodiments, the storage layer 130 leverages the logical address space 134 to manage "logical copies" of data (e.g., clones). As used herein, a copy or clone refers to replicating a range (or set of ranges) within the logical address space 134. The clone may be assigned different logical identifiers, but may be bound to the same media storage locations, allowing two or more LIDs to reference the same data. Logical copies may be useful for deduplication, snapshots, atomic operations (e.g., atomic writes, transactions, etc.), and the like.

Creating a clone may comprise updating the logical interface of data stored on the non-volatile storage media; the modification may comprise referencing the data by two (or more) LIDs (or LID ranges) as opposed to a single LID (or LID range). As such, creating a clone of a LID (or set of LIDs) may comprise allocating new LIDs in the logical address space 134 (or dedicated portion thereof), and binding the new LIDs to the same media storage locations as the original LIDs.

Figure 28A:
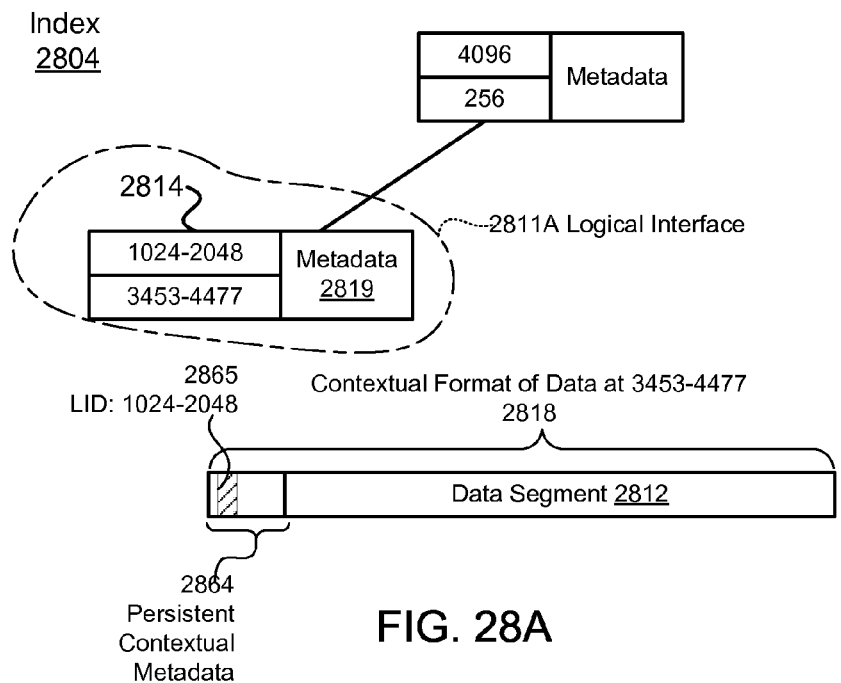
FIG. 28A depicts one embodiment of storage metadata for managing a clone of data in a contextual format.

FIG. 28A depicts one example of a clone operation. A clone operation may be implemented in response to a request from a storage client and/or as part of a higher-level API provided by the storage layer 130, such as an atomic operation, snapshot, transaction, or the like. FIG. 28A depicts the index 2804 before the clone is created. The index 2804 comprises an entry 2814 that binds LIDs 1024-2048 to media storage locations 3453-4477. The entry 2814, and the bindings thereof, define a logical interface 2811A through which storage clients 116 may reference the data segment 2812. The contextual format of the data at the media storage locations 3453-4477 is also depicted; in the FIG. 28A example, the contextual format comprises a packet format 2818 on the non-volatile storage media 122, which comprises persistent contextual metadata 2864, as described above. The persistent contextual metadata 2864 identifies the logical interface of the data segment 2812 (logical interface metadata 2865), which may comprise associating the data segment 2812 with logical identifiers of the entry 2814. The logical interface metadata 2865 indicates that the data segment 2812 pertains to LIDs 1024-2048. As described above, the contextual data format 2818 may allow the index 2804 to be reconstructed. The entry 2814 in the index 2804 may be reconstructed by associating the data at media address 3453-4477 with the corresponding logical identifiers (LID 1024-2048) in the persistent contextual metadata of the packet 2818. Although, FIG. 28A depicts a single packet 2818, the disclosure is not limited in this regard. In some embodiments, the data of the entry 2814 may be stored in multiple, different packets 2818, each comprising respective persistent contextual metadata 2864 (e.g., a separate packet for each media storage location, etc.).

Figure 28B:
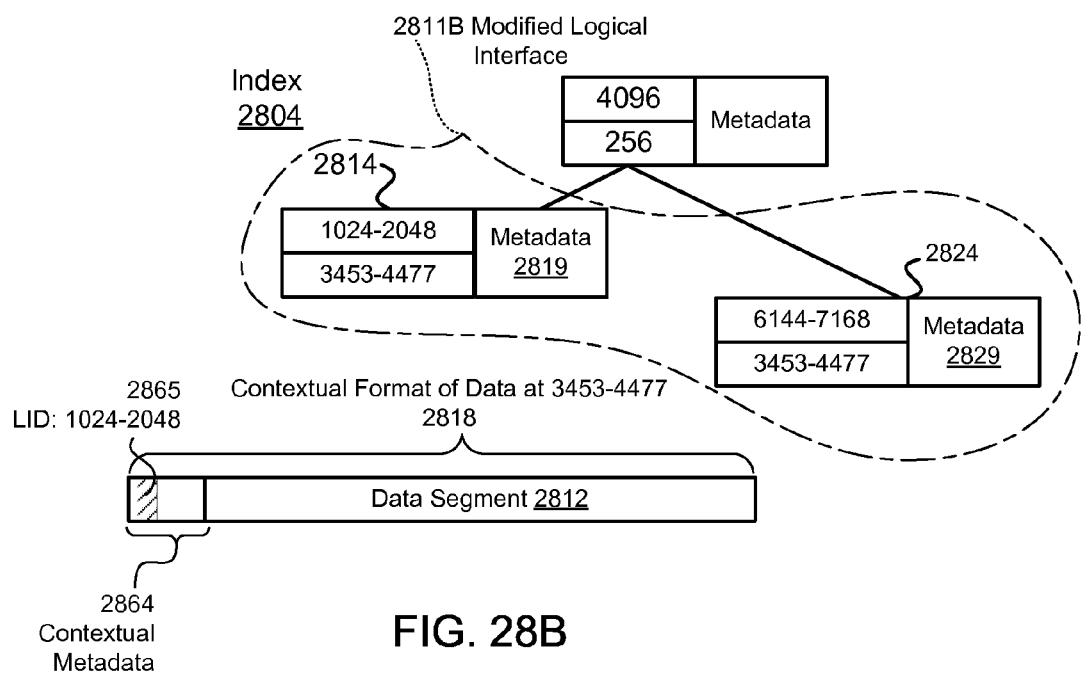
FIG. 28B-F depict embodiments of clone operations.

Creating a clone of the entry 2814 may comprise allocating one or more LIDs in the logical address space 134, and binding the new LIDs to the same data segment 2812 as the entry 2814 (e.g., the data segment at media storage location 3453-4477). The clone may, therefore, modify the logical interface of the data segment 2812. As depicted in FIG. 28B, the logical interface of the data 2811B associates the data segment 2812 with multiple, different LIDs (1024-2048 and 6144-7168), rather than only a single range of LIDs (1024-2048). FIG. 28B depicts the index 2804 comprising the modified logical interface of the data segment 2812.

In the FIG. 28B example, the index 2804 comprises a new entry 2824 to represent the clone. The clone may be assigned LIDs 6144-7168. The new entry 2824 may be bound to the same media storage location as entry 2814 (media storage locations 3453-4477). The clone results in modifying the logical interface 2811B of the data segment 2812; the logical interface of the data segment 2812 includes 1024-2048 and 6144-7168 (entries 2814 and 2824). The modified logical interface provides for accessing the data segment 2812 through either LIDs 1024-2048 or 6144-7168, as opposed to only LIDs 1024-2048.

The modified logical interface 2811B of the clone is inconsistent with the contextual format of the data segment 2812 on the non-volatile storage media 122. As described above, the persistent contextual metadata 2864 of the data segment 2812 comprises logical interface metadata 2865 that associates the data segment 2812 with only LIDs 1024-2048 of the logical interface 2811A, and not LIDs 1024-2048 and 6144-7168 of the modified logical interface 2811B. The contextual format of the data 2818 may need to be updated to be consistent with the modified logical interface 2811B (e.g., updated to associate the data with LIDs X and Y, as opposed to only X).

Updating the contextual format of the data may comprise updating the persistent contextual metadata 2864 of the contextual data format on the non-volatile storage media 122. Due to the append only, write out-of-place properties of a log maintained by the storage layer 130, updating the contextual format of the data segment 2812 may comprise relocating the data segment 2812 to a new storage location on the non-volatile storage media 122, which may be a time-consuming processes; this may be particularly inefficient if the data segment 2812 is large and/or the clone comprises a large number and/or range of LIDs.

Therefore, in some embodiments, the storage layer 130 may defer updating the contextual format of the data 2818. The storage layer 130 may be configured to provide access to the data in the inconsistent contextual format 2818. The storage layer 130 may return from and/or acknowledge the clone operation before the data is relocated in the updated contextual format. The data may be subsequently rewritten (e.g., relocated) in the updated contextual format on the non-volatile storage media 122 using another process, which may be outside of the "critical path" of the clone operation and/or other storage operations. In some embodiments, the data segment 2812 is relocated using the groomer 370, or the like. Accordingly, storage clients 116 may be able to access the data segment 2812 through the modified logical interface 2811B (both 1024-2048 and 6144-7168) without waiting for the contextual format of the data segment 2812 to be updated to be consistent with the modified logical interface 2811B.

In some embodiments, a clone operation may further comprise storing a persistent note on the non-volatile storage media 122 to make a clone operation persistent and/or crash safe. The persistent note may an indicator of the modified logical interface 2811B (e.g., associate the data with logical identifiers of the modified logical interface). Until the contextual format of the data segment 2812 is updated on the non-volatile storage media 122, the modified logical interface 2811B of the data segment 2812 may exist only in the index 2804. Therefore, if the index 2804 is lost, due to, inter alia, power failure or data corruption, the clone operation may not be reflected in the reconstructed storage metadata 135 (the clone operation may not be persistent and/or crash safe). When the contextual format of the data at 3453-4477 is accessed, the logical interface metadata 2865 of the persistent contextual metadata 2864 indicates that the data is associated only with LIDs 1024-2048, not 1024-2048 and 6144-7168. Therefore, only entry 2814 will be reconstructed (as in FIG. 28A), and 2824 will be omitted; moreover, subsequent attempts to access the data segment 2812 through the modified logical interface 2811B (e.g., through 6144-7168) may fail. A clone may be made persistent and crash safe by storing a persistent note on the non-volatile storage media when the clone is created. The persistent note may comprise an indicator that data segment 2812 is associated with both LID 1024-2048 and 6144-7168 (e.g., the persistent note may comprise the modified logical interface 2811B of the data segment 2812). During reconstruction of the index 2804, the persistent note may allow the node 2824 to be created. In some embodiments, the storage layer 130 may acknowledge completion of a clone operation when the persistent note is written to the non-volatile storage media 122 (and/or when the storage layer 130 can reasonably guarantee that the persistent note will be written to the non-volatile storage media 122).

Figure 28C:
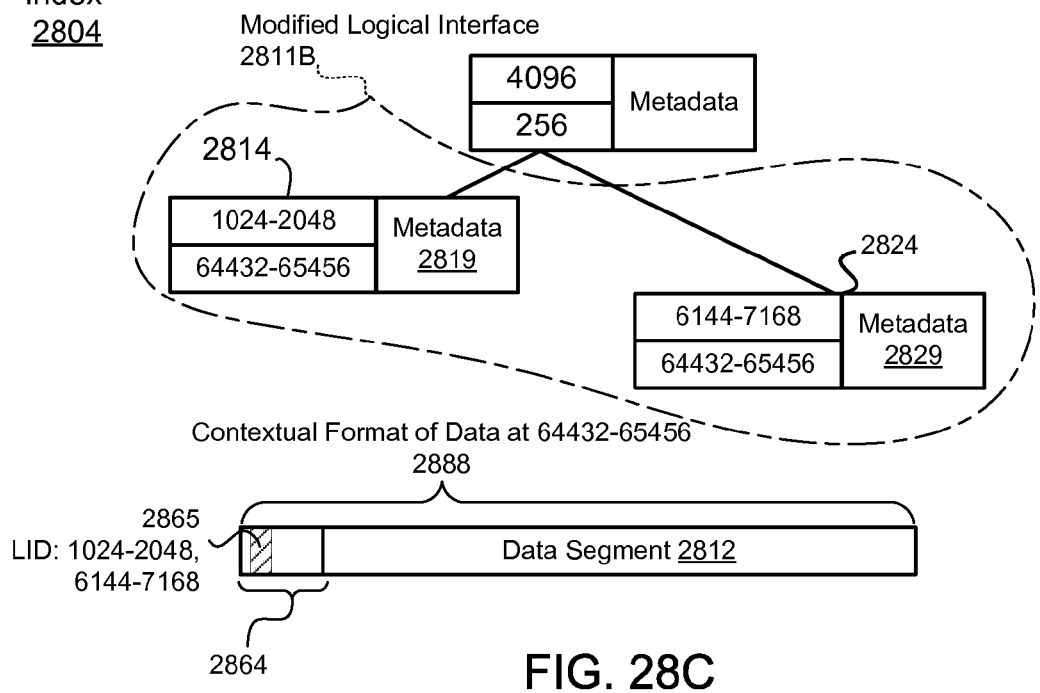

The storage layer 130 may be configured to store the data segment 2812 in an updated contextual format that is consistent with the modified logical interface 2811B. In some embodiments, the updated contextual format may comprise associating the data segment 2812 with LIDs of both logical copies (e.g., both LIDs 1024-2048 and 6144-7168). FIG. 28C depicts one example of an updated contextual format 2888 for the data segment 2812. As shown in FIG. 28C in one embodiment, the logical interface metadata 2865 indicates that the data segment 2812 is associated with LIDs 1024-2048 and 6144-7168 (as opposed to only 1024-2048). The updated contextual format of the data 2888 was stored on a new storage location (64432-65456), which is reflected in the entries 2814 and 2824 in the index 2804. In response to updating the contextual format of the data 2888, the persistent note may be invalidated (removed or marked for subsequent removal) from the non-volatile storage media 122.

Alternatively, or in addition, the index 2804 may be stored in a persistent crash safe storage location (e.g., non-transitory storage media 114 and/or non-volatile storage device 120). In response, the persistent note corresponding to the clone may be removed, even if the contextual format 2818 of the data has not yet been updated on the non-volatile storage media 122.

Storage operations that occur after creating a clone may cause the copy to diverge from the original (e.g., the entries 2814 and 2824 may diverge). For example, when data is written to LIDs of the clone entry 2824 the media storage locations to which the LIDs 2824 are bound may change (due to write out-of-place storage operations). Other storage operations may cause changes to the logical identifier range of the entries 2814 and/or 2824. For instance, appending data to a LID range may cause one of the logical address ranges 2814 or 2824 to be expanded, deleting data may remove portions of a logical address ranges 2814 or 2824, and so on.

The size of the persistent contextual metadata 2864 may be limited, and as such, separately listing each logical identifier within the logical interface metadata 2865 may be limiting (e.g., may limit the number of clones that can reference a particular data segment).

In some embodiments, the storage layer 130 may maintain "reference entries" to facilitate efficient cloning operations (as well as other operations, described below). As used herein, a reference entry refers to an entry that only exists while it is being referenced by one or more entries in the logical address space 134. Accordingly, a reference entry "does not exist" in its own right, but only exists as long as it is being referenced. In some embodiments, reference entries may be immutable. The storage layer 130 may monitor the reference entries, and may remove reference entries that are no longer being referenced by any other entries in the index. In some embodiments, reference entries may be maintained in a separate portion of the storage metadata 135; reference entries may be maintained in a separate index and/or namespace than other entries in the index 2804. Accordingly, reference entries may be indexed by and/or identified using identifiers that are distinguishable from the logical identifiers of the logical address space 134. Alternatively, reference entries may be assigned logical identifiers selected from a pre-determined range and/or portion of the logical address space 134. The reference entries may not be directly accessible by storage clients 116 via the storage layer 130. Instead, storage clients may reference the data of a reference entry through other entries within the logical address space 134.

Reference entries may be referenced by (e.g., linked to) indirect entries. Accordingly, as used herein, an indirect entry refers an entry in the logical address space 134 that references and/or is linked to a reference entry. Indirect entries may be assigned a logical identifier within the logical address space 134, and may be accessible to the storage clients 116. Indirect entries may reference and/or link to one or more reference entries. Indirect entries may also comprise "local" LIDs like any other entry in the logical address space 134. To access data associated with an indirect entry, the "local" LIDs of the indirect entry may be searched first and, if the LID is not found locally, the search may continue at the reference entries to which the indirect entry is linked. Accordingly, an indirect entry may implement a cascade lookup comprising a local lookup within local LIDs of the indirect entry (if any) and one or more indirect lookups at one or more reference entries linked to the indirect entry.

Figure 28D:
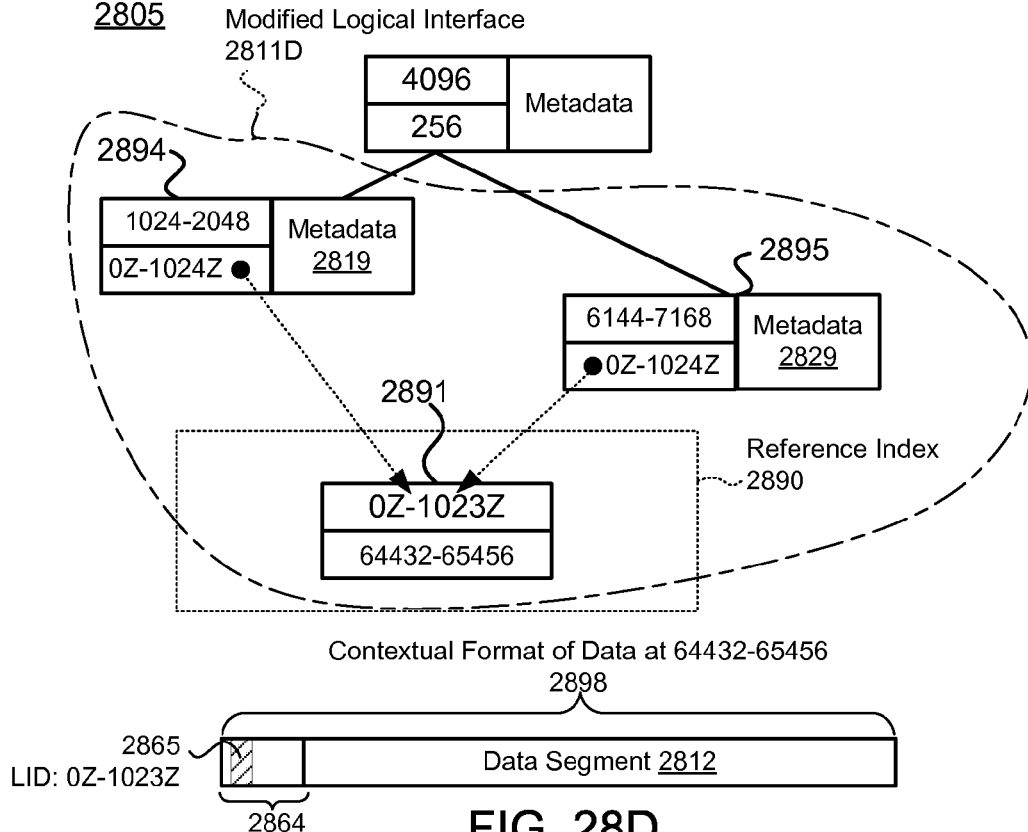

In some embodiments, reference entries may be used to represent cloned (or duplicate) data. A single reference entry may represent the cloned data segment, and a plurality of entries may reference the data segment through respective indirect entries. FIG. 28D depicts one embodiment of an index 2805 comprising a reference entry 2891. In the FIG. 28D example, the reference entry 2891 represents the clone of the data segment 2812 of LIDs 1024-2048 to LIDs 6144-7168, as described above.

In response to a request to create a clone of the data segment 2812 (e.g., to clone LIDs 1024-2048), the storage layer 130 may be configured to create a new reference entry 2891 in a designated portion of the index 2805 (e.g., the reference index 2890), or in a separate datastructure or index. The reference entry 2891 may represent the cloned data segment 2812 and may be referenced by any number of entries in the index 2805. As depicted in FIG. 28D, the reference entry 2891 may be bound to the media storage locations of the cloned data segment 2812 (media storage locations 3453-4477). The reference entry 2891 may be assigned an identifier (e.g., 0Z-1023Z). The identifier in the indirect entry 2894 linking to the reference entry 2891 may be in a separate namespace than the logical address space 134 of the index 2805 (e.g., selected from a separate set of identifiers). Alternatively, in some embodiments, the reference entry 2891 may be assigned LIDs within a designated portion or range of logical address space 134. The reference entry 2891 may not be directly accessible by storage clients 116 via the storage layer 130 interface 130. As described below, the reference entry 2891 may be referenced through one or more indirect entries 2894 and/or 2895.

The clone may further comprise modifying the logical interface 2811D of the data segment 2812 in accordance with the clone operation; the modified logical interface 2811D may allow the data segment 2812 to be referenced through the LIDs 1024-2048 of the indirect entry 2894 and the LIDs 6144-7168 of the indirect entry 2895. The indirect entries 2814 and 2824 may link to (e.g., reference) the reference entry 2891 as opposed to directly referencing the media storage locations of the data segment 2812. Although the reference entry 2891 may not be used by storage clients 116 to reference the clone, the reference entry 2891 may be included in the modified logical interface 2811D, since the reference entry 2891 is used to reference the data by other layers of the storage system (e.g., the storage controller 124, storage layer 130, and so on).

Creating the clone may further comprise storing a persistent note on the non-volatile storage media 122, as described above. The persistent note may identify the reference entry 2891, as well as the entries 2894 and 2895 that reference or are linked to the reference entry 2891. The persistent note may make the clone operation persistent and crash safe, and may be retained on the non-volatile storage media 122 until the data segment 2812 is relocated in an updated contextual format 2898 and/or the index 2805 (and/or reference index 2890) are persisted, as described above.

As described above, the modified logical interface 2811D of the data segment 2812 is inconsistent with the contextual format of the data 2818. As depicted in FIGS. 28A-B, the contextual format of the data 2898 indicates that the logical interface 2811D to the data segment 2812 includes LIDs 1024-2048, and does not identify the reference entry identifiers 0Z-1024Z and/or the identifiers of the clone 6144-7168. As such, the data segment 2812 may be relocated (e.g., rewritten) in an updated contextual format 2898. The contextual format 2898 may comprise persistent contextual metadata 2864, as described above. The logical interface indicator 2865 may associate the data segment 2812 with the reference entry 2984 (e.g., 0Z-1023Z), as opposed to separately identifying the LIDs that reference the data segment 2812. Accordingly, the use of the indirect entry 2894 allows the logical interface 2811D of the data segment 2812 to comprise any number of LIDs, independent of size limitations of the contextual data format 2898 (e.g., independent of the number of LIDs that can be included in the logical interface metadata 2865). Moreover, additional logical copies of the reference entries 2891 may be made without updating the contextual format of the data on the non-volatile storage media 122.

In some embodiments, each time a LIDs is allocated, the LID may be linked to a corresponding reference entry in the reference index 2890 (e.g., a clone with a single copy). The approach may result in an additional layer of mapping for the new LIDs, however the use of reference entries may facilitate the creation of clones (and/or deduplication). Creating a clone may comprise linking new LIDs to the reference entries (as discussed above), without updating the contextual format of the data. An update to the contextual format of the data may not be required because the existing contextual format already associates the data with reference entries (in the logical interface metadata), as described above. The new LIDs may be associated with the reference entries via a persistent note (or other persistent indicator), as described above, without rewriting and/or relocating the data.

Storage clients 116 may reference the data segment 2812 through the modified logical interface 2811D while (or before) the contextual format of the data 2898 is stored on the non-volatile storage media 122. In response to storing the data in the updated contextual format 2898 (or persisting the storage metadata 135), the persistent note may be invalidated and/or removed from the non-volatile storage media 122.

Figure 28E:
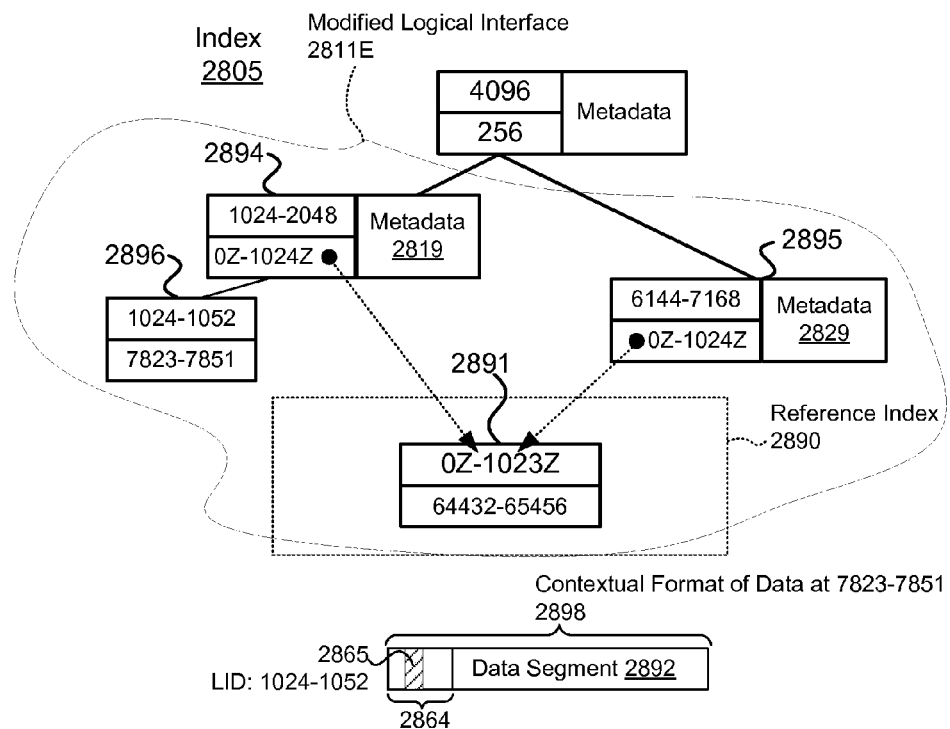

As described above, the indirect references 2894 and/or 2895 may comprise one or more "local" LIDs. Local LIDs may be used to reflect differences between the logical copies. For example, after the clone operation, a storage client may modify data at one of the clones (e.g., modify data at 1024-1052). The modification may comprise writing the data out of place on the non-volatile storage media 122 in a contextual format 2899, and updating the index 2805 to reference the updated data (stored on media storage locations 7823-7851). Updating the index 2805 may comprise adding a new "local" entry 2896 under the indirect entry 2894, as illustrated in FIG. 28E. The local entry 2896 directly references the media storage locations of the modified data (7923-7851) as opposed to a link to the reference entry 2891.

In response to a request pertaining to data 1024-1052 (or sub-set thereof), the storage layer 130 may search the indirect entry 2894, and may identify the local entry 2896. The local entry 2896 may then be used to satisfy the request (e.g., read data from media storage locations 7823-7851 rather than 64432-64460 per the reference entry 2891. However, requests for LIDs that are not found in the local entries (e.g., LIDs 1053-2048) may continue to be serviced using the reference entry 2891. Accordingly, the storage layer 130 may use the indirect entry 2894 and reference entry 2891 to implement a "cascade lookup" for logical identifiers pertaining to the clone. The logical interface 2811E of the data may, therefore comprise one or more local entries 2896 and/or one or more indirect and/or reference entries.

Figure 28F:
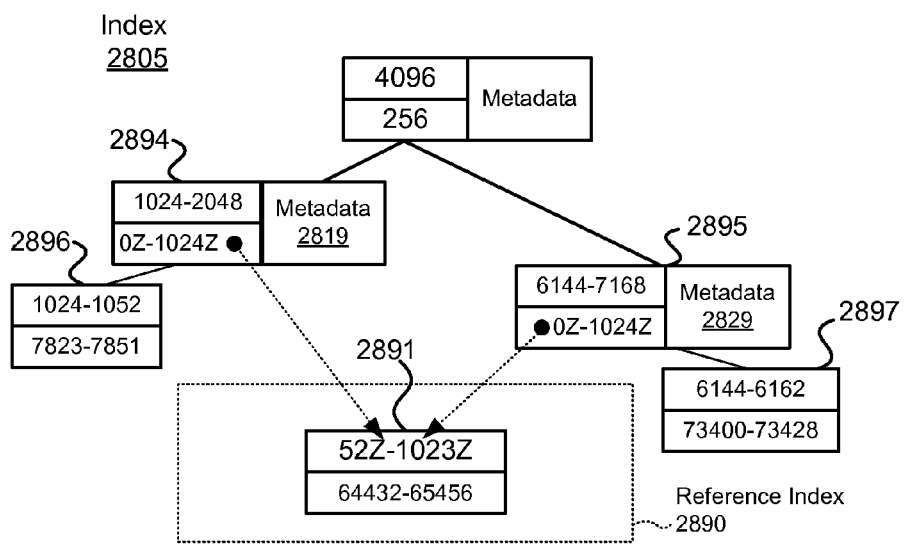

In a further example, illustrated in FIG. 28F, a storage client 116 may modify data of the clone through another one of the LIDs of the logical interface 2811E (e.g., LIDs 6144-6162); the logical interface delimiters are not shown in FIG. 28F to avoid obscuring the details of the embodiment. The modified data may be referenced using a local entry 2897 of the indirect entry 2895, as described above. Since each of the clones now has its own, respective copy of 0Z-52Z, that portion of the reference entry 2891 is no longer being referenced, and may be removed (as depicted in FIG. 28F). The clones may continue to diverge, until neither 2894 nor 2895 references any portion of the reference entry 2891, at which point the reference entry 2891 may be removed.

The storage layer 130 may be configured to "groom" the reference index 2890. In some embodiments, each reference index entry 2891 comprises metadata that includes a reference count (not shown). The reference count may be incremented as new references or links to the reference entry 2891 are added, and may be decremented in response to removing a reference to the entry 2891. In some embodiments, reference counts may be maintained for each identifier of the reference entry 2891 and/or within sub-ranges thereof. Alternatively, reference counts may be maintained for the reference entries 2891 as a whole. When a reference count reaches 0, the reference entry 2891 (or a portion thereof) may be removed from the reference index 2890. Removing a reference entry 2891 (or portion of a reference entry) may further comprise invalidating the corresponding data on the non-volatile storage media 122, as described above.

In another example, the storage layer 130 may remove reference entries using a "mark-and-sweep" approach. The storage layer 130 (or other process) may periodically check references to entries in the reference index 2890 by, inter alia, following links to the reference entries from indirect entries (or other types of entries) in the index 2805. Entries that are not referenced by any entries during the mark-and-sweep may be removed, as described above. The mark-and-sweep may operate as a background process, and may periodically perform a mark-and-sweep operation to garbage collect reference entries that are no longer in use.

The storage layer 130 may leverage the storage metadata 135 to perform other processes, such as deduplication. Referring to FIG. 3A, a deduplication module 374 may be configured to identify duplicated data on the non-volatile storage media 122. Duplicated data may be identified using any suitable mechanism. In some embodiments, duplicated data is identified using a data signature, which may comprise a signature, hash code, cyclic code, or the like. The signature may be stored within the index 2805 (e.g., in metadata associated with the entries) and/or may be maintained and/or indexed separate datastructure (not shown). The deduplication module 374 may compare data signatures and, upon detecting a signature match, may deduplicate the data. Deduplicating data may comprise verifying the signature match (e.g., performing a byte to byte comparison), creating a reference entry to represent the duplicated data, and/or linking one or more indirect entries to the reference entry.

Figure 28G:
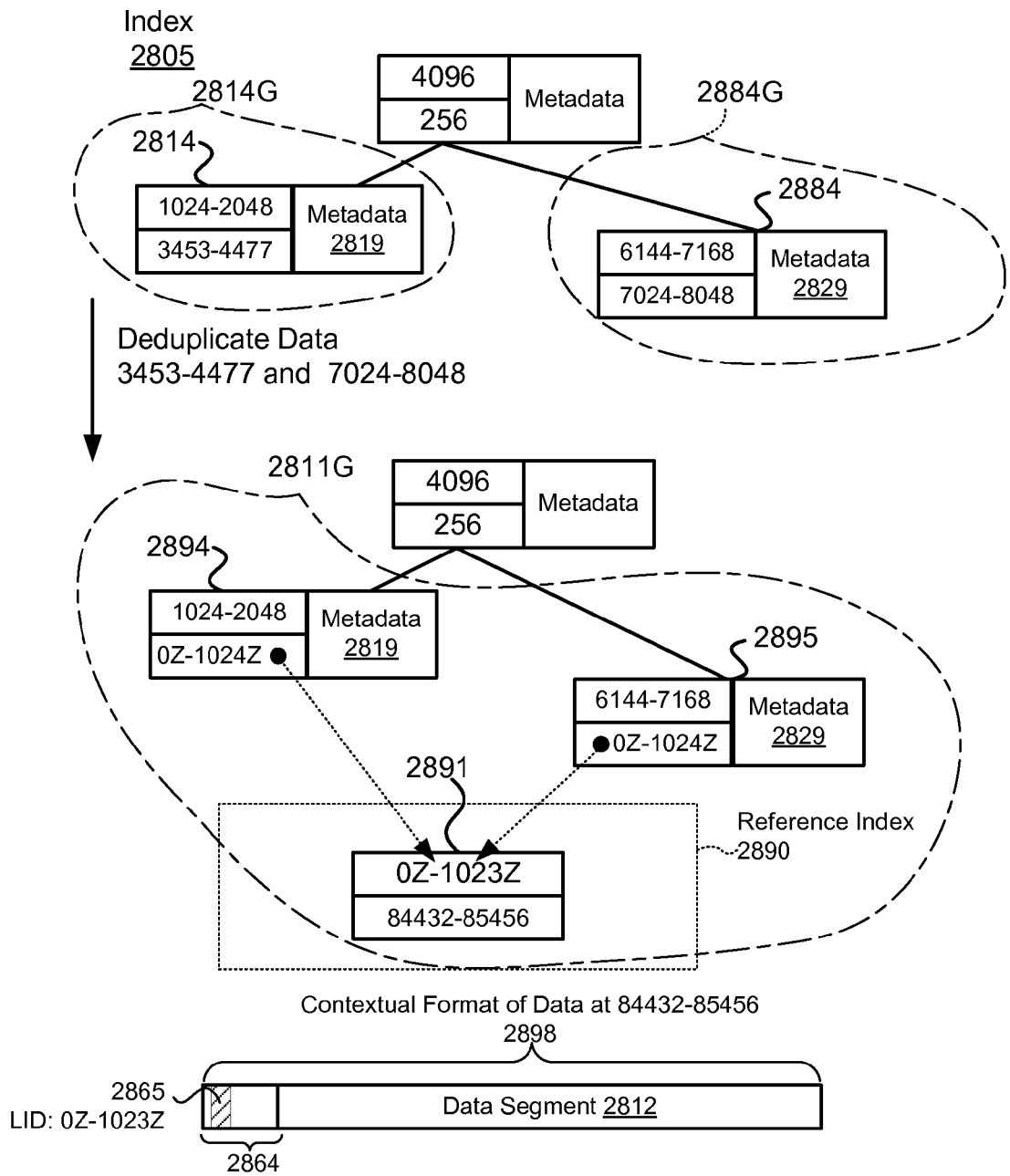
FIG. 28G depicts a deduplication operation.

FIG. 28G illustrates one example of storage metadata for managing deduplication. The index 2805 may comprise entries 2814 and 2884, which may reference duplicated data (e.g., duplicated data segment 2812) stored at different respective media storage locations on the non-volatile storage media 3453-4477 and 7024-8048, having different, respective logical interfaces 2814G and 2884G. The duplicated data segment 2812 may be identified and/or verified by the deduplication module 374, as described above. Alternatively, the duplicated data may be identified as data is received for storage on the non-volatile storage device 122. Accordingly, the data may be deduplicated before an additional copy of the data is stored on the non-volatile storage media 122.

In response to identifying and/or verifying that entries 2814 and 2884 reference duplicate data, the storage layer 130 may be configured to deduplicate the data, which may comprise modifying the logical interface 2811G of the duplicated data to associate a single "version" of the data segment 2812 with both sets of LIDs 1024-2048 and 6144-7168, as in the clone examples above.

One of the clones of the data may be invalidated and/or removed from the non-volatile storage media 122 and a reference entry 2891 may represent a single copy of the data segment 2812; indirect entries 2894 and 2895 may be linked to the reference entry 2891, as described above, resulting in the logical interface 2811G of the data segment 2812 being referenced by both sets of LIDs 1024-2048 and 6144-7168. Deduplicating the data may further comprise storing a persistent note on the non-volatile storage media 122 to associate the data segment 2812 with the updated logical interface 2811G thereof (e.g., associate the data segment 2812 with the reference entry 2891 and/or the linked indirect entries 2894 and 2895), as described above.

The modified logical interface 2811G of the data may be inconsistent with the contextual format of the data on the non-volatile storage media 122 (e.g., the contextual format may associate the data with only one of the set of LIDs 1024-2048 or 6144-7168). The contextual format of the data may be updated to be consistent with the modified logical interface 2811G, as described above. Updating the contextual format may comprise relocating (e.g., rewriting) the data segment 2812 in an updated contextual format 2898 to new media storage locations (e.g., media storage locations 84432-84556). The updated contextual format 2898 may comprise persistent contextual metadata 2864 that includes logical interface metadata 2865 to associates the data segment 2812 with the reference entry 2891 (e.g., identifiers 0Z-1023Z), as described above. The updated contextual format 2898 may be written out-of-place to other media storage location of the non-volatile storage media 122 and/or on another non-volatile device 120A-N.

Although FIGS. 28A-G depict cloning and/or deduplicating a single entry or range of LIDs, the disclosure is not limited in this regard. In some embodiments, a plurality of LID ranges may be cloned in a single clone operation. For example, referring back to FIG. 12, a cloning operation may clone the entry 1214 along with all of its child entries. In another example, a clone operation may comprise copying the entire contents of the index 1204 (e.g., all of the entries in the index 1204). This type of clone operation may be used to create a "snapshot" of a logical address space 134 (or a particular LID range). As used herein, a snapshot refers to the state of a storage device (or set of LIDs) at a particular point in time. The snapshot may persist the state of the copied logical address range despite changes to the original.

The storage layer 130 may provide other functionality involving the modification of the logical interface of data, providing access to the data in a contextual format that is inconsistent with the modified logical interface, and updating the contextual format of the data to be consistent with the modified logical interface. For example, in some embodiments, the storage layer 130 provides an move operation. As used herein, a move operation comprises modifying the logical interface of a data segment (e.g., changing the LID of a data segment).

Figure 29A:
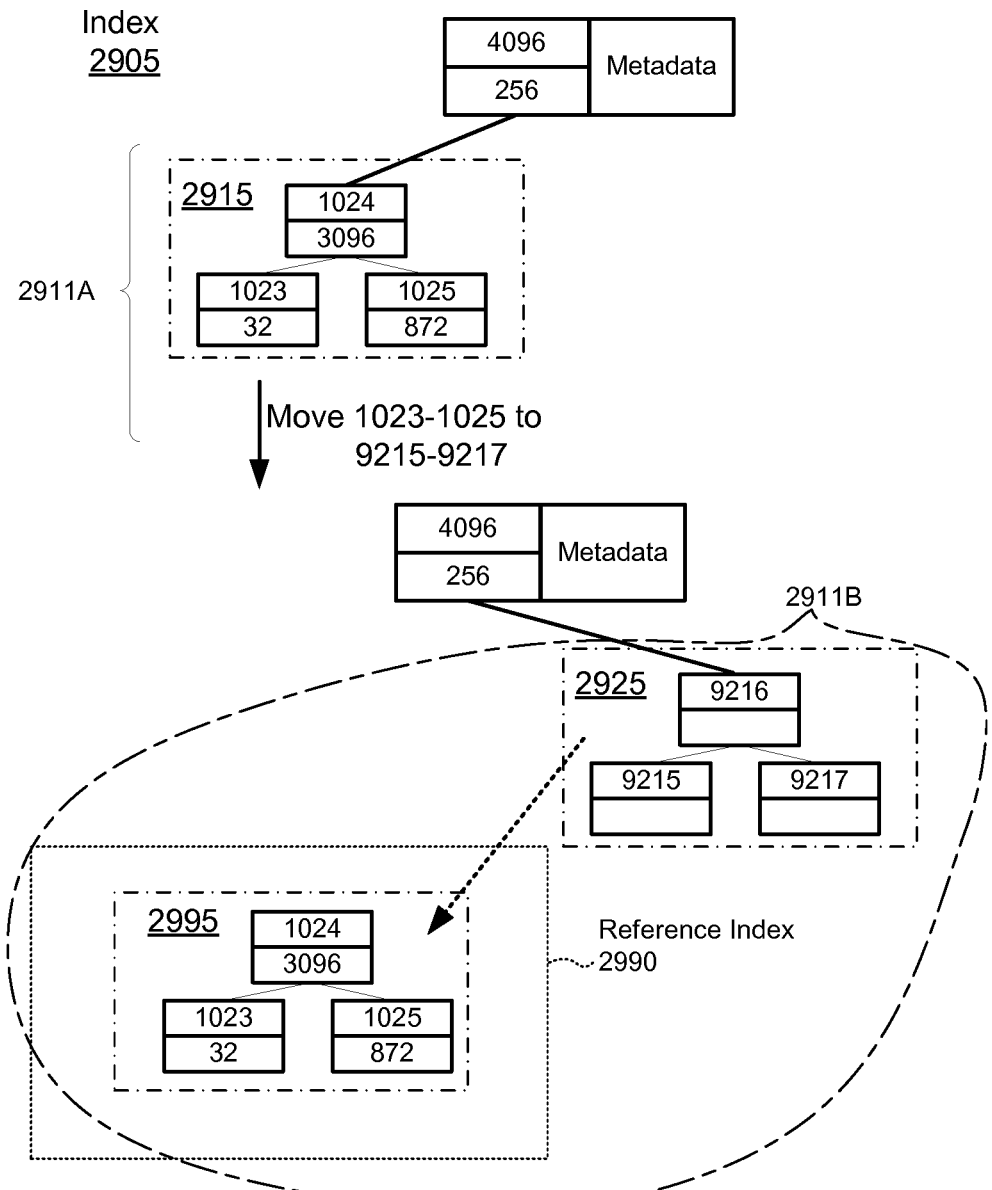

FIG. 29A depicts one example of a move operation. The index 2905 includes entries 2915 that bind LIDs 1023-1025 to respective data segments on the non-volatile storage media 122 (the logical interface of the data 2911A). The entries 2915 are depicted separately to better illustrate details of the embodiment, however, the entries 2915 could be included in a single entry comprising a range of LIDs 1023-1025.

The entries 2915 define a logical interface 2911A of the data stored at media storage locations 32, 3096, and 872. As described above, data of the entries 2915 may be stored on the non-volatile storage media 122 in a contextual format that associates the data with the LIDs 1023, 1024, and 1025.

A move operation may modify the logical interface to the data 2911B. A move operation may comprise removing the association between the LIDs 1023, 1024, and 1025 and the data at the respective media storage locations 32, 3096, and 872, and create a new logical interface 2911B for the data that includes a new set of LIDs (e.g., 9215, 9216, and 9217). The move operation may be requested by a storage client 116 (e.g., a request to rename a file), may be requested by the storage layer 130 to balance and/or defragment the index 2905, may flow from a request to relocate the entry entries 2915 to another portion of the index 2905, or the like.

In some embodiments, a move operation may comprise the storage layer 130 creating reference entries 2995 in a reference index 2990 to represent the move. The reference entries 2995 may comprise the pre-move LIDs 1023, 1024, and 1025 and media storage locations 32, 3096, and 872. The new logical interface of the data may be linked to the reference entries 2995 via indirect entries 2925. The indirect entries 2925 may include links to the reference entries 2995 in the reference index 2990, as described above.

The move operation may further comprise storing a persistent note on the non-volatile storage media to ensure that the move operation is persistent and crash safe. As discussed above, the contextual format of the data on the media storage locations 32, 3096, and 872 of the non-volatile storage media 122 may be inconsistent with the updated logical interface; the contextual format of the data may associate the respective data segments with LIDs 1023, 1024, and 1025 as opposed to 9215, 9216, and 9217. The persistent note may indicate the updated logical interface for the data, so that the storage metadata 135 (e.g., index 2905) can be correctly reconstructed from the contents of the non-volatile storage media 122 (if necessary).

The storage layer 130 may provide access to the data in the inconsistent contextual format through the modified logical interface 2911B (LIDs 9215, 9216, and 9217) the media storage locations 32, 3096, and 872. The data may be rewritten and/or relocated in a contextual format that is consistent with the modified logical interface 2911B subsequent to the move operation (and/or outside of the path of the move operation and/or other storage operations). For example, the data at 32, 3096, and/or 872 may be rewritten by a groomer process 370, as described above. Therefore, the clone operation may complete (and/or return an acknowledgement) when the index 2905 is updated, the corresponding persistent note is stored on the non-volatile storage media 122, and/or there is a reasonable guarantee that the persistent note will be stored on the non-volatile storage media 122 (e.g., the persistent note is inserted into the write pipeline 240, write buffer 244, or the like).

The index 2905 may be updated in response to storing data in the consistent contextual format. As illustrated in FIG. 29B, the data segment 2913 at media storage location 32 may be relocated in a grooming operation and, during grooming, may be stored in a contextual format that is consistent with the modified logical interface 2911B of the data, and the data segment 2913 with the logical identifier 9215 (e.g., the persistent contextual metadata 2964 comprises logical interface metadata 2965 that associates the data segment 2913 with LID 9215). As illustrated in FIG. 29B, the index 2905 may be updated to reference the data in the updated contextual format, which may comprise modifying the entry for 9215, such that it no longer is linked to the reference entry for 1023. Since no entry references 1023, it may be removed, and the data at 32 may be invalidated and/or removed from the non-volatile storage media 122, as described above.

The entries 2925 may implement the "cascade lookup" described above. For example, a storage request pertaining to LID 9215 may resolve to the "local" entry in 2925 (e.g., entry 9215), whereas a request pertaining to a LID that does not have a local entry (e.g., LID 9216 or 9217) results in linking to the reference entries 2995.

Referring to FIG. 29C, in another example, a storage client 116 may modify data at LID 9217. The result of the modification may comprise storing the modified data out-of-place and in a contextual format that is consistent with the modified logical interface 2911B (e.g., associates the data with LID 9217). In response, the index 2905 may be updated to associate 9217 with the media storage location of the modified data (e.g., media storage location 772), and to remove the reference entry for LID 1025, as described above.

As discussed above, in some embodiments, the reference index 2990 may be maintained separately from other entries in the index 2905, such that the entries therein (e.g., entries 2995) cannot be directly referenced by storage clients 116.

Figure 29D:
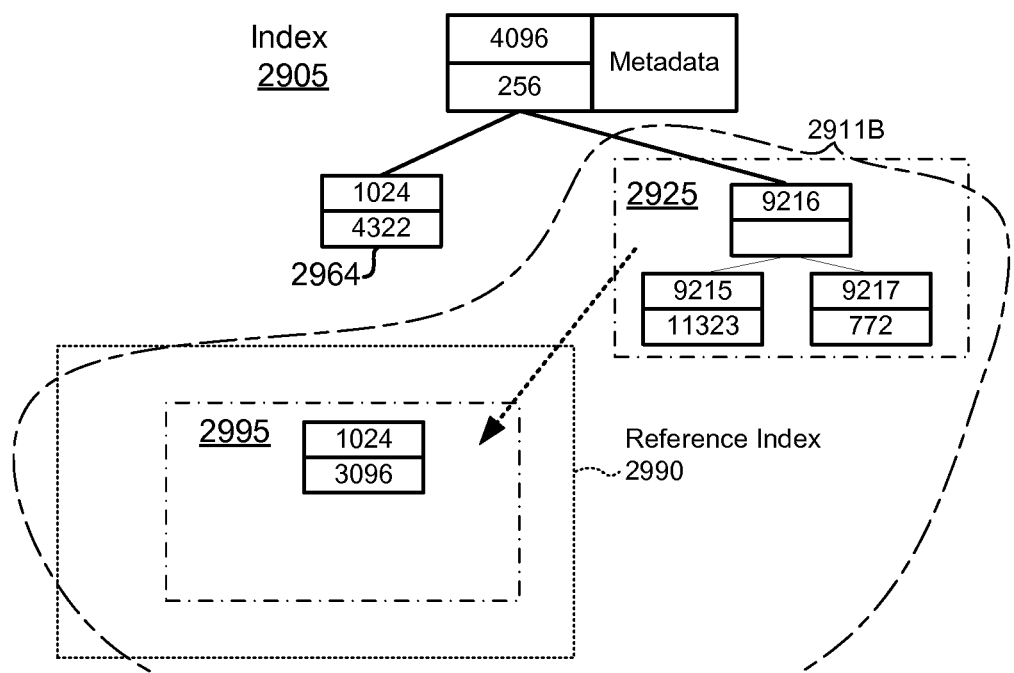

This segregation of the logical address space 134 may allow storage clients to operate more efficiently. For example, rather than stalling operations until data is rewritten and/or relocated in the updated contextual format on the non-volatile storage media 122, data operations may proceed while the data is rewritten in one or more processes outside of the path for servicing storage operations and/or requests. Referring to FIG. 29D, following the move operation described above, a storage client may store data in connection with the LID 1024. As illustrated in FIG. 29D, the LID 1024 may be included in the reference index 2990, due to inter alia the data at 3096 not yet being rewritten in the updated contextual format. However, since the reference index 2990 is maintained separately from the index 2905, a name collision may not occur, and the storage operation may complete. The index 2905 may include the entry 2964 comprising the logical interface for the data stored at media storage location 4322, while continuing to provide access to the data formerly bound to 1024 through the reference index 2990 through the logical interface 2911B.

When the entries 2925 are no longer linked, any entries in the reference index 2990, due to, inter alia, rewriting, relocating, modifying, deleting, and/or overwriting, the data, the last of the reference entries 2995 may be removed, and the entries 2925 may no longer be linked to reference entries in the reference index 2990. In addition, the persistent note associated with the move operation may be invalidated and/or removed from the non-volatile storage media 122, as described above.

Figure 30:
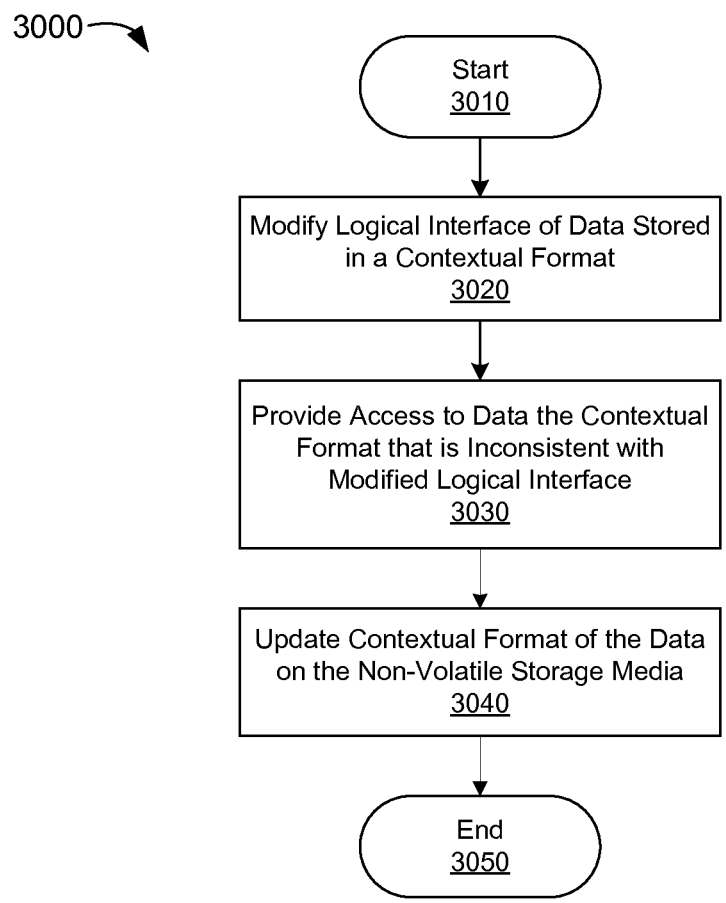
FIG. 30 is a flow diagram of one embodiment of a method for managing a logical interface of data storage in a contextual format on a non-volatile storage media.

FIG. 30 is a flow diagram of one embodiment of a method for managing a logical interface of data stored in a contextual format on a non-volatile storage media. At step 3010, the method 3000 starts and is initialized as described above.

Step 3020 may comprise modifying a logical interface of data stored in a contextual format on a non-volatile storage media. The logical interface may be modified at step 3020 in response to performing an operation on the data, which may include, but is not limited to: a clone operation, a deduplication operation, a move operation, or the like. The request may originate from a storage client 116, the storage layer 130 (e.g., deduplication module 374), or the like.

Modifying the logical interface may comprise modifying the logical identifier(s) associated with the data, which may include, but is not limited to: referencing the data using one or more additional logical identifiers (e.g., clone, deduplication, etc.), changing the logical identifier(s) associated with the data (e.g., a move), or the like. The modified logical interface may be inconsistent with the contextual format of the data on the non-volatile storage media 122, as described above.

Step 3020 may further comprise storing a persistent note on the non-volatile storage media 122 that identifies the modification to the logical interface. The persistent note may be used to make the logical operation persistent and crash safe, such that the modified logical interface (e.g., storage metadata 135) of the data may be reconstructed from the contents of the non-volatile storage media 122 (if necessary). Step 3020 may further comprise acknowledging that the logical interface has been modified (e.g., returning from an API call, returning an explicit acknowledgement, or the like). The acknowledgement occur (and access through the modified logical interface at step 3030) before the contextual format of the data is updated on the non-volatile storage media 122. Accordingly, the logical operation may not wait until the data is rewritten and/or relocated; as discussed below, updating contextual format of the data may be deferred and/or implemented in a processes that is outside of the "critical path" of the method 3000 and/or the path for servicing other storage operations and/or requests.

Step 3030 may comprise providing access to the data in the inconsistent contextual format through the modified logical interface of step 3020. As described above, updating the contextual format of the data to be consistent with the modified contextual interface may comprise rewriting and/or relocating the data on the non-volatile storage media, which may impose additional latency on the operation of step 3020 and/or other storage operations pertaining to the modified logical interface. Therefore, the storage layer 130 may be configured to provide access to the data in the inconsistent contextual format while (or before) the contextual format of the data is updated. Providing access to the data at step 3030 may comprise referencing and/or linking to one or more reference entries corresponding to the data (via one or more indirect entries), as described above.

Step 3040 may comprise updating the contextual format of the data on the non-volatile storage media 122 to be consistent with the modified logical interface of step 3020. Step 3040 may comprise rewriting and/or relocating the data to another media storage location on the non-volatile storage media 122 and/or on another non-volatile storage device 120A-N. As described above, step 3040 may be implemented using a process that is outside of the critical path of step 3020 and/or other storage requests performed by the storage layer 130; step 3040 may be implemented by another, autonomous module, such as groomer module 370, deduplication module 374, or the like. Accordingly, the contextual format of the data may be updated independent of servicing other storage operations and/or requests. As such, step 3040 may comprise deferring an immediate update of the contextual format of the data, and updating the contextual format of the data in one or more "background" processes, such as a groomer process. Alternatively, or in addition, updating the contextual format of the data may occur in response to (e.g., along with) other storage operations. For example, a subsequent request to modify the data may cause the data to be rewritten out-of-place and in the updated contextual format (e.g., as described above in connection with FIG. 29C).

Step 3040 may further comprise updating storage metadata 135 as the contextual format of the data is updated. As data is rewritten and/or relocated in the updated contextual format, the storage layer 130 may update the storage metadata 135 (e.g., index) accordingly. The updates may comprise removing one or more links to reference entries in a reference index and/or replacing indirect entries with local entries, as described above. Step 3040 may further comprise invalidating and/or removing a persistent note from the non-volatile storage media 122 in response to updating the contextual format of the data and/or persisting the storage metadata 135, as described above.

The method 3000 ends at step 3050 until a next logical operation is performed.

Figure 31:
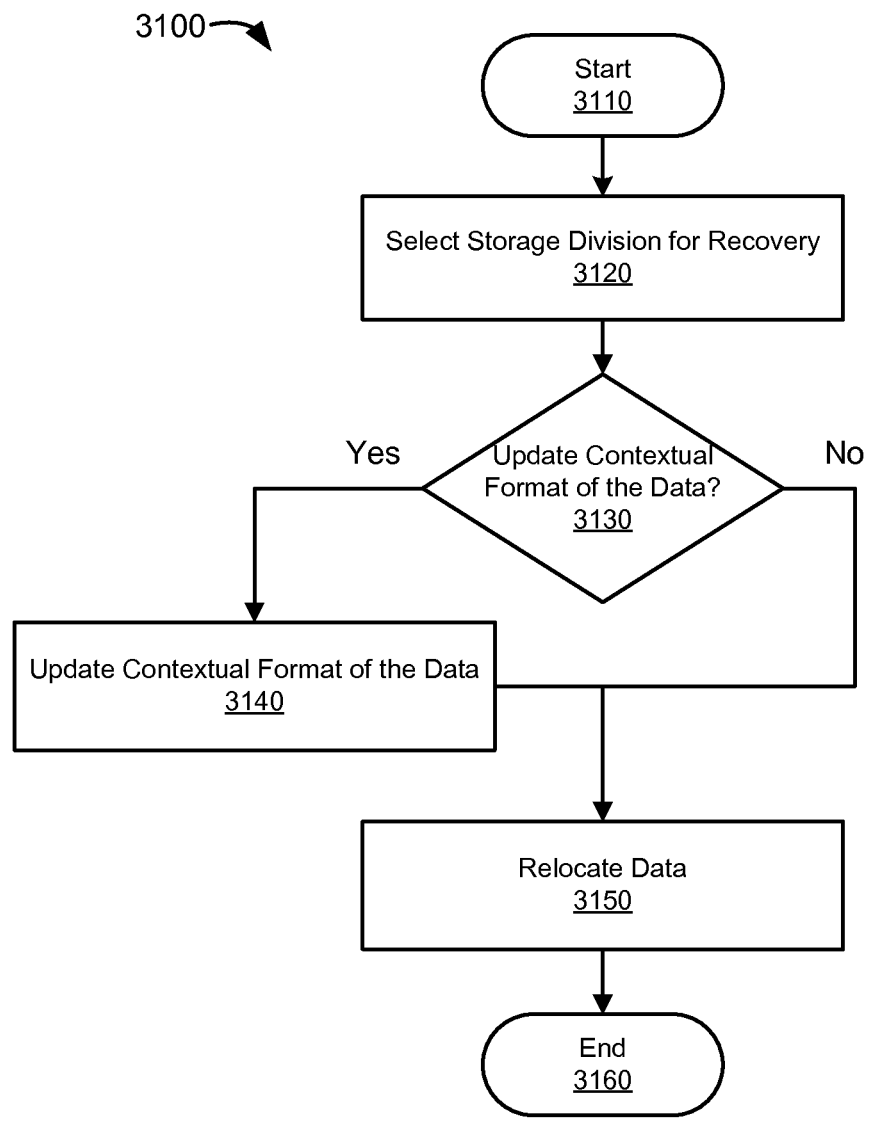
FIG. 31 is a flow diagram of one embodiment of a method for managing a logical interface of contextual data.

FIG. 31 is a flow diagram of another embodiment of a method for managing a logical interface of data stored in a contextual format on a non-volatile storage media. The method 3100 may be implemented by a groomer module 370. The disclosure, however, is not limited in this regard; method 3100 could be implemented by any process or module configured to operate outside of the path of storage operations of the storage layer 130 and/or capable of operating autonomously. At step 3110 the method 3100 starts and is initialized as described above.

Step 3120 comprises selecting a storage division for recovery, such as an erase block or logical erase block. As described above, the selection of step 3120 may be based upon a number of different factors, such as a lack of available storage capacity, detecting a percentage of data marked as invalid within a particular logical erase block reaching a threshold, a consolidation of valid data, an error detection rate reaching a threshold, improving data distribution, data refresh, or the like. Alternatively, or in addition, the selection criteria of step 3120 may include whether the storage division comprises data in a contextual format that is inconsistent with a corresponding logical interface thereof, as described above.

As discussed above, recovering (or reclaiming) a storage division may comprise erasing the storage division and relocating valid data thereon (if any) to other storage locations on the non-volatile storage media. Step 3130 may comprise determining whether the contextual format of data to be relocated in a grooming operation should be updated (e.g., is inconsistent with the logical interface of the data). Step 3130 may comprise accessing storage metadata 135, such as the indexes described above, to determine whether the persistent contextual metadata (e.g., logical interface metadata) of the data is consistent with the storage metadata 135 of the data. If the persistent contextual metadata is not consistent with the storage metadata 135 (e.g., associates the data with different logical identifiers, as described above), the flow continues at step 3140; otherwise, the flow continues at step 3150.

Step 3140 may comprise updating the contextual format of the data to be consistent with the logical interface of the data. Step 3140 may comprise modifying the logical interface metadata to reference a different set of logical identifiers (and/or reference entries), as described above.

Step 3150 comprises relocating the data to a different storage location in a log format that, as described above, preserves an ordered sequence of storage operations performed on the non-volatile storage media. Accordingly, the relocated data (in the updated contextual format) may be identified as the valid and up-to-date version of the data when reconstructing the storage metadata 135 (if necessary). Step 3150 may further comprise updating the storage metadata 135 to bind the logical interface of the data to the new media storage locations of the data, remove indirect and/or reference entries to the data in the inconsistent contextual format, and so on, as described above.

The method 3100 ends at step 3160 until a next storage division is selected for recovery.

Figure 32:
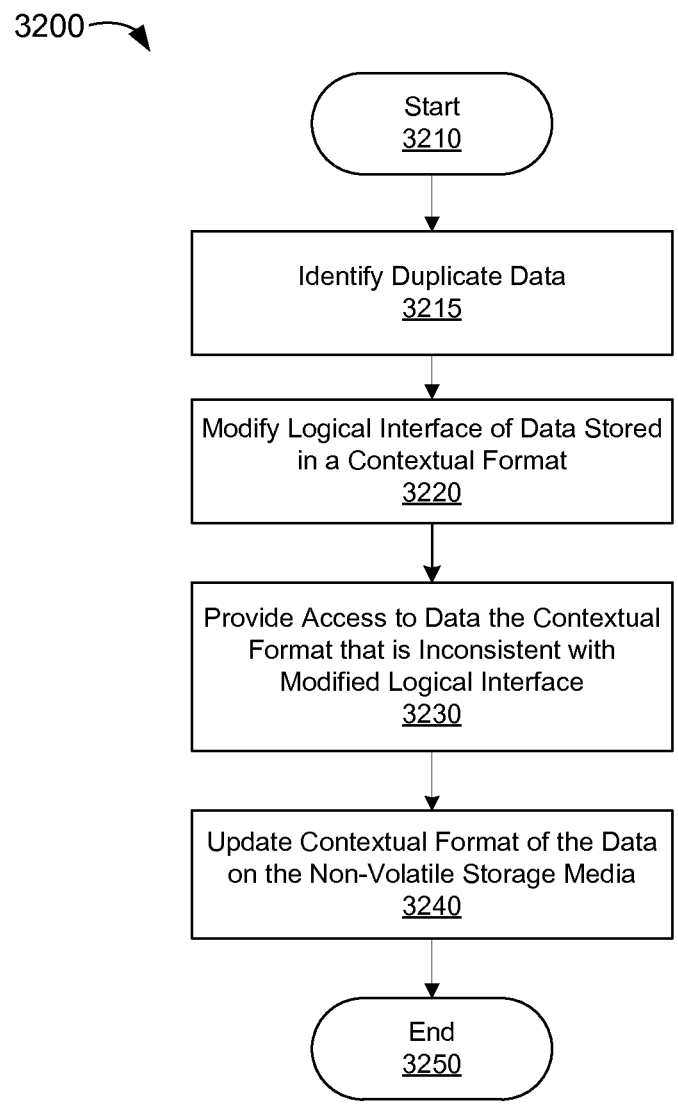
FIG. 32 is a flow diagram of another embodiment of a method managing a logical interface of contextual data.

FIG. 32 is a flow diagram of another embodiment of a method 3200 for managing logical interfaces of data stored in a contextual format. At step 3210 the method 3200 may start and be initialized, as described above.

Step 3215 comprises identifying duplicated data. Step 3215 may be performed by a deduplication module 374 operating within the storage layer 130. Alternatively, step 3220 may be performed by the storage layer 130 as storage operations are performed.

Step 3215 may comprise determining and/or verifying that the non-volatile storage media 122 comprises duplicate data (or already comprises data of a write and/or modify request). Accordingly, step 3220 may occur within the path of a storage operation (e.g., as or before duplicate data is written to the non-volatile storage media 122) and/or may occur outside of the path of servicing storage operations (e.g., identify duplicate data already stored on the non-volatile storage media 122). Step 3220 may comprise generating and/or maintaining data signatures in storage metadata 135, and using the signature to identify duplicate data.

In response to identifying the duplicate data at step 3215, the storage layer 130 (or other module, such as the deduplication module 374) may modify a logical interface of a copy of the data, such that a single copy may be referenced by two (or more) sets of LIDs. The modification to the logical interface at step 3220 may comprise updating storage metadata 135 and/or storing a persistent note on the non-volatile storage media 135, as described above. Step 3220 may further comprise invalidating and/or removing other copies of the data on the non-volatile storage media, as described above.

The contextual format of the data on the non-volatile storage media 122 may be inconsistent with the modified logical interface. Therefore, steps 3230 and 3240 may comprise providing access to the data in the inconsistent contextual format through the modified logical interface and updating the contextual format of the data on the non-volatile storage media 122, as described above.

At step 3250 the method 3200 ends.

Referring back to the cloning examples of FIGS. 28A and 28B, in other examples, clone operations may be used to perform atomic operations, such as multi-step writes or transactions. An atomic operation to modify a data in a particular logical address range may comprise creating a clone of the logical address range, implementing storage operations within the clone, and, when the operations complete, "folding" the clone back into the logical address space 134 (e.g., overlaying the original logical address range with the clone). As used herein, "folding" a logical address range refers to combining two or more address ranges together (e.g., folding a logical address range with a clone thereof). The folding may occur according to one of a plurality of operational modes, which may include, but are not limited to: an "overwrite" mode, in which the contents of one of one logical address range "overwrites" the contents of another logical address range, a "merge" mode, in which the contents of the logical address ranges are merged together (e.g., in a logical OR operation), or the like.

Figure 33A:
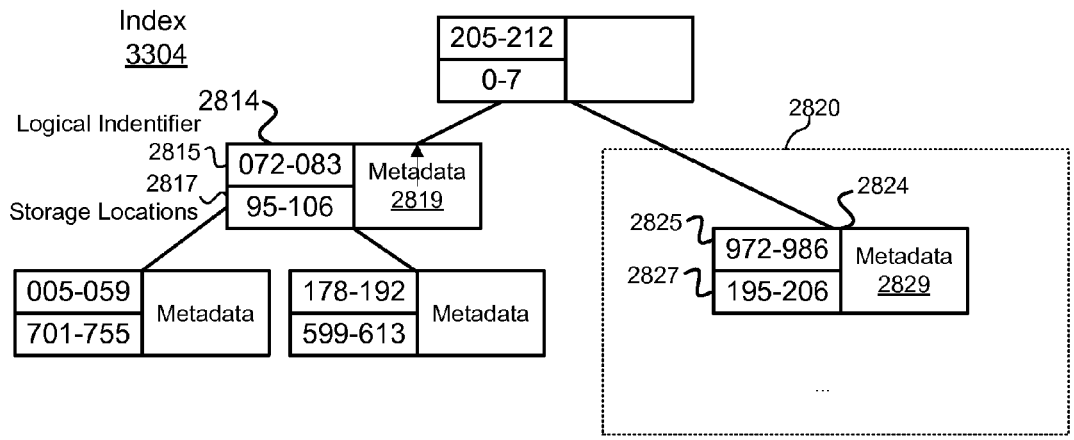
FIGS. 33A-B depict exemplary clone operations.

FIG. 33A depicts one example of a clone between entries 2814 and 2820 in the index 3304. Following the clone operation, a storage client modified the data within the clone 972-983, with the updated data being stored at media storage locations 195-206. Folding the clone 2824 back into the entry 2814 in an "overwrite" mode results in the entry 2814 being bound to the media storage locations of the clone 2824 (195-206). Portions of the clone 2824 that were not modified (if any) may remain unchanged in the entry 2814.

In another example, in which the LID range of the clone was modified (e.g., data was appended or deleted from the clone), the LID 2814 would be modified in a corresponding way. Accordingly, a folding operation may comprise allocation of additional LIDs in the logical address space 134. Therefore, in some embodiments, clones may be tied to one another (e.g., using entry metadata 2819 and/or 2829). An extension to a clone, such as entry 2824, may be predicated on the logical address range being available to the original entry 2814. The link between the entries may be predicated on the "mode" of the clone as described above. For example, if the entries are not to be "folded" at a later time, the clones may not be linked.

Figure 33B:
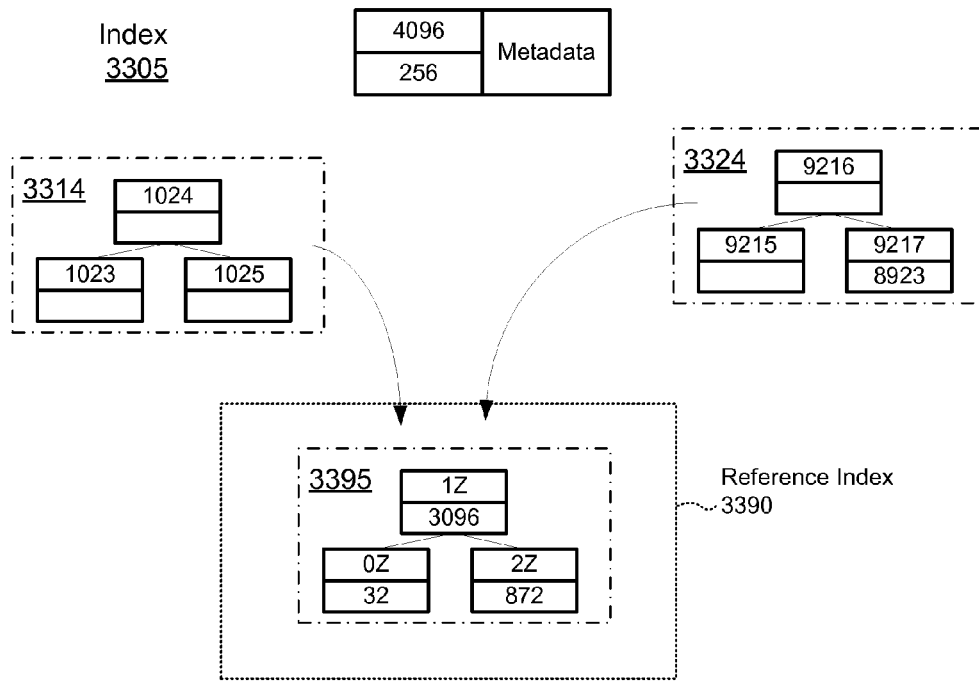

FIG. 33B depicts another example of a folding operation using reference and indirect entries. The clones 3314 and 3324 are linked to reference entries 3395 in a reference index 3390 associated with data of the clone. A storage client 116 may modify one clone 3324, resulting in modified data being bound to the clone 3324 (e.g., entry 9217 is bound to media storage location 8923). Accordingly, the clone 3324 has diverged from the clone 3314. When folding the clone 3324 into the clone 3314, the modified data of 9217 may overwrite the original data (e.g., the data at media storage location 872).

As described above, clones may be "tied" together, according to an operational mode of the clones. For example, changes to a clone may be automatically mirrored in the other clone. This mirroring may be uni-directional, bi-direction, or the like. The nature of the tie between clones may be maintained in storage metadata (e.g., metadata entries 2819 and 2829 and/or in reference entries 3395). The storage layer 130 may access the metadata entries 2819 and/or 2829 when storage operations are performed within the LID ranges 2815 and/or 2825 to determine what, if any, synchronization operations are to be performed.

Figure 34:
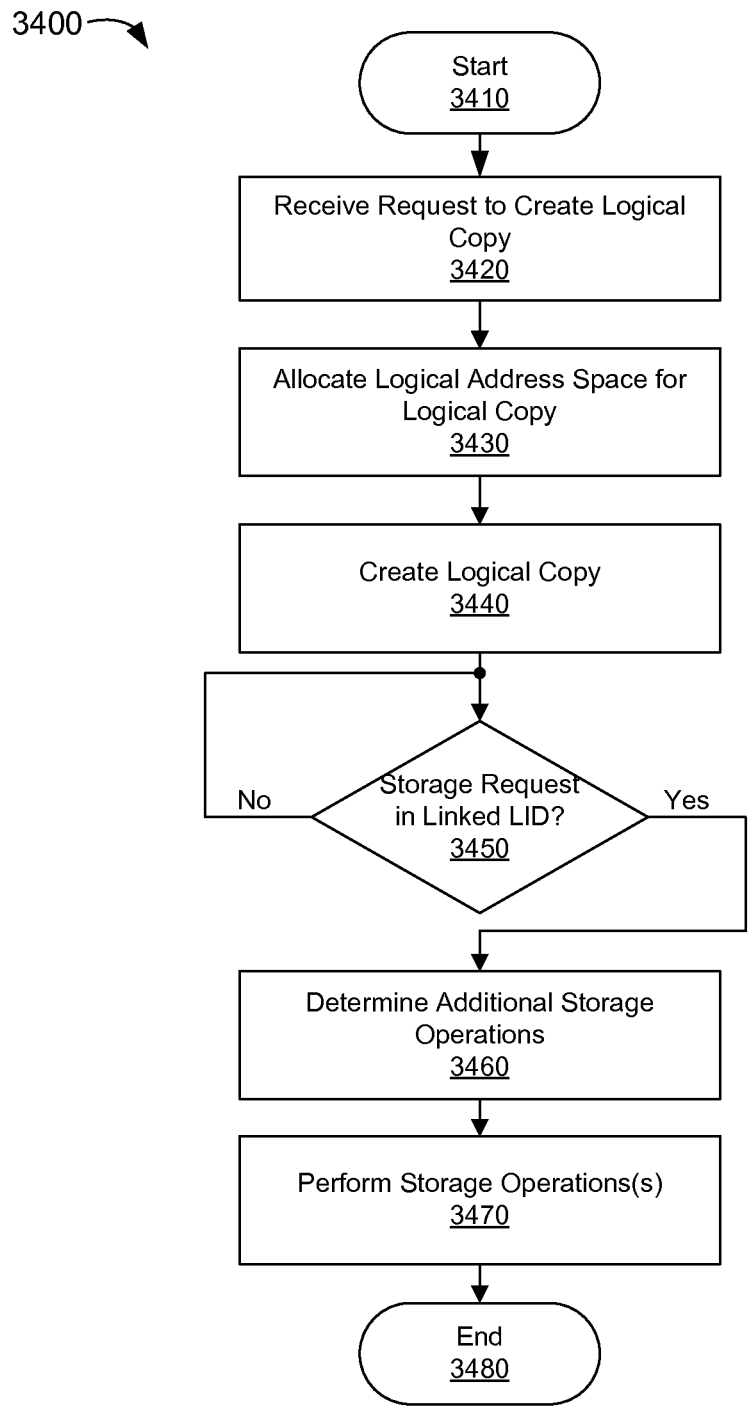
FIG. 34 is a flow diagram of one embodiment of a method for managing a clone of contextual data.

In some embodiments, data of a clone may be designated as ephemeral, as described above. Accordingly, if upon reboot (or another condition), the ephemeral designation is not removed, the clone may be deleted (e.g., invalidated as described above). FIG. 34 is a flow diagram of another embodiment of a method for cloning ranges of a logical address space 134.

At step 3410 the method 3400 starts and is initialized as described above. At step 3420, a request to create a clone is received. The request may be received from a storage client and/or may be part of a higher-level API provided by the storage layer 130. The request may include an "operational mode" of the clone, which may include, but is not limited to: how the clones are to be synchronized, if at all, how folding is to occur, whether the copy is to be designated as ephemeral, and so on.

Step 3430 may comprise allowing LIDs in the logical address space 134 to service the request. The allocation of step 3430 may further comprise reserving physical storage space to accommodate changes to the clone. The reservation of physical storage space may be predicated on the operational mode of the clone. For instance, if all changes are to be synchronized between the clone and the original address range, a small portion (if any) physical storage space may be reserved. Step 3430 may further comprise allocating the clone within a designated portion or segment of the logical address space 134 (e.g., a range dedicated for use with clones).

Step 3440 may comprise updating the logical interface of data of the clone, as described above. Step 3440 may further comprise storing a persistent note on the non-volatile storage media to make the clone persistent and crash safe, as described above.

Step 3450 may comprise receiving a storage request and determining if a storage request pertains to the original LID range and/or the clone of the LID range. If so, the flow continues to step 3460, otherwise, the flow remains on step 3450.

Step 3460 may comprise determining what (if any) operations are to be taken on the other associated LID ranges (e.g., synchronize changes, allocate logical and/or physical storage resources, or the like). The determination of step 3460 may comprise accessing storage metadata describing the operational mode of the clone and/or the nature of the "tie" (if any) between the original LIDs and the clone thereof.

Step 3470 may comprise performing the operations (if any) determined at step 3460 along with the requested storage operation. If one or more of the synchronization operations cannot be performed (e.g., additional logical address space 134 cannot be allocated), the underlying storage operation may fail.

At step 3480, the flow ends until another request is received, at which point the flow continues at step 3420.

Figure 35:
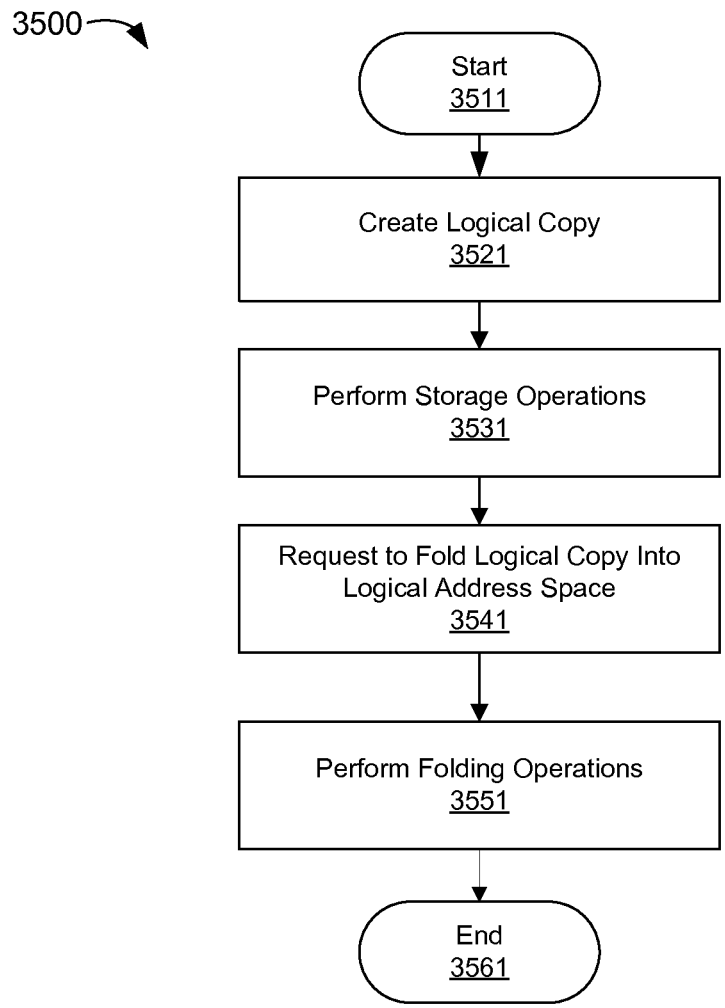
FIG. 35 is a flow diagram of one embodiment of a method for folding a clone of contextual data.

FIG. 35 is a flow diagram of another embodiment of a method for managing clones of contextual data. At step 3511 and 3521, the method 3500 starts, is initialized, and creates a clone of a logical address range as described above. At step 3531, one or more storage operations within the original logical address range and/or the clone thereof are performed along with additional, synchronization operations (if any), as described above.

At step 3541, a request to fold the clone is received. The request may specify an operational mode of the fold and/or the operational mode may have been specified when the clone was created at step 3521.

Step 3551 comprises folding the clone back into the logical address space 134 of the original logical range. Step 3551 may comprise overwriting the contents of the original logical address range with the contents of the clone, "merging" the logical address ranges (e.g., in an OR operation), or the like. In some embodiments, the merging comprises deleting (e.g., invalidating) the clone, which may comprise removing entries of the clone from the storage metadata index, removing shared references to media storage locations from a reference count datastructure, and the like. Step 3551 may further comprise modifying a logical interface of the merged data, as described above. The modified logical interface may change the LIDs used to reference the data. The modified logical interface may be inconsistent with the contextual format of the data on the non-volatile storage media 122. Therefore, step 3551 may further comprise providing access to the data in the inconsistent contextual format and/or updating the contextual format of the data, as described above.

At step 3561, the flow ends until a next clone is created.

This disclosure has been made with reference to various exemplary embodiments. However, those skilled in the art will recognize that changes and modifications may be made to the exemplary embodiments without departing from the scope of the present disclosure. For example, various operational steps, as well as components for carrying out operational steps, may be implemented in alternate ways depending upon the particular application or in consideration of any number of cost functions associated with the operation of the system (e.g., one or more of the steps may be deleted, modified, or combined with other steps). Therefore, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Additionally, as will be appreciated by one of ordinary skill in the art, principles of the present disclosure may be reflected in a computer program product on a machine-readable storage medium having machine-readable program code means embodied in the storage medium. Any tangible, non-transitory machine-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a machine-readable memory that can direct a computer or other programmable data processing apparatus to function in a particular manner, such that the instructions stored in the machine-readable memory produce an article of manufacture, including implementing means that implement the function specified. The computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified.

While the principles of this disclosure have been shown in various embodiments, many modifications of structure, arrangements, proportions, elements, materials, and components that are particularly adapted for a specific environment and operating requirements may be used without departing from the principles and scope of this disclosure. These and other changes or modifications are intended to be included within the scope of the present disclosure.

What is claimed is:

1. A method, comprising:
performing a logical copy operation pertaining to a plurality of data segments stored on a non-volatile storage device to reference the stored data segments through a first set of logical addresses of a logical address space and a second, different set of logical addresses of the same logical address space;
servicing a request to revise data of a stored data segment, wherein the stored data segment is referenced by a first logical address in the first set of logical addresses and a second logical address in the second set of logical addresses, and wherein servicing the request comprises writing at least the revised data to a different data segment on the non-volatile storage device; and
referencing the stored data segment through the first logical address and referencing the different data segment through the second logical address after servicing the request.

2. The method of claim 1, wherein the plurality of data segments are stored within a log on the non-volatile storage device, and wherein writing the revised data comprises appending the different data segment to the log, such that the log comprises both the stored data segment and the different data segment.

3. The method of claim 1, wherein performing the logical copy operation comprises storing a persistent note on the non-volatile storage device configured to associate the plurality of data segments stored on the non-volatile storage device with the first set of logical identifiers and the second set of logical identifiers.

4. The method of claim 3, wherein both the first set of logical identifiers and the second set of logical identifiers reference the plurality of data segments through one or more reference entries, and wherein the persistent note is configured to bind the first set of logical identifiers and the second set of logical identifiers to the reference entries.

5. The method of claim 3, wherein the persistent note is configured to associate physical addresses of the plurality of data segments on the non-volatile storage device with the first set of logical identifiers and the second set of logical identifiers.

6. The method of claim 3, further comprising reconstructing associations between the plurality of data segments stored on the non-volatile storage device and the first set of logical identifiers and the second set of logical identifiers by use of the persistent note.

7. The method of claim 1, further comprising rewriting the plurality of data segments on the non-volatile storage device in a contextual format configured to associate the plurality of data segments with logical identifiers of the first set of logical identifiers and logical identifiers of the second set of logical identifiers.

8. The method of claim 7, wherein rewriting the plurality of data segments comprises rewriting the data segments in respective packets, the packets comprising persistent metadata configured to reference logical identifiers of both the first set of logical identifiers and the second set of logical identifiers.

9. An apparatus, comprising:
a storage layer configured to manage a logical copy of data stored within an ordered log on a non-volatile storage device, such that the stored data is mapped to a first set of logical identifiers and to a second, different set of logical identifiers of a logical address space; and
a log storage module configured to append data corresponding to the first logical identifier to the ordered log in response to a write request pertaining to a first logical identifier in the first set, wherein the appended data is configured to modify a portion of the stored data mapped to a second logical identifier in the second set of logical identifiers, and
wherein the storage layer is configured to map the first logical identifier to the appended data and to retain a mapping between the second logical identifier of the second set of logical identifiers and the stored data.

10. The apparatus of claim 9, wherein the log storage module is further configured to append persistent metadata to the ordered log on the non-volatile storage device, and wherein the persistent metadata is configured to associate the data stored within the ordered log on the non-volatile storage device with the second set of logical identifiers.

11. The apparatus of claim 10, wherein the storage layer is configured to invalidate the persistent metadata in response to rewriting the data in a contextual format that associates the data with the first set of logical identifiers and the second set of logical identifiers.

12. The apparatus of claim 10, wherein the data is stored in a contextual format configured to associate the data with an original set of logical identifiers, and wherein the persistent metadata is configured to bind physical addresses of the data on the non-volatile storage device to logical identifiers of both the original set of logical identifiers and one or more other, different sets of logical identifiers.

13. The apparatus of claim 9, wherein the storage layer is configured to reference the data through two or more entries in an index, including a first entry and a second entry, and wherein both the first entry and the second entry are configured to reference physical storage locations of the data through a reference entry.

14. The apparatus of claim 13, wherein the storage layer is configured to bind the first logical identifier to a physical storage location of the appended data by use of an entry in the index, and to retain a binding between the portion of the data modified by the appended data and another logical identifier.

15. A non-transitory computer-readable storage medium comprising instructions configured to cause a machine to perform operations, comprising:

storing a set of data segments on a non-volatile storage device with persistent metadata configured to associate the stored data segments with respective logical addresses of a logical address space;

modifying a logical interface of the data segments to provide access to the set of stored data segments through two or more different groups of logical addresses, wherein the two or more different groups of logical addresses correspond to a particular logical address space;

writing a modified data segment to the non-volatile storage device with persistent metadata configured to associate the written data segment with a logical address of a first one of the two or more groups of logical addresses, wherein the written data segment is configured to replace a selected one of the set of stored data segments; and providing access to the written data segment through the logical address of the first group of logical addresses, and to the selected stored data segment through a logical identifier of a different one of the two or more groups of logical addresses.

16. The non-transitory computer-readable storage medium of claim 15, wherein the operations further comprise storing a persistent note on the non-volatile storage device configured to associate the set of stored data segments with the two or more groups of logical addresses.

17. The non-transitory computer-readable storage medium of claim 15, wherein the set of stored data segments are stored within an ordered log on the non-volatile storage device, and wherein writing the modified data segment comprises appending the modified data segment at an append point within the log and at a different physical address than a physical address of the selected stored data segment.

18. The non-transitory computer-readable storage medium of claim 15, wherein logical addresses of the first group of logical addresses reference physical addresses of one or more of the stored data segments in the set of data segments.

19. The non-transitory computer-readable storage medium of claim 15, the operations further comprising modifying the logical interface of the set of stored data segments in response to a request to create a logical copy of the stored data segments.

20. The non-transitory computer-readable storage medium of claim 15, the operations further comprising rewriting one or more of the stored data segments in the set of stored data segments in a packet format configured to bind the one or more rewritten data segments to logical addresses in the two or more groups of logical addresses.

* * * * *